(12) United States Patent
Nakamura et al.

(10) Patent No.: US 10,204,849 B2
(45) Date of Patent: Feb. 12, 2019

(54) SEMICONDUCTOR DEVICE

(71) Applicant: Renesas Electronics Corporation, Koutou-ku, Tokyo (JP)

(72) Inventors: Hiroyuki Nakamura, Tokyo (JP); Hiroya Shimoyama, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/850,009

(22) Filed: Dec. 21, 2017

(65) Prior Publication Data
US 2018/0218969 A1 Aug. 2, 2018

(30) Foreign Application Priority Data

Jan. 27, 2017 (JP) ................. 2017-013606

(51) Int. Cl.
*H01L 23/34* (2006.01)
*H01L 23/495* (2006.01)
(Continued)

(52) U.S. Cl.
CPC ...... *H01L 23/49575* (2013.01); *B62D 5/0406* (2013.01); *H01L 23/3135* (2013.01);
(Continued)

(58) Field of Classification Search
CPC ......... H01L 23/49575; H01L 23/49524; H01L 23/49541; H01L 23/49562; H01L 23/3135;
(Continued)

(56) References Cited

U.S. PATENT DOCUMENTS 5,920,119 A * 7/1999 Tamba ............... H01L 25/18
257/678
5,942,797 A * 8/1999 Terasawa ........... H01L 25/162
257/703

(Continued)

FOREIGN PATENT DOCUMENTS

JP 2007-116840 A 5/2007
JP 2014-030049 A 2/2014
(Continued)

OTHER PUBLICATIONS

Extended European Search Report dated Jun. 14, 2018, in European Patent Application No. 18150713.8.

*Primary Examiner* — Dao H Nguyen
(74) *Attorney, Agent, or Firm* — Shapiro, Gabor and Rosenberger, PLLC

(57) ABSTRACT

The semiconductor device of the present invention is a semiconductor device in which a first semiconductor chip including a first field effect transistor for a high-side switch, a second semiconductor chip including a second field effect transistor for a low-side switch, and a third semiconductor chip including a circuit that controls each of the first and second semiconductor chips are sealed with a sealing portion. A lead electrically connected to a pad of the first semiconductor chip for a source of the first field effect transistor and a lead electrically connected to a back-surface electrode of the second semiconductor chip for a drain of the second field effect transistor are disposed on the same side of the sealing portion in a plan view.

19 Claims, 25 Drawing Sheets

(51) Int. Cl.
*H01L 23/04* (2006.01)
*H01L 31/111* (2006.01)
*H01L 23/31* (2006.01)
*H01L 23/00* (2006.01)
*H01L 25/065* (2006.01)
*H01L 27/06* (2006.01)
*H01L 29/66* (2006.01)
*H02M 7/00* (2006.01)
*H02M 7/537* (2006.01)
*H02P 27/06* (2006.01)
*B62D 5/04* (2006.01)

(52) U.S. Cl.
CPC .. *H01L 23/49524* (2013.01); *H01L 23/49541* (2013.01); *H01L 23/49562* (2013.01); *H01L 24/09* (2013.01); *H01L 24/49* (2013.01); *H01L 25/0655* (2013.01); *H01L 27/0629* (2013.01); *H01L 29/66992* (2013.01); *H02M 7/003* (2013.01); *H02M 7/537* (2013.01); *H02P 27/06* (2013.01); *H01L 23/3107* (2013.01); *H01L 23/3121* (2013.01); *H01L 2224/04042* (2013.01); *H01L 2224/09165* (2013.01); *H01L 2224/48091* (2013.01); *H01L 2224/49179* (2013.01)

(58) Field of Classification Search
CPC ............. H01L 23/3121; H01L 25/0655; H01L 24/09; H01L 24/49; H01L 27/0629; H01L 29/66992; H02P 27/06; H02M 7/003; H02M 7/537
USPC ......... 257/48, 107, 133, 143, 176, 678, 690, 257/691, 723, E23.031, E23.034, 257/E23.044, E23.052, E23.079, E21.056, 257/E25.03, E25.031; 361/690, 730; 438/123
See application file for complete search history.

(56) References Cited

U.S. PATENT DOCUMENTS

| | | | |
|---|---|---|---|
| 6,291,880 B1* | 9/2001 | Ogawa | H01L 23/4334 257/723 |
| 9,627,302 B2* | 4/2017 | Ichikawa | H01L 23/49582 |
| 9,906,165 B2* | 2/2018 | Muto | H01L 23/04 |
| 2006/0202228 A1* | 9/2006 | Kanazawa | H01L 23/49575 257/177 |
| 2009/0140289 A1* | 6/2009 | Torii | H01L 23/49575 257/143 |
| 2011/0156229 A1* | 6/2011 | Shinohara | H01L 23/49531 257/676 |
| 2013/0043576 A1 | 2/2013 | Nakamura et al. | |
| 2014/0367846 A1 | 12/2014 | Nakagawa et al. | |

FOREIGN PATENT DOCUMENTS

| | | |
|---|---|---|
| JP | 2015-002185 A | 1/2015 |
| JP | 2016-181675 A | 10/2016 |

* cited by examiner

SEMICONDUCTOR DEVICE

CROSS-REFERENCE TO RELATED APPLICATION

The present application claims priority from Japanese Patent Application No. 2017-013606 filed on Jan. 27, 2017, the content of which is hereby incorporated by reference into this application.

TECHNICAL FIELD OF THE INVENTION

The present invention relates to a semiconductor device, and can be suitably used for, for example, a semiconductor device in which a semiconductor chip including a field effect transistor for a high-side switch, a semiconductor chip including a field effect transistor for a low-side switch, and a semiconductor chip for controlling them are sealed.

BACKGROUND OF THE INVENTION

An inverter circuit, which has been widely used as an example of a power supply circuit, has a configuration in which a power MOSFET for a high-side switch and a power MOSFET for a low-side switch are connected in series between a terminal to which a power supply voltage is supplied and a terminal to which a ground voltage is supplied. The conversion of the power supply voltage by the inverter circuit can be performed by controlling a gate voltage of the power MOSFET for the high-side switch and a gate voltage of the power MOSFET for the low-side switch by a control circuit.

Japanese Patent Application Laid-Open Publication No. 2015-2185 (Patent Document 1) discloses a technique relating to a power semiconductor device including a plurality of power chips that control electric power and an IC that controls each power chip.

Japanese Patent Application Laid-Open Publication No. 2014-30049 (Patent Document 2) discloses a QFP 21 in which a die pad 1c is exposed on a front surface 3a of a sealing body 3.

SUMMARY OF THE INVENTION

It is desirable to improve performance of a semiconductor device in which a semiconductor chip including a field effect transistor for a high-side switch, a semiconductor chip including a field effect transistor for a low-side switch, and a semiconductor chip for controlling them are sealed. Alternatively, it is desirable to improve a degree of freedom in wiring design of a wiring board on which a semiconductor device is mounted. Alternatively, it is desirable to improve the performance of the semiconductor device and to improve the degree of freedom in wiring design of the wiring board on which the semiconductor device is mounted.

Other problems and novel features will be apparent from description of the present specification and the attached drawings.

A semiconductor device according to an embodiment is a semiconductor device in which a first semiconductor chip including a first field effect transistor for a high-side switch, a second semiconductor chip including a second field effect transistor for a low-side switch, and a third semiconductor chip including a circuit that controls each of the first and second semiconductor chips are sealed with a sealing body. The semiconductor device further includes a first lead electrically connected to a first drain electrode for a drain of the first field effect transistor in the first semiconductor chip and a second lead electrically connected to a first source electrode for a source of the first field effect transistor in the first semiconductor chip. The semiconductor device further includes a third lead electrically connected to a second drain electrode for a drain of the second field effect transistor in the second semiconductor chip and a fourth lead electrically connected to a second source electrode for a source of the second field effect transistor in the second semiconductor chip. In a plan view, the sealing body has a first side extending along a first direction and a second side extending along the first direction and positioned to be opposite to the first side, the first lead and the fourth lead intersect with the first side of the sealing body, and the second lead and the third lead intersect with the second side of the sealing body. In a plan view, the third semiconductor chip is disposed between the first side and the second side and between the first semiconductor chip and the second semiconductor chip. A current flows from the first lead to the second lead via the first field effect transistor of the first semiconductor chip, and a current flows from the third lead to the fourth lead via the second field effect transistor of the second semiconductor chip.

According to an embodiment, it is possible to improve performance of the semiconductor device.

Alternatively, it is possible to improve a degree of freedom in wiring design of a wiring board on which the semiconductor device is mounted.

Alternatively, it is possible to improve the performance of the semiconductor device and to improve the degree of freedom in wiring design of the wiring board on which the semiconductor device is mounted.

BRIEF DESCRIPTIONS OF THE DRAWINGS

DESCRIPTIONS OF THE PREFERRED EMBODIMENTS

Figure 1:
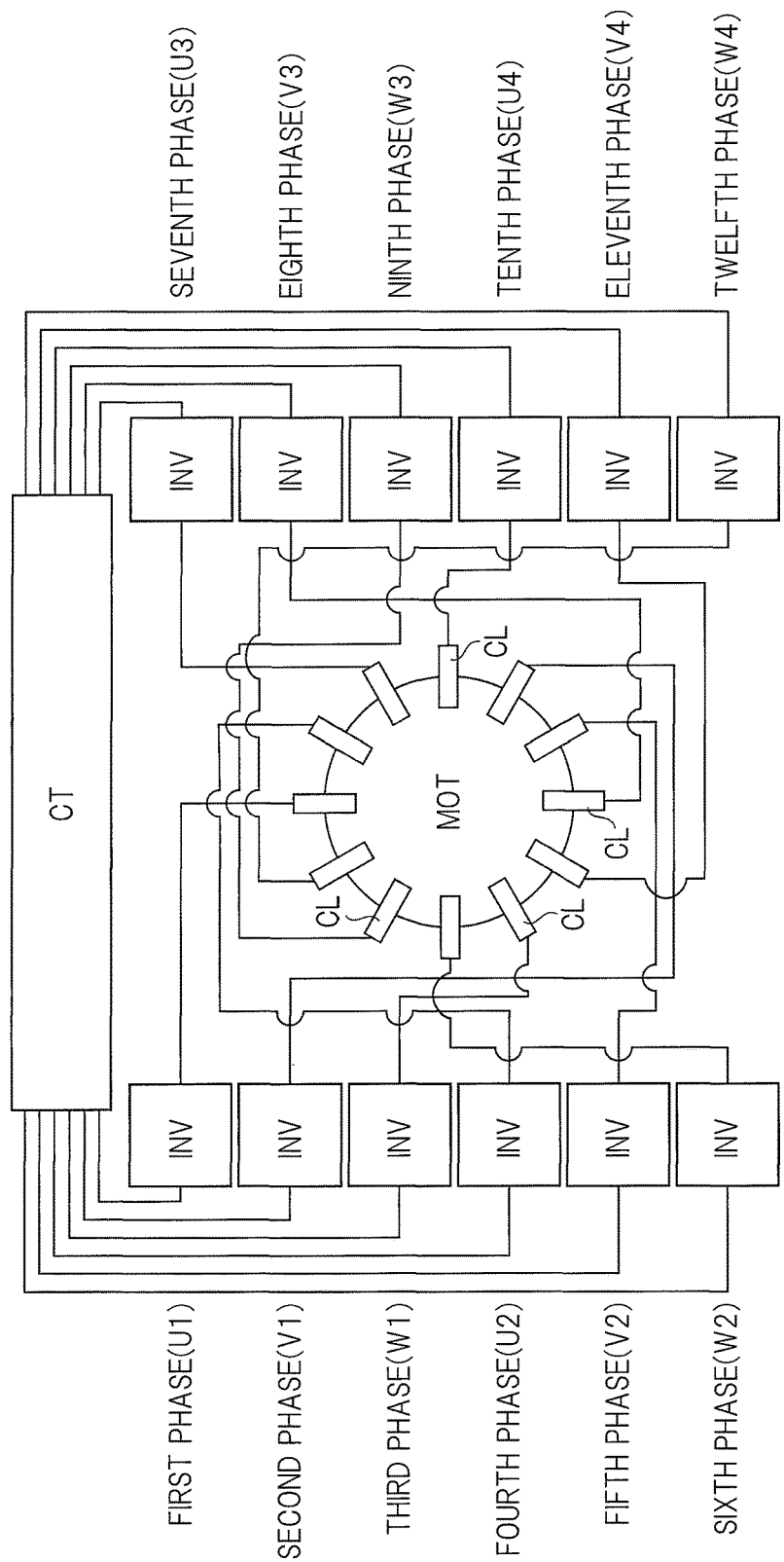
FIG. 1 is a circuit diagram schematically showing a circuit formed on a control board that controls a 12-phase BLDC motor.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps and the like) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments will be described in detail based on drawings. Note that components having the same function are denoted by the same reference characters throughout the drawings for describing the embodiments, and the repetitive description thereof will be omitted. In addition, the description of the same or similar portions is not repeated in principle unless particularly required in the following embodiments.

Also, in some drawings used in the following embodiments, hatching is omitted even in a cross-sectional view so as to make the drawings easy to see. In addition, hatching is used even in a plan view so as to make the drawings easy to see.

In addition, a field effect transistor is described as a MOSFET (Metal Oxide Semiconductor Field Effect Transistor) or simply as a MOS in the present application, but there is no intention to exclude a non-oxide film as a gate insulating film. Namely, when mentioning the MOSFET in the present application, it includes not only a MISFET (Metal Insulator Semiconductor Field Effect Transistor: MIS field effect transistor) using an oxide film (silicon oxide film) as a gate insulating film, but also a MISFET using an insulating film other than the oxide film (silicon oxide film) as a gate insulating film.

<Background of Studies>

In recent years, design and development for using a 6-phase or 12-phase BLDC (blushless DC) motor instead of a conventional three-phase BLDC motor have been carried out in view of functional safety for practical application of automatic driving of automobiles. Since the BLDC motor is not self-rectification type, it is generally recognized that control thereof is complicated. Thus, the 6-phase BLDC motor is configured to include two sets of conventional three phases (U phase, V phase, W phase) and the 12-phase BLDC motor is configured to include four sets of conventional three phases (U phase, V phase, W phase) such that a failure does not become apparent immediately even if the failure occurs in a certain set.

The inventors of the present invention have conducted studies regarding a technique of controlling each phase of the BLDC motor by an SiP (System in Package) that includes a semiconductor chip (corresponding to a semiconductor chip CPH to be described later) including a power MOSFET for a high-side switch, a semiconductor chip (corresponding to a semiconductor chip CPL to be described later) including a power MOSFET for a low-side switch, and a semiconductor chip (corresponding to a semiconductor chip CPC to be described later) for controlling them. An inverter circuit is formed of the SiP, and AC power supplied from the inverter circuit is supplied to coils of the respective phases of the BLDC motor. Thus, the inventors of the present invention have conducted studies regarding a control board (corresponding to a control board PB to be described later) on which six or twelve SiPs are mounted on a wiring board (corresponding to a wiring board PB1 to be described later), as a control board that controls the 6-phase BLDC motor or the 12-phase BLDC motor. Note that a semiconductor device PKG to be described later corresponds to the SiP.

FIG. 1 is a circuit diagram schematically showing a circuit (motor drive system) formed on a control board that controls a 12-phase BLDC motor. In FIG. 1, each inverter circuit INV is formed of the above-described SiP.

A motor MOT shown in FIG. 1 is the 12-phase BLDC motor and has twelve coils CL, and the coils CL are connected to the inverter circuits INV, respectively. Namely, since the inverter circuit INV is provided for each of the twelve coils in the motor MOT, the circuit of FIG. 1 includes the twelve inverter circuits INV in total. Since the SiPs as many as the inverter circuits INV are necessary, twelve SiPs are necessary in the circuit of FIG. 1. Each of the inverter circuits INV (more specifically, a control circuit CLC to be described later in the inverter circuit INV) is connected to a control circuit CT, and is controlled by the control circuit CT. AC power is supplied from each of the inverter circuits INV to each of the coils CL connected to the corresponding inverter circuit INV, whereby the motor MOT is driven.

Figure 2:
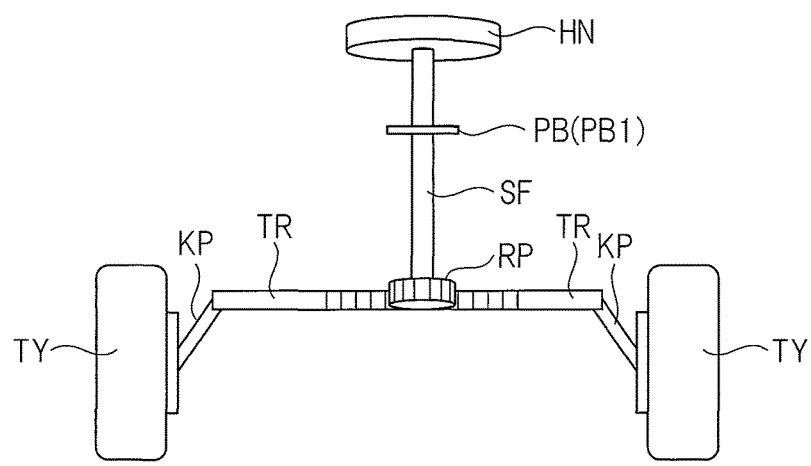
FIG. 2 is an explanatory view showing a rack-and-pinion steering mechanism in an automobile.

FIG. 2 is an explanatory view showing a rack-and-pinion steering mechanism in an automobile. The inventors of the present invention have conducted studies regarding a technique in which a control board (electronic device, module) PB on which the circuit of FIG. 1 is implemented is disposed by the use of a space around a steering shaft SF in the steering mechanism shown in FIG. 2. Namely, the inventors have conducted studies regarding a technique in which the steering shaft SF penetrates through the control board PB.

In the steering mechanism shown in FIG. 2, a rack and pinion mechanism RP is provided at the distal end of the steering shaft SF connected to a steering wheel (handle) HN. When the steering wheel HN is turned, the steering shaft SF also rotates together with the steering wheel HN, and the rotational motion thereof is converted into horizontal motion by the rack and pinion mechanism RP and is transmitted to each tire TY via a tie rod TR and a kingpin KP. In this manner, it is possible to steer an automobile by changing the direction of the tires TY by operating (turning) the steering wheel HN.

Figures 3A, 3B:
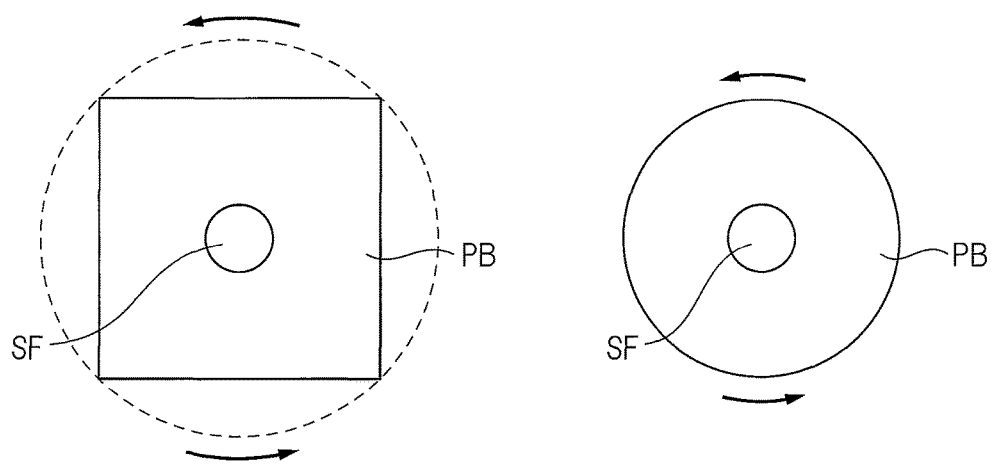
FIG. 3A is an explanatory view showing a state where a control board rotates together with a steering shaft.
FIG. 3B is an explanatory view showing a state where a control board rotates together with a steering shaft.

Since the steering shaft SF also rotates when the steering wheel HN is turned, the control board PB also rotates together with the steering shaft SF in the case where the steering shaft SF penetrates through the control board PB. FIGS. 3A and 3B are explanatory views (plan views) showing a state where the control board PB rotates together with the steering shaft SF. FIG. 3A shows a case where a planar shape of the control board PB is rectangular (oblong), and FIG. 3B shows a case where the planar shape of the control board PB is circular.

The space necessary for the rotation of the control board PB is the least wasteful when the planar shape of the control board PB is circular. For example, when the planar shape of the control board PB is rectangular as shown in FIG. 3A, a circular region whose diameter is a length of a diagonal line of the rectangle is necessary as the space for the rotation of the control board PB, so that the space necessary for the rotation of the control board PB becomes larger than a size of the control board PB. On the other hand, when the planar shape of the control board PB is circular as shown in FIG. 3B, the space necessary for the rotation of the control board PB is substantially the same as the size of the control board PB. Thus, the space necessary for disposing the control board PB and rotating the control board PB can be efficiently suppressed by forming the planar shape of the control board PB to be circular.

Accordingly, the inventors of the present invention have conducted studies regarding the control board PB whose planar shape is circular and on which twelve SiPs are mounted, as the control board PB that controls the 12-phase BLDC motor.

However, since wirings necessary for the twelve SiPs need to be laid out in the above control board PB, the restriction on the wiring becomes severe and a degree of freedom in wiring design is decreased. Thus, it is desirable that design capable of facilitating the wiring design on the control board PB (wiring board) is applied also to the SiPs to be mounted on the control board PB.

<Circuit Configuration>

Figure 4:
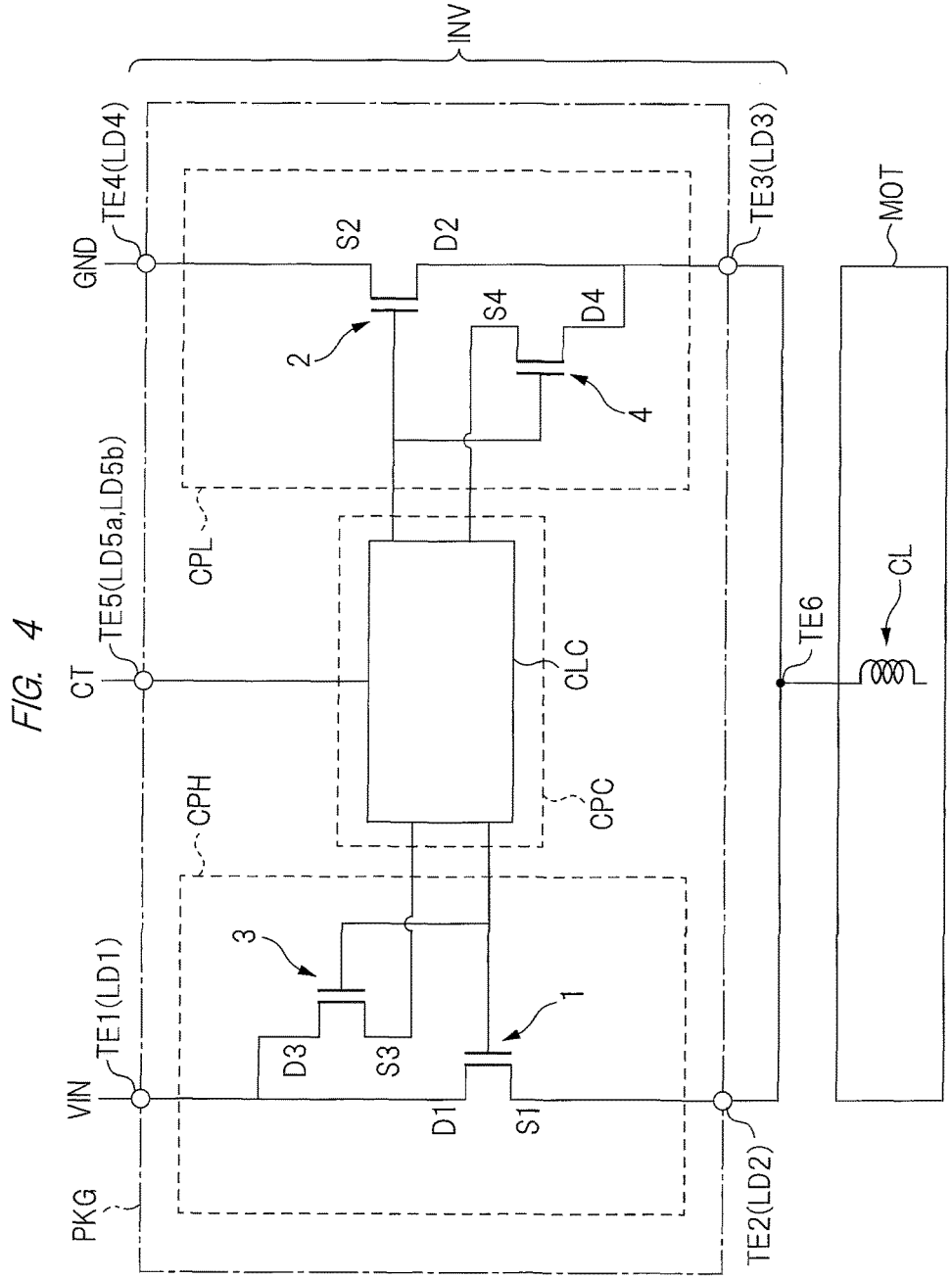
FIG. 4 is a circuit diagram showing an inverter circuit using a semiconductor device according to an embodiment.

FIG. 4 is a circuit diagram showing the inverter circuit INV using the semiconductor device (semiconductor package, electronic device) PKG of the present embodiment. In FIG. 4, a part surrounded by a dotted line denoted by a reference character CPH is formed in the semiconductor chip CPH, a part surrounded by a dotted line denoted by a reference character CPL is formed in the semiconductor chip CPL, a part surrounded by a dotted line denoted by a reference character CPC is formed in the semiconductor chip CPC, and a part surrounded by a one-dot chain line denoted by a reference character PKG is formed in the semiconductor device PKG.

The semiconductor device PKG used in the inverter circuit INV shown in FIG. 4 includes two power MOSFETs 1 and 2, a sense MOSFET 3 for sensing a current flowing in the power MOSFET 1, a sense MOSFET 4 for sensing a current flowing in the power MOSFET 2, and the control circuit CLC. The control circuit CLC is formed in the semiconductor chip (the semiconductor chip for control) CPC, the power MOSFET 1 and the sense MOSFET 3 are formed in the semiconductor chip (high-side semiconductor chip, power chip) CPH, and the power MOSFET 2 and the sense MOSFET 4 are formed in the semiconductor chip (low-side semiconductor chip, power chip) CPL. Then, these three semiconductor chips CPC, CPH, and CPL are sealed as a single package to form the semiconductor device PKG. Note that the inverter circuit INV in FIG. 4 corresponds to a detailed illustration of one of the inverter circuits INV shown in FIG. 1.

The control circuit CLC includes a high-side driver circuit that controls a potential of a gate of the power MOSFET 1 and a low-side driver circuit that controls a potential of a gate of the power MOSFET 2. The control circuit CLC controls operations of the respective power MOSFETs 1 and 2 by controlling the potentials of the gates of the power MOSFETs 1 and 2 in accordance with a signal or the like supplied to the control circuit CLC from the control circuit CT outside the semiconductor device PKG.

The gate of the power MOSFET 1 is connected to the high-side driver circuit of the control circuit CLC, and the gate of the power MOSFET 2 is connected to the low-side driver circuit of the control circuit CLC. A drain of the power MOSFET 1 is connected to a terminal TE1, a source of power MOSFET 1 is connected to a terminal TE2, a drain of the power MOSFET 2 is connected to a terminal TE3, and a source of the power MOSFET 2 is connected to a terminal TE4. Namely, source and drain paths of the power MOSFET 1 are connected in series between the terminal TE1 and the terminal TE2, and source and drain paths of the power MOSFET 2 are connected in series between the terminal TE3 and the terminal TE4. In FIG. 4, a reference character D1 denotes the drain of the power MOSFET 1, a reference character S1 denotes the source of the power MOSFET 1, a reference character D2 denotes the drain of the power MOSFET 2, and a reference character S2 denotes the source of the power MOSFET 2. In addition, in FIG. 4, a reference character D3 denotes a drain of the sense MOSFET 3, a reference character S3 denotes a source of the sense MOSFET 3, a reference character D4 denotes a drain of the sense MOSFET 4, and a reference character S4 denotes a source of the sense MOSFET 4. The control circuit CLC is connected to a terminal TE5, and the terminal TE5 is connected to the above-described control circuit CT provided outside the semiconductor device PKG.

The terminals TE1, TE2, TE3, TE4, and TE5 are the external connection terminals of the semiconductor device PKG, and are formed of leads LD to be described later. Of these, the terminal TE1 is a terminal for supplying power supply potential, and a lead LD1 to be described later corresponds to the terminal TE1. Also, the terminal TE4 is a terminal for supplying reference potential, and a lead LD4 to be described later corresponds to the terminal TE4. Note that a potential (power supply potential) VIN on a high potential side of a power supply (input power supply) outside the semiconductor device PKG is supplied to the terminal TE1 (lead LD1) for supplying power supply potential, and a reference potential lower than the potential VIN supplied to the terminal TE1 for supplying power supply potential, for example, a ground potential (grounded potential) GND is supplied to the terminal TE4 (lead LD4) for supplying reference potential.

In addition, a lead LD2 to be described later corresponds to the terminal TE2, and a lead LD3 to be described later corresponds to the terminal TE3. The terminal TE2 (lead LD2) and the terminal TE3 (lead LD3) are electrically connected to each other outside the semiconductor device PKG. Namely, the source of the power MOSFET 1 and the drain of the power MOSFET 2 are electrically connected via a conductive path (for example, a conductive path provided on a wiring board PB1 to be described later on which the semiconductor device PKG is mounted) provided outside the semiconductor device PKG. Thus, the power MOSFET 1 and the power MOSFET 2 are connected in series between the terminal TE1 for supplying power supply potential and the terminal TE4 for supplying reference potential. The power MOSFET 1 corresponds to a high-side MOSFET, and the power MOSFET 2 corresponds to a low-side MOSFET. Namely, the power MOSFET 1 is a field effect transistor for a high-side switch (high-potential-side switch), and the power MOSFET is a field effect transistor for a low-side switch (low-potential-side switch). Each of the power MOSFETs 1 and 2 can be regarded as a power transistor for switching.

However, the conductive path that electrically connects the terminals TE2 and TE3 is not provided inside the semiconductor device PKG, but is provided outside the semiconductor device PKG (for example, on the wiring board PB1 to be described later on which the semiconductor device PKG is mounted). Thus, the terminal TE2 (lead LD2) and the terminal TE3 (lead LD3) of the semiconductor device PKG are electrically connected in a state where the semiconductor device PKG is mounted on the wiring board or the like (state where the inverter circuit is formed). However, when the semiconductor device PKG is separately taken out, the terminal TE2 (lead LD2) and the terminal TE3 (lead LD3) of the semiconductor device PKG are not connected through a conductor, and are not electrically connected to each other inside the semiconductor device PKG. Therefore, a connection point TE6 between (the source of) the power MOSFET 1 and (the drain of) the power MOSFET 2 is provided outside the semiconductor device PKG (for example, on the wiring board PB1 to be described later on which the semiconductor device PKG is mounted), and the connection point TE6 is connected to the coil (load) CL of the motor MOT.

DC power supplied to the inverter circuit INV using the semiconductor device PKG is converted into AC power by the inverter circuit INV, and is then supplied to the load (in this case, the coil CL of the motor MOT). The motor MOT is driven by the AC power supplied from the inverter circuit INV.

In addition, leads LD5a and LD5b to be described later correspond to the terminal TE5. The control circuit CLC is connected to the terminal TE5 (leads LD5a and LD5b), and the terminal TE5 (leads LD5a and LD5b) is connected to the control circuit CT provided outside the semiconductor device PKG. Thus, the control circuit CLC in the semiconductor device PKG is connected to the above-described control circuit CT (see FIG. 1) provided outside the semiconductor device PKG through the terminal TE5 (leads LD5a and LD5b) and the wiring of the wiring board PB1 to be described later on which the semiconductor device PKG is mounted. Although FIG. 4 shows only one terminal TE5, a plurality of the leads LD5a and LD5b corresponding to the terminal TE5 are provided in practice in the semiconductor device PKG. Accordingly, there are a plurality of conductive paths that connect the control circuit CLC in the semiconductor device PKG and the control circuit CT outside the semiconductor device PKG, and signals are exchanged between the control circuit CT outside the semiconductor device PKG and the control circuit CLC in the semiconductor device PKG through the plurality of conductive paths. The control circuit CLC in the semiconductor device PKG is controlled by the control circuit CT provided outside the semiconductor device PKG.

The current flowing in the power MOSFET 1 is sensed (detected) by the sense MOSFET 3, and the power MOSFET 1 is controlled in accordance with the current flowing in the sense MOSFET 3. Also, the current flowing in the power MOSFET 2 is sensed (detected) by the sense MOSFET 4, and the power MOSFET 2 is controlled in accordance with the current flowing in the sense MOSFET 4. The sense MOSFET 3 is formed so as to constitute a current mirror circuit with the power MOSFET 1 in the semiconductor chip CPH, and the sense MOSFET 4 is formed so as to constitute a current mirror circuit with the power MOSFET 2 in the semiconductor chip CPL.

The sense MOSFET 3 shares the drain and the gate with the power MOSFET 1. Namely, the drains of the sense MOSFET 3 and the power MOSFET 1 are electrically connected to be a common drain, and the common drain is connected to the terminal TE1, so that the same potential is supplied to the drain of the sense MOSFET 3 and the drain of the power MOSFET 1. In addition, the gates of the sense MOSFET 3 and the power MOSFET 1 are electrically connected to be a common gate, and the common gate is connected to the high-side driver circuit of the control circuit CLCs, so that the same gate signal (gate voltage) is input to the gate of the sense MOSFET 3 and the gate of the power MOSFET 1 from the high-side driver circuit. Meanwhile, the source of the sense MOSFET 3 is not common to the source of the power MOSFET 1, and the source of the sense MOSFET 3 is connected to the control circuit CLC while the source of the power MOSFET 1 is connected to the terminal TE2.

Also, the sense MOSFET 4 shares the drain and the gate with the power MOSFET 2. Namely, the drains of the sense MOSFET 4 and the power MOSFET 2 are electrically connected to be a common drain, and the common drain is connected to the terminal TE3, so that the same potential is supplied to the drain of the sense MOSFET 4 and the drain of the power MOSFET 2. In addition, the gates of the sense MOSFET 4 and the power MOSFET 2 are electrically connected to be a common gate, and the common gate is connected to the low-side driver circuit of the control circuit CLC, so that the same gate signal (gate voltage) is input to the gate of the sense MOSFET 4 and the gate of the power MOSFET 2 from the low-side driver circuit. Meanwhile, the source of the sense MOSFET 4 is not common to the source of the power MOSFET 2, and the source of the sense MOSFET 4 is connected to the control circuit CLC while the source of the power MOSFET 2 is connected to the terminal TE4.

<Structure of Semiconductor Device>

Figure 5:
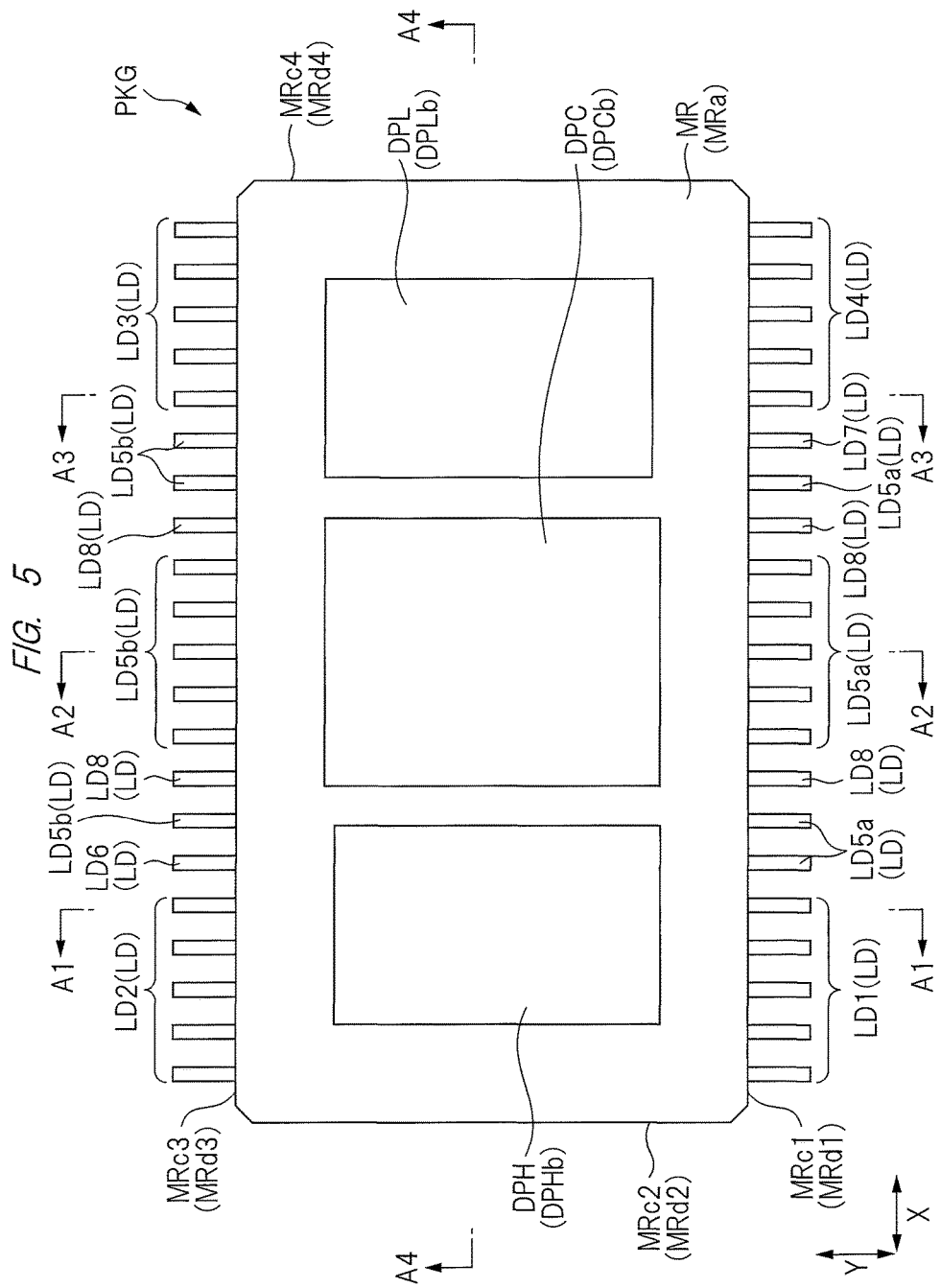
FIG. 5 is a top view of the semiconductor device according to the embodiment.
Figure 6:
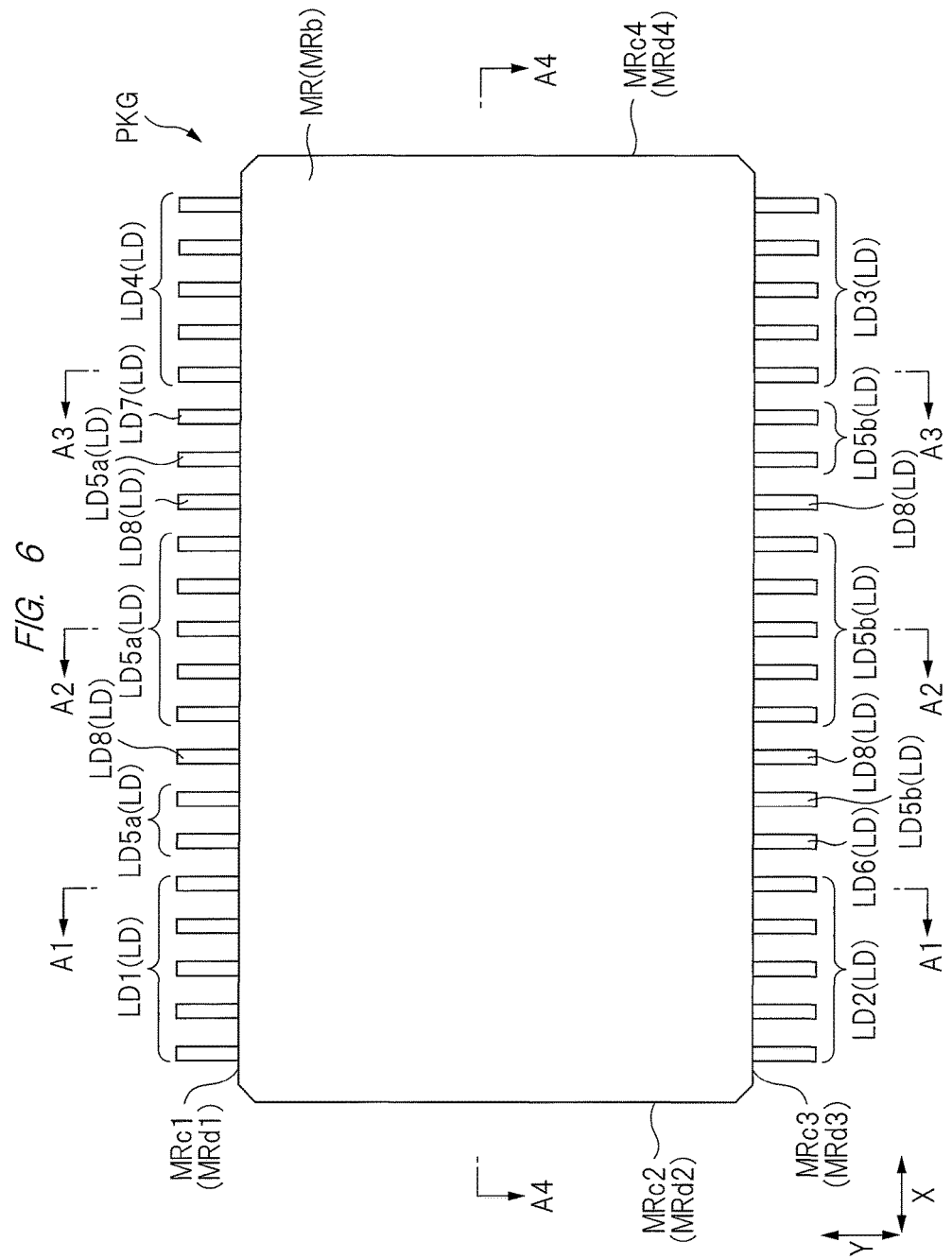
FIG. 6 is a bottom view of the semiconductor device according to the embodiment.
Figure 7:
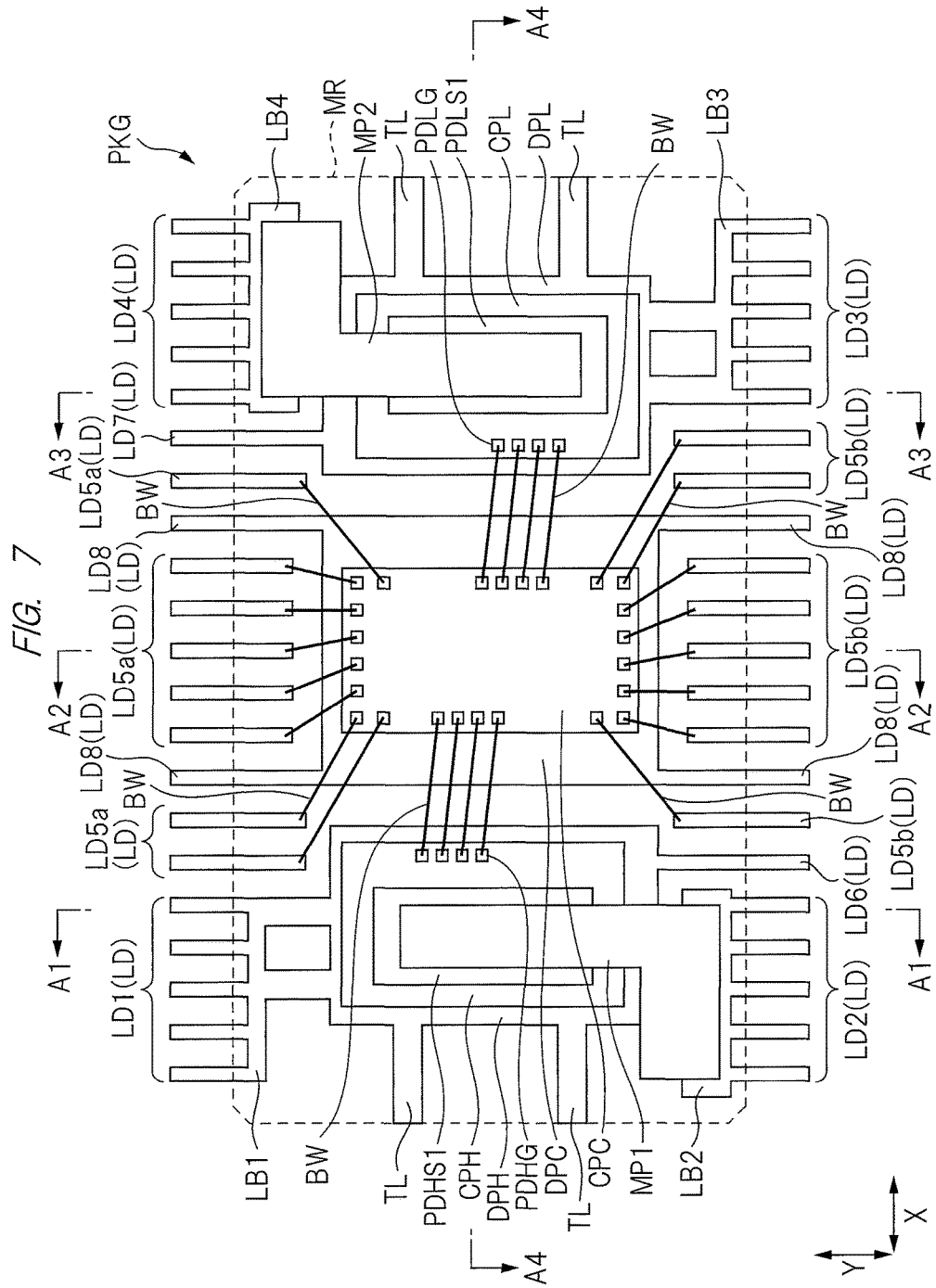
FIG. 7 is a perspective plan view of the semiconductor device according to the embodiment.
Figure 8:
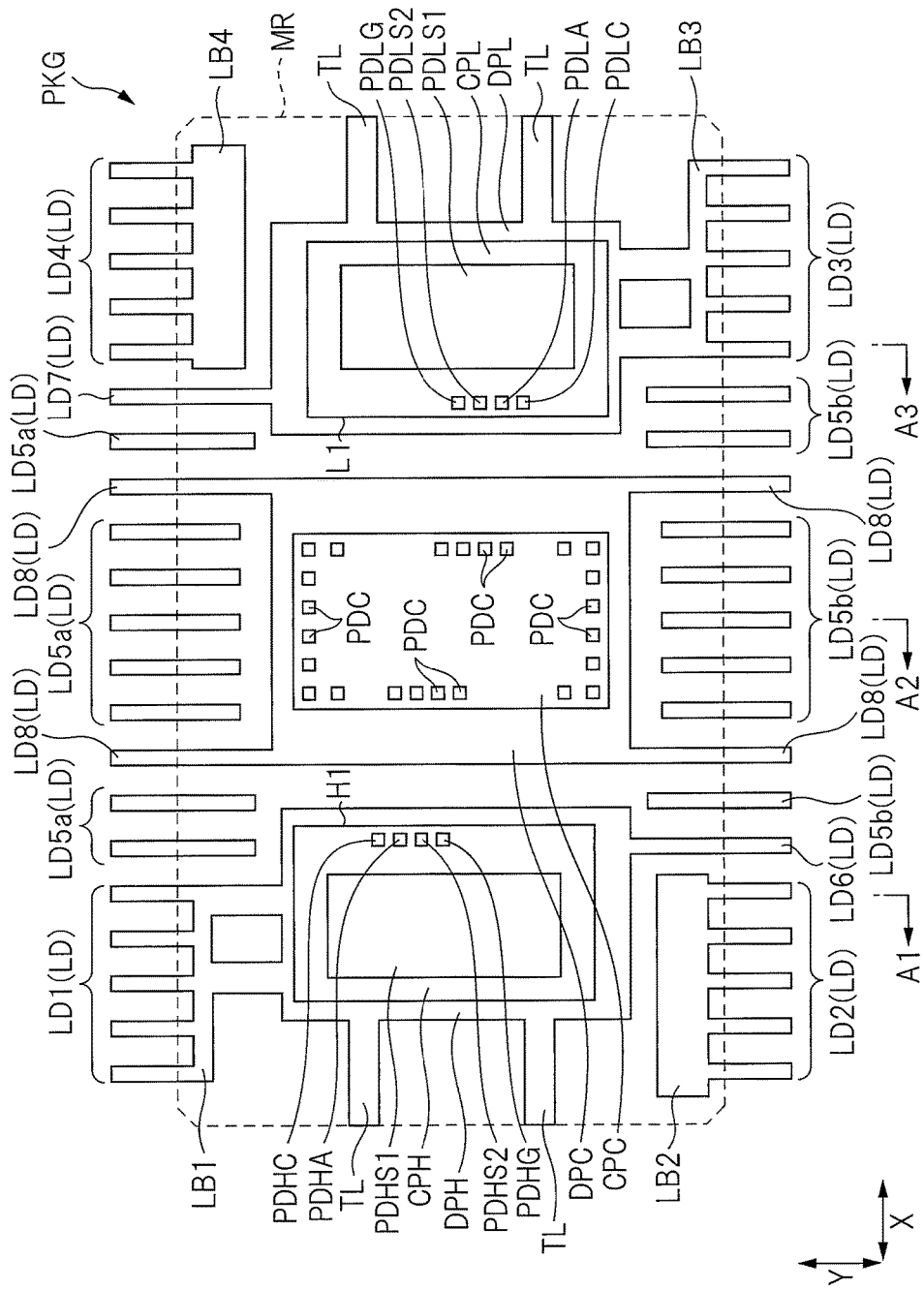
FIG. 8 is a perspective plan view of the semiconductor device according to the embodiment.
Figure 9:
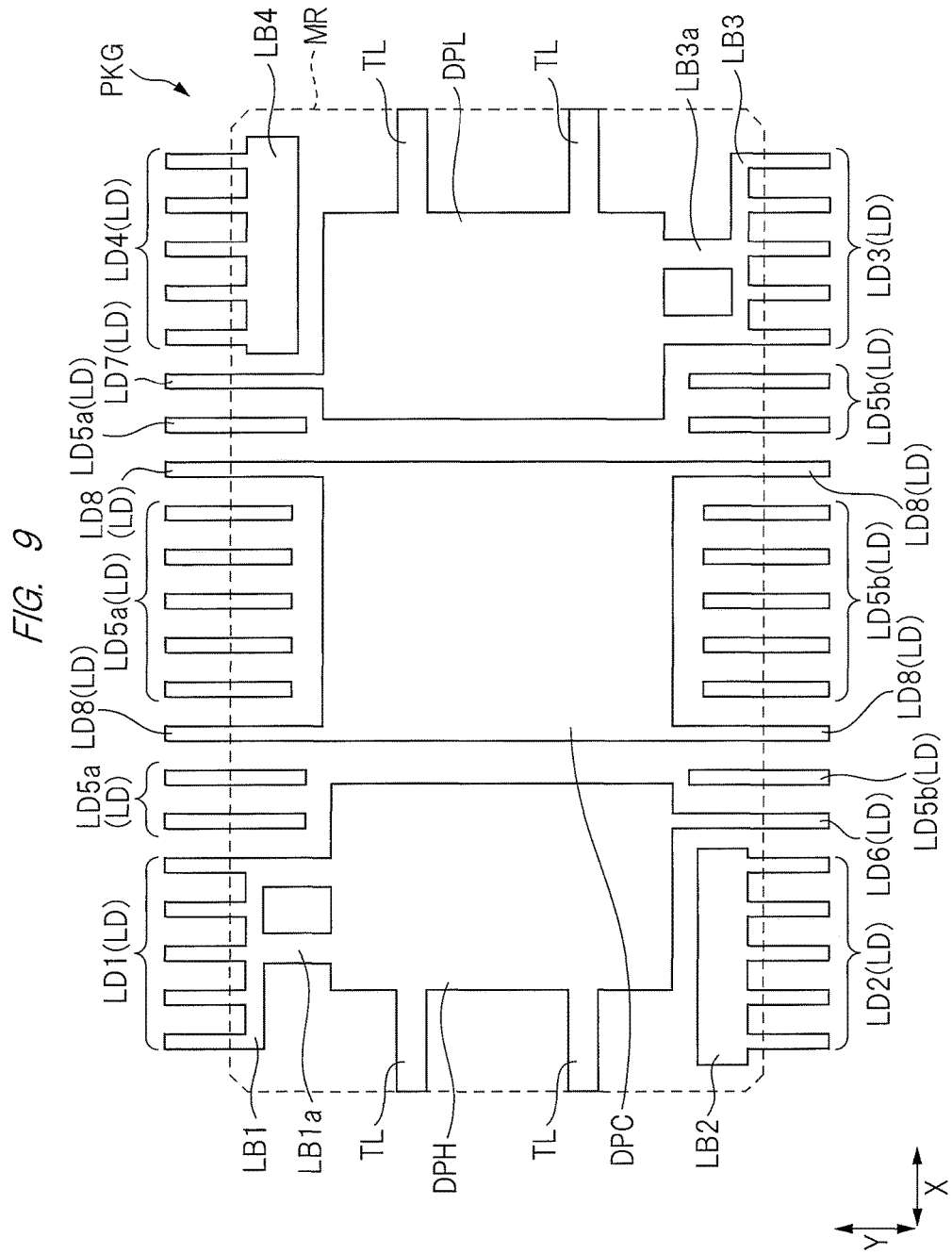
FIG. 9 is a perspective plan view of the semiconductor device according to the embodiment.

FIG. 5 is a top view of the semiconductor device PKG of the present embodiment, FIG. 6 is a bottom view (back view) of the semiconductor device PKG, FIGS. 7 to 9 are perspective plan views of the semiconductor device PKG, and FIGS. 10 to 13 are cross-sectional views of the semiconductor device PKG. FIG. 7 shows the perspective plan view seen through a sealing portion MR when the semiconductor device PKG is viewed from a lower surface side. Also, FIG. 8 shows the perspective plan view of the lower surface side of the semiconductor device PKG when seen through (omitting) further wires BW and metal plates MP1 and MP2 in FIG. 7. In addition, FIG. 9 shows the perspective plan view of the lower surface side of the semiconductor device PKG when seen through (omitting) further the semiconductor chips CPC, CPH, and CPL in FIG. 8. In FIGS. 6 to 9, the orientation of the semiconductor device PKG is the same. Also, a position of an outer circumference of the sealing portion MR is indicated by a dotted line in FIGS. 7 to 9. In addition, a cross section of the semiconductor device PKG at a position of a line A1-A1 in FIGS. 5 to 7 substantially corresponds to FIG. 10, a cross section of the semiconductor device PKG at a position of a line A2-A2 in FIGS. 5 to 7 substantially corresponds to FIG. 11, a cross section of the semiconductor device PKG at a position of a line A3-A3 in FIGS. 5 to 7 substantially corresponds to FIG. 12, and a cross section of the semiconductor device PKG at a position of a line A4-A4 in FIGS. 5 to 7 substantially corresponds to FIG. 13. Note that a reference character X shown in each plan view denotes a first direction, and a reference character Y denotes a second direction (hereinafter referred to as a Y direction) orthogonal to the first direction X (hereinafter referred to as an X direction). Namely, the X direction and the Y direction are orthogonal to each other.

In the present embodiment, the semiconductor chip CPC in which the control circuit CLC is formed, the semiconductor chip CPH in which the power MOSFET 1 serving as the field effect transistor for a high-side switch is formed, and the semiconductor chip CPL in which the power MOSFET 2 serving as the field effect transistor for a low-side switch is formed are integrated (packaged) in a single semiconductor package to form one semiconductor device PKG. As a result, in addition to reduction in size and thickness of the electronic device (for example, the control board PB), a higher frequency and higher efficiency can be achieved because it is possible to decrease a wiring parasitic inductance.

The semiconductor device (semiconductor package, electronic device) PKG of the present embodiment shown in FIGS. 5 to 13 is a semiconductor device of a resin-sealed semiconductor package type, and is a semiconductor device of an SOP (Small Outline Package) type herein. Hereinafter, a configuration of the semiconductor device PKG will be described with reference to FIGS. 5 to 13.

The semiconductor device PKG of the present embodiment shown in FIGS. 5 to 13 includes die pads (chip mounting portions) DPC, DPH, and DPL, the semiconductor chips CPC, CPH, and CPL mounted on the respective main surfaces of the die pads DPC, DPH, and DPL, the metal plates MP1 and MP2, the plurality of wires (bonding wires) BW, the plurality of leads LD, and the sealing portion (sealing body) MR that seals these parts.

The sealing portion MR as a resin sealing portion (resin sealing body) is made of, for example, a resin material such as a thermosetting resin material, and may contain filler or the like. For example, the sealing portion MR may be formed of an epoxy resin containing filler or the like. For the reason of reducing stress or the like, a biphenyl-based thermosetting resin to which a phenolic curing agent, silicone rubber and filler are added may be used as a material of the sealing portion MR other than the epoxy-based resin.

The sealing portion MR has a main surface (upper surface) MRa, a back surface (lower surface, bottom surface) MRb opposite to the main surface MRa, and side surfaces MRc1, MRc2, MRc3, and MRc4 intersecting with the main surface MRa and the back surface MRb. Namely, an external appearance of the sealing portion MR is formed in a thin plate shape surrounded by the main surface MRa, the back surface MRb and the side surfaces MRc1, MRc2, MRc3, and MRc4. Of the side surfaces MRc1, MRc2, MRc3, and MRc4 of the sealing portion MR, the side surface MRc1 and the side surface MRc3 are positioned to be opposite to each other, the side surface MRc2 and the side surface MRc4 are positioned to be opposite to each other, the side surface MRc1 intersects with the side surfaces MRc2 and MRc4, and the side surface MRc3 intersects with the side surfaces MRc2 and MRc4. The side surfaces MRc1 and MRc3 are substantially parallel to the X direction, and the side surfaces MRc2 and MRc4 are substantially parallel to the Y direction. Also, each of the main surface MRa and the back surface MRb is a surface parallel to both the X direction and the Y direction.

In addition, the sealing portion MR has a side MRd1 extending along the X direction, a side MRd3 extending along the X direction and positioned to be opposite to the side MRd1, a side MRd2 extending along the Y direction, and a side MRd4 extending along the Y direction and positioned to be opposite to the side MRd2 in a plan view. In a plan view, each of the sides MRd2 and MRd4 intersects with the sides MRd1 and MRd3. In the sealing portion MR, the side MRd1 is a side corresponding to the side surface MRc1, the side MRd2 is a side corresponding to the side surface MRc2, the side MRd3 is a side corresponding to the side surface MRc3, and the side MRd4 is a side corresponding to the side surface MRc4. Namely, each of the side surfaces MRc1, MRc2, MRc3, and MRc4 of the sealing portion MR can be regarded as each of the sides MRd1, MRd2, MRd3, MRd4 of the sealing portion MR in a plan view.

A planar shape of the sealing portion MR, that is, each planar shape of the main surface MRa and the back surface MRb of the sealing portion MR is, for example, a rectangular shape (oblong shape). Note that the rectangle constituting the planar shape of the sealing portion MR is a rectangle having sides parallel to the X direction and sides parallel to the Y direction, and a dimension of the sealing portion MR in the X direction is larger than a dimension of the sealing portion MR in the Y direction. Namely, in a plan view, each length of the side MRd1 corresponding to the side surface MRc1 of the sealing portion MR and the side MRd3 corresponding to the side surface MRc3 of the sealing portion MR is larger than each length of the side MRd2 corresponding to the side surface MRc2 of the sealing portion MR and the side MRd4 corresponding to the side surface MRc4 of the sealing portion MR.

A part of each of the plurality of leads LD is sealed inside the sealing portion MR, and another part thereof protrudes to the outside of the sealing portion MR from the side surface of the sealing portion MR. Hereinafter, a part of the lead LD positioned inside the sealing portion MR is referred to as an inner lead portion, and a part of the lead LD positioned outside the sealing portion MR is referred to as an outer lead portion. A plating layer (not shown) such as a solder plating layer may be formed on the outer lead portion of the lead LD. This makes it easier to mount the semiconductor device PKG on the wiring board or the like (solder mounting).

Note that the semiconductor device PKG of the present embodiment has a structure in which a part (outer lead portion) of each of the leads LD protrudes from the side surface of the sealing portion MR, and the following description will be given based on this structure, but the present invention is not limited to this structure. For example, it is also possible to adopt a configuration in which each of the leads LD scarcely protrudes from the side surface of the sealing portion MR and a part of each of the leads LD is exposed on the back surface MRb of the sealing portion MR (configuration of SON (Small Outline Non-leaded Package) type).

The plurality of leads LD are constituted of a plurality of leads LD disposed on a side closer to the side surface MRc1 of the sealing portion MR and a plurality of leads LD disposed on a side closer to the side surface MRc3 of the sealing portion MR. In the case of FIGS. 5 to 13, the lead LD is not disposed on a side closer to the side surface MRc2 of the sealing portion MR and on a side closer to the side surface MRc4 of the sealing portion MR.

From a different point of view, the plurality of leads LD disposed on the side closer to the side surface MRc1 of the sealing portion MR can be regarded as the leads LD intersecting with the side MRd1 of the sealing portion MR in a plan view. Also, from a different point of view, the plurality of leads LD disposed on the side closer to the side surface MRc3 of the sealing portion MR can be regarded as the leads LD intersecting with the side MRd3 of the sealing portion MR in a plan view.

The plurality of leads LD disposed on the side closer to the side surface MRc1 of the sealing portion MR extend in the Y direction and are arranged in the X direction at predetermined intervals in a plan view. In addition, the plurality of leads LD disposed on the side closer to the side surface MRc3 of the sealing portion MR extend in the Y direction and are arranged in the X direction at predetermined intervals in a plan view. The respective outer lead portions of the plurality of leads LD disposed on the side closer to the side surface MRc1 of the sealing portion MR protrude to the outside of the sealing portion MR from the side surface MRc1 of the sealing portion MR. In addition, the respective outer lead portions of the plurality of leads LD disposed on the side closer to the side surface MRc3 of the sealing portion MR protrude to the outside of the sealing portion MR from the side surface MRc3 of the sealing portion MR. The outer lead portion of each of the leads LD is bent such that a lower surface near an end portion of the outer lead portion is positioned on substantially the same plane as the back surface MRb of the sealing portion MR. The outer lead portion of the lead LD functions as a terminal portion for external connection (external terminal) of the semiconductor device PKG. Note that the plurality of leads LD provided in the semiconductor device PKG include leads LD1, LD2, LD3, LD4, LD5a, LD5b, LD6, LD7, and LD8 to be described later.

The die pad DPC is the chip mounting portion on which the semiconductor chip CPC is mounted, the die pad DPH is the chip mounting portion on which the semiconductor chip CPH is mounted, and the die pad DPL is the chip mounting portion on which the semiconductor chip CPL is mounted. A planar shape of each of the die pads DPC, DPH, and DPL is, for example, a rectangle having sides parallel to the X direction and sides parallel to the Y direction. In the case of FIGS. 5 to 13, the dimension in the Y direction is larger than the dimension in the X direction in each of the die pads DPC, DPH, and DPL by reflecting the fact that the dimension in the Y direction is larger than the dimension in the X direction in each of the semiconductor chips CPC, CPH, and CPL. Thus, the Y direction is a longitudinal direction in each of the semiconductor chips CPC, CPH, and CPL and the die pads DPC, DPH, and DPL, and the X direction is a longitudinal direction in the sealing portion MR.

The die pad DPH, the die pad DPC and the die pad DPL are arranged in the X direction in this order. Thus, the die pad DPC is disposed between the die pad DPH and the die pad DPL, the die pad DPH and the die pad DPC are adjacent to each other in the X direction, and the die pad DPC and the die pad DPL are adjacent to each other in the X direction. However, the die pad DPH and the die pad DPC are not in contact with each other and are spaced apart at a predetermined interval, and a part of the sealing portion MR is interposed therebetween. In addition, the die pad DPC and the die pad DPL are not in contact with each other and are spaced apart at a predetermined interval, and another part of the sealing portion MR is interposed therebetween.

The die pads DPC, DPH, and DPL and the plurality of leads LD are configured of a conductor, and are preferably made of a metal material such as copper (Cu) or copper alloy. In addition, the die pads DPC, DPH, and DPL and the plurality of leads LD are preferably formed of the same material (same metal material), and this makes it easier to produce a lead frame in which the die pads DPC, DPH, and DPL and the plurality of leads LD are connected, so that the manufacture of the semiconductor device PKG using the lead frame is facilitated.

The die pad DPC has a main surface DPCa on which the semiconductor chip CPC is mounted and a back surface DPCb opposite to the main surface DPCa. Also, the die pad DPH has a main surface DPHa on which the semiconductor chip CPH is mounted and a back surface DPHb opposite to the main surface DPHa. In addition, the die pad DPL has a main surface DPLa on which the semiconductor chip CPL is mounted and a back surface DPLb opposite to the main surface DPLa.

At least a part of each of the die pads DPC, DPH, and DPL is sealed by the sealing portion MR, and the back surface DPCb of the die pad DPC, the back surface DPHb of the die pad DPH, and the back surface DPLb of the die pad DPL are exposed from the main surface MRa of the sealing portion MR in the present embodiment. Therefore, heat generated at the time of operating the semiconductor chips CPC, CPH, and CPL can be dissipated mainly from the back surfaces of the semiconductor chips CPC, CPH, and CPL to the outside of the semiconductor device PKG through the die pads DPC, DPH, and DPL.

Note that each of the semiconductor chips CPC, CPH, and CPL has a front surface (front surface of the semiconductor chip) and a back surface (back surface of the semiconductor chip) which are main surfaces positioned to be opposite to each other. Namely, each of the semiconductor chips CPC, CPH, and CPL has the front surface (front surface of the semiconductor chip) which is one of the main surfaces and the back surface (back surface of the semiconductor chip) which is the main surface on the opposite side thereof. In each of the semiconductor chips CPC, CPH, and CPL, the front surface of the semiconductor chip corresponds to a front surface of an uppermost protective film (HGC, HGH, HGL) constituting the semiconductor chip, and the back surface of the semiconductor chip corresponds to a back surface of a semiconductor substrate constituting the semiconductor chip. Therefore, the front surface of the semiconductor chip and the front surface of the uppermost protective film (HGC, HGH, HGL) constituting the semiconductor chip are on the same plane in each of the semiconductor chips CPC, CPH, and CPL. Namely, the semiconductor chip CPC has the uppermost protective film (outermost protective film, protective film, protective insulating film) HGC, and a front surface CPCa is not only the front surface of the semiconductor chip CPC but also the front surface of the uppermost protective film HGC in FIGS. 11 and 13. Also, the semiconductor chip CPH has the uppermost protective film (outermost protective film, protective film, protective insulating film) HGH, and a front surface CPHa is not only the front surface of the semiconductor chip CPH but also the front surface of the uppermost protective film HGH in FIGS. 10 and 13. In addition, the semiconductor chip CPL has the uppermost protective film (outermost protective film, protective film, protective insulating film) HGL, and a front surface CPLa is not only the front surface of the semiconductor chip CPL but also the front surface of the uppermost protective film HGL in FIGS. 12 and 13. Therefore, the uppermost protective film (HGC, HGH, HGL) can be regarded as the protective film having (forming) the front surface of each of the semiconductor chips CPC, CPH, and CPL. In each of the semiconductor chips CPC, CPH, and CPL, the uppermost protective film (HGC, HGH, HGL) is made of an insulating film, and is formed in the uppermost layer (outermost layer) of the semiconductor chip. In each of the semiconductor chips CPC, CPH, and CPL, the uppermost protective film (HGC, HGH, HGL) has an opening portion that exposes a bonding pad, and the bonding pad is exposed from the opening portion of the uppermost protective film (HGC, HGH, HGL).

In addition, in the die pads DPC, DPH, and DPL, the leads LD, and lead connection portions LB2 and LB4, a plating layer (not shown) made of silver (Ag) or the like may be formed in the regions where the semiconductor chips CPC, CPH, and CPL are mounted, in the regions where the wires BW are connected, and in the regions where the metal plates MP1 and MP2 are connected. As a result, the semiconductor chips CPC, CPH, and CPL, the metal plates MP1 and MP2, and the wires BW can be more accurately connected to the die pads DPC, DPH, and DPL, the leads LD, and the lead connection portions LB2 and LB4.

The semiconductor chip CPH is mounted on the main surface DPHa of the die pad DPH in a state where the back surface of the semiconductor chip CPH faces the die pad DPH. The semiconductor chip CPH is mounted on the main surface DPHa of the die pad DPH via a conductive adhesive layer BD1. A back-surface electrode (electrode) BEH is formed on the back surface (the entire back surface) of the semiconductor chip CPH, and the back-surface electrode BEH is bonded and electrically connected to the die pad DPH via the conductive adhesive layer BD1.

Also, the semiconductor chip CPL is mounted on the main surface DPLa of the die pad DPL in a state where the back surface of the semiconductor chip CPL faces the die pad DPL. The semiconductor chip CPL is mounted on the main surface DPLa of the die pad DPL via a conductive adhesive layer BD2. A back-surface electrode (electrode) BEL is formed on the back surface (the entire back surface) of the semiconductor chip CPL, and the back-surface electrode BEL is bonded and electrically connected to the die pad DPL via the conductive adhesive layer BD2.

In addition, the semiconductor chip CPC is mounted on the main surface DPCa of the die pad DPC in a state where the back surface of the semiconductor chip CPC faces the die pad DPC. The semiconductor chip CPC is mounted on the main surface DPCa of the die pad DPC via an adhesive layer BD3, but the adhesive layer BD3 may be conductive or insulating.

The planar shape of each of the semiconductor chips CPC, CPH, and CPL is, for example, a rectangular shape, and more specifically, a rectangle having the sides parallel to the X direction and the sides parallel to the Y direction. A planar size (plane area) of the die pad DPH is larger than a planar size of the semiconductor chip CPH, a planar size of the die pad DPL is larger than a planar size of the semiconductor chip CPL, and a planar size of the die pad DPC is larger than a planar size of the semiconductor chip CPC. Thus, in a plan view, the semiconductor chip CPH is included in the main surface DPHa of the die pad DPH, the semiconductor chip CPL is included in the main surface DPLa of the die pad DPL, and the semiconductor chip CPC is included in the main surface DPCa of the die pad DPC. The semiconductor chips CPC, CPH, and CPL are sealed inside the sealing portion MR and are not exposed from the sealing portion MR.

The back-surface electrode BEH of the semiconductor chip CPH is electrically connected to the drain of the power MOSFET 1 formed in the semiconductor chip CPH and also electrically connected to the drain of the sense MOSFET 3. Namely, the back-surface electrode BEH of the semiconductor chip CPH serves as both a drain electrode of the power MOSFET 1 and a drain electrode of the sense MOSFET 3. Also, the back-surface electrode BEL of the semiconductor chip CPL is electrically connected to the drain of the power MOSFET 2 formed in the semiconductor chip CPL and also electrically connected to the drain of the sense MOSFET 4. Namely, the back-surface electrode BEL of the semiconductor chip CPL serves as both a drain electrode of the power MOSFET 2 and a drain electrode of the sense MOSFET 4. The adhesive layers BD1 and BD2 are made of a conductive bonding material (adhesive), and for example, a paste-type conductive adhesive such as silver paste, solder, or the like can be also used as the adhesive layers BD1 and BD2.

On the front surface (the main surface on the side opposite to the side on which the back-surface electrode BEH is formed) of the semiconductor chip CPH, a gate bonding pad PDHG, source bonding pads PDHS1 and PDHS2, an anode bonding pad PDHA and a cathode bonding pad PDHC of a diode for temperature sensing are exposed from the uppermost protective film HGH constituting the semiconductor chip CPH. Also, on the front surface (the main surface on the side opposite to the side on which the back-surface electrode BEL is formed) of the semiconductor chip CPL, a gate bonding pad PDLG, source bonding pads PDLS1 and PDLS2, an anode bonding pad PDLA and a cathode bonding pad PDLC of a diode for temperature sensing are exposed from the uppermost protective film HGL constituting the semiconductor chip CPL. In addition, on the front surface (the main surface on the side opposite to the back surface) of the semiconductor chip CPC, a plurality of bonding pads PDC are exposed from the uppermost protective film HGC constituting the semiconductor chip CPC. Hereinafter, the "bonding pad", the "bonding pad electrode", the "pad electrode" and the "electrode" will be simply referred to as a "pad".

The pad PDC of the semiconductor chip CPC is electrically connected to the control circuit CLC formed in the semiconductor chip CPC through an internal wiring of the semiconductor chip CPC.

The gate pad PDHG of the semiconductor chip CPH is electrically connected to a gate electrode of the power MOSFET 1 and a gate electrode of the sense MOSFET 3 formed in the semiconductor chip CPH. Namely, the gate pad PDHG of the semiconductor chip CPH serves as both a gate pad of the power MOSFET 1 and a gate pad of the sense MOSFET 3. Also, the source pad PDHS1 of the semiconductor chip CPH is electrically connected to the source of the power MOSFET 1 formed in the semiconductor chip CPH. Meanwhile, the source pad PDHS2 of the semiconductor chip CPH is electrically connected to the source of the sense MOSFET 3 formed in the semiconductor chip CPH. Namely, the pad PDHS1 of the semiconductor chip CPH corresponds to a source pad of the power MOSFET 1, and the pad PDHS2 of the semiconductor chip CPH corresponds to a source pad of the sense MOSFET 3. In the semiconductor chip CPH, a planar size (area) of the source pad PDHS1 is larger than each planar size of the other pads PDHG, PDHS2, PDHA, and PDHC.

Also, the gate pad PDLG of the semiconductor chip CPL is electrically connected to a gate electrode of the power MOSFET 2 and a gate electrode of the sense MOSFET 4 formed in the semiconductor chip CPL. Namely, the gate pad PDLG of the semiconductor chip CPL serves as both a gate pad of the power MOSFET 2 and a gate pad of the sense MOSFET 4. In addition, the source pad PDLS1 of the semiconductor chip CPL is electrically connected to the source of the power MOSFET 2 formed in the semiconductor chip CPL. Meanwhile, the source pad PDLS2 of the semiconductor chip CPL is electrically connected to the source of the sense MOSFET 4 formed in the semiconductor chip CPL. Namely, the pad PDLS1 of the semiconductor chip CPL corresponds to a source pad of the power MOSFET 2, and the pad PDLS2 of the semiconductor chip CPL corresponds to a source pad of the sense MOSFET 4. In the semiconductor chip CPL, a planar size (area) of the source pad PDLS1 is larger than each planar size of the other pads PDLG, PDLS2, PDLA, and PDLC.

Note that a plurality of unit transistor cells constituting the power MOSFET 1 are formed on the semiconductor substrate constituting the semiconductor chip CPH, and the power MOSFET 1 is formed by connecting the plurality of unit transistor cells in parallel. In addition, a plurality of unit transistor cells constituting the power MOSFET 2 are formed on the semiconductor substrate constituting the semiconductor chip CPL, and the power MOSFET 2 is formed by connecting the plurality of unit transistor cells in parallel. Each unit transistor cell is formed of, for example, a trench gate MISFET. Transistor formation regions RG1 and RG2 in FIGS. 29 and 30 to be described later correspond to regions where the plurality of unit transistor cells for the power MOSFETs are formed.

Namely, source regions of the plurality of unit transistor cells for the power MOSFET 1, which are formed on the front surface of the semiconductor substrate constituting the semiconductor chip CPH, are electrically connected to the common source electrode formed on an interlayer insulating film on the semiconductor substrate and constituting the semiconductor chip CPH, and the source electrode is exposed from the opening portion of the uppermost protective film HGH constituting the semiconductor chip CPH, so that the source pad PDHS1 is formed. The uppermost protective film HGH of the semiconductor chip CPH is formed on the interlayer insulating film on the semiconductor substrate constituting the semiconductor chip CPH so as to cover the source electrode, and has the opening portion that exposes at least a part of the source electrode. Also, source regions of the plurality of unit transistor cells for the power MOSFET 2, which are formed on the front surface of the semiconductor substrate constituting the semiconductor chip CPL, are electrically connected to the common source electrode formed on an interlayer insulating film on the semiconductor substrate and constituting the semiconductor chip CPL, and the source electrode is exposed from the opening portion of the uppermost protective film HGL constituting the semiconductor chip CPL, so that the source pad PDLS1 is formed. The uppermost protective film HGL of the semiconductor chip CPL is formed on the interlayer insulating film on the semiconductor substrate constituting the semiconductor chip CPL so as to cover the source electrode, and has the opening portion that exposes at least a part of the source electrode. In addition, the semiconductor substrate constituting the semiconductor chip CPH has a function as a common drain region of the plurality of unit transistor cells for the power MOSFET 1, and the back-surface electrode BEH is formed on the entire back surface of the semiconductor substrate. In addition, the semiconductor substrate constituting the semiconductor chip CPL has a function as a common drain region of the plurality of unit transistor cells for the power MOSFET 2, and the back-surface electrode BEL is formed on the entire back surface of the semiconductor substrate. In each of the semiconductor chips CPH and CPL, a current between the source and the drain of the power MOSFET (1, 2) flows in a thickness direction of the semiconductor substrate constituting the semiconductor chip.

Not only the power MOSFET 1 and the sense MOSFET 3 described above but also the diode for temperature sensing (corresponding to a diode DA1 in FIGS. 29 and 30 to be described later) is formed in the semiconductor chip CPH, the pad PDHA is electrically connected to the anode of the temperature sensing diode (DA1), and the pad PDHC is electrically connected to the cathode of the temperature sensing diode (DA1). In addition, not only the power MOSFET 2 and the sense MOSFET 4 described above but also the diode for temperature sensing (corresponding to a diode DA2 in FIGS. 29 and 30 to be described later) is formed in the semiconductor chip CPL, the pad PDLA is electrically connected to the anode of the temperature sensing diode (DA2), and the pad PDLC is electrically connected to the cathode of the temperature sensing diode (DA2). Note that the temperature sensing diodes (DA1, DA2) are not shown in the above-described circuit diagram of FIG. 4.

On the front surface of the semiconductor chip CPH, the pads (here, the pads PDHG, PDHS2, PDHA, and PDHC) other than the source pad PDHS1 are disposed (arranged) along the side H1 facing the semiconductor chip CPC. Further, each of the pads PDHG, PDHS2, PDHA, and PDHC other than the source pad PDHS1 of the semiconductor chip CPH is electrically connected to the pad PDC of the semiconductor chip CPC via the wire BW. Namely, one end of the wire BW is connected to each of the pads PDHG, PDHS2, PDHA, and PDHC, and the other end of the wire BW is connected to the pad PDC of the semiconductor chip CPC. Each of the pads PDHG, PDHS2, PDHA, and PDHC of the semiconductor chip CPH is electrically connected to the pad PDC of the semiconductor chip CPC via the wire BW, and is further electrically connected to the control circuit CLC in the semiconductor chip CPC through the internal wiring of the semiconductor chip CPC.

Also, on the front surface of the semiconductor chip CPL, the pads (here, the pads PDLG, PDLS2, PDLA, and PDLC) other than the source pad PDLS1 are disposed (arranged) along a side L1 facing the semiconductor chip CPC. Further, each of the pads PDLG, PDLS2, PDLA, and PDLC other than the source pad PDLS1 of the semiconductor chip CPL is electrically connected to the pad PDC of the semiconductor chip CPC via the wire BW. Namely, one end of the wire BW is connected to each of the pads PDLG, PDLS2, PDLA, and PDLC, and the other end of the wire BW is connected to the pad PDC of the semiconductor chip CPC. Each of the pads PDLG, PDLS2, PDLA, and PDLC of the semiconductor chip CPL is electrically connected to the pad PDC of the semiconductor chip CPC via the wire BW, and is further electrically connected to the control circuit CLC in the semiconductor chip CPC through the internal wiring of the semiconductor chip CPC.

The wire (bonding wire) BW is a conductive connection member, and more specifically a conductive wire. The wire BW is made of metal, and thus can be regarded as a metal wire (metal thin wire). A gold (Au) wire, a copper (Cu) wire, an aluminum (Al) wire, or the like can be suitably used as the wire BW. The wire BW is sealed inside the sealing portion MR and is not exposed from the sealing portion MR. In each of the leads LD, a connection part of the wire BW is the inner lead portion positioned inside the sealing portion MR.

The source pad PDHS1 of the semiconductor chip CPH (that is, the source of the power MOSFET 1 described above) is electrically connected to the lead connection portion (lead wiring portion) LB2 through the metal plate MP1. Namely, the metal plate MP1 is bonded to the source pad PDHS1 of the semiconductor chip CPH via a conductive adhesive layer (bonding material) BD4, and is further bonded to the lead connection portion LB2 via a conductive adhesive layer (bonding material) BD5.

The source pad PDLS1 of the semiconductor chip CPL (that is, the source of the power MOSFET 2 described above) is electrically connected to the lead connection portion (lead wiring portion) LB4 through the metal plate MP2. Namely, the metal plate MP2 is bonded to the source pad PDLS1 of the semiconductor chip CPL via a conductive adhesive layer (bonding material) BD6, and is further bonded to the lead connection portion LB4 via a conductive adhesive layer (bonding material) BD7.

Since the metal plate MP1 rather than the wire is used to electrically connect the source pad PDHS1 of the semiconductor chip CPH and the lead LD2, it is possible to reduce an ON-resistance of the power MOSFET 1. In addition, since the metal plate MP2 rather than the wire is used to electrically connect the source pad PDLS1 of the semiconductor chip CPL and the lead LD4, it is possible to reduce an ON-resistance of the power MOSFET 2. As a result, it is possible to reduce a package resistance and to reduce a conduction loss.

The adhesive layers BD4, BD5, BD6, and BD7 are made of a conductive bonding material (adhesive), and for example, a paste-type conductive adhesive such as a silver paste, solder or the like can be used for the adhesive layers. Also, there may be a case where the metal plates MP1 and MP2 are bonded (connected) directly to the source pads PDHS1 and PDLS1 of the semiconductor chips CPH and CPL and the lead connection portions LB2 and LB4 by compression or the like without using the conductive adhesive layers (bonding materials) BD4, BD5, BD6, and BD7.

Each of the metal plates MP1 and MP2 is a conductive plate made of a conductor, and is preferably formed of metal (metal material) with high conductivity and thermal conductivity such as copper (Cu), copper (Cu) alloy, aluminum (Al), or aluminum (Al) alloy. Dimensions (widths) of each of the metal plates MP1 and MP2 in the X direction and the Y direction are larger than a diameter of the wire BW.

The heat generated in the semiconductor chips CPH and CPL is dissipated from the back surfaces of the semiconductor chips CPH and CPL through the die pads DPH and DPL, and is further dissipated from the front surfaces of the semiconductor chips CPH and CPL through the metal plates MP1 and MP2, so that it is possible to improve the dissipation of heat generated in the semiconductor chips CPH and CPL.

Of the plurality of pads PDC of the semiconductor chip CPC, the pads PDC, which are not connected to the pads of the semiconductor chip CPH and the pads of the semiconductor chip CPL, are electrically connected to the leads LD5$a$ and LD5$b$ of the plurality of leads LD provided in the semiconductor device PKG through the wires BW, respectively. Namely, one end of the wire BW is connected to each of the pads PDC of the semiconductor chip CPC which are not connected to the pads of the semiconductor chip CPH and the pads of the semiconductor chip CPL, and the other end of the wire BW is connected to the inner lead portion of the lead LD5$a$ or the inner lead portion of the lead LD5$b$. Each of the leads LD5$a$ and LD5$b$ can function as a signal transmission path between the semiconductor chip CPC in the semiconductor device PKG and the control circuit CT outside the semiconductor device PKG.

Of the leads LD5$a$ and LD5$b$, the leads LD5$a$ are disposed on a side closer to the side surface MRc1 of the sealing portion MR, and the leads LD5$b$ are disposed on a side closer to the side surface MRc3 of the sealing portion MR. The plurality of pads PDC disposed (arranged) along the side closer to the side surface MRc1 of the sealing portion MR on the front surface of the semiconductor chip CPC are electrically connected to the plurality of leads LD5$a$ disposed on the side closer to the side surface MRc1 of the sealing portion MR via the wires BW, respectively. Also, the plurality of pads PDC disposed (arranged) along the side closer to the side surface MRc3 of the sealing portion MR on the front surface of the semiconductor chip CPC are electrically connected to the plurality of leads LD5$b$ disposed on the side closer to the side surface MRc3 of the sealing portion MR via the wires BW, respectively. Each of the leads LD5$a$ and LD5$b$ is an isolated lead that is not connected to any of the die pads DPC, DPH, and DPL, the leads LD1, LD2, LD3, and LD4 and the lead connection portions LB1, LB2, LB3, and LB4 via a conductor. Namely, the pads PDC of the semiconductor chip CPC, which are not connected to the pads of the semiconductor chip CPH and the pads of the semiconductor chip CPL, are connected to the isolated individual leads LD5$a$ and LD5$b$ via the wires BW.

The lead connection portion LB2 is adjacent to the die pad DPH in the Y direction and extends in the X direction inside the sealing portion MR along the side surface MRc3. Also, the lead connection portion LB4 is adjacent to the die pad DPL in the Y direction and extends in the X direction inside the sealing portion MR along the side surface MRc1. However, the lead connection portion LB2 and the die pad DPH are not in contact with each other and are spaced apart at a predetermined interval, and a part of the sealing portion MR is interposed therebetween. In addition, the lead connection portion LB4 and the die pad DPL are not in contact with each other and are spaced apart at a predetermined interval, and another part of the sealing portion MR is interposed therebetween. The lead connection portions LB2 and LB4 are sealed inside the sealing portion MR and are not exposed from the sealing portion MR.

The plurality of leads LD2 of the plurality of leads LD provided in the semiconductor device PKG are integrally connected (coupled) to the lead connection portion LB2. Namely, the lead connection portion LB2 and the plurality of leads LD2 are integrally formed. The plurality of leads LD2 are adjacent to each other in the X direction, and the inner lead portions of the plurality of leads LD2 are connected to each other by the lead connection portion LB2 extending in the X direction inside the sealing portion MR. Thus, the lead connection portion LB2 can be regarded as a connection portion that connects the inner lead portions of the plurality of leads LD2 to each other. The plurality of leads LD2 and the lead connection portion LB2 are electrically connected to the source of the power MOSFET 1 formed in the semiconductor chip CPH through the metal plate MP1 or the like. Thus, the plurality of leads LD2 are leads for the source of the high-side power MOSFET 1 and correspond to the terminal TE2.

The source pad PDHS1 of the semiconductor chip CPH is a pad for outputting the current flowing in the power MOSFET 1. The current flowing in the power MOSFET 1 is output to the outside of the semiconductor chip CPH from the pad PDHS1 and is output to the outside of the semiconductor device PKG (output to the coil CL in FIGS. 1 and 4 described above) from the lead LD2 (terminal TE2) via the metal plate MP1 and the lead connection portion LB2.

Also, the plurality of leads LD4 of the plurality of leads LD provided in the semiconductor device PKG are integrally connected (coupled) to the lead connection portion LB4. Namely, the lead connection portion LB4 and the plurality of leads LD4 are integrally formed. The plurality of leads LD4 are adjacent to each other in the X direction, and the inner lead portions of the plurality of leads LD4 are connected to each other by the lead connection portion LB4 extending in the X direction inside the sealing portion MR. Thus, the lead connection portion LB4 can be regarded as a connection portion that connects the inner lead portions of the plurality of leads LD4 to each other. The plurality of leads LD4 and the lead connection portion LB4 are electrically connected to the source of the power MOSFET 2 formed in the semiconductor chip CPL through the metal plate MP2 or the like. Thus, the plurality of leads LD4 are leads for the source of the low-side power MOSFET 2 and correspond to the terminal TE4. Namely, the plurality of leads LD4 serve as the terminal TE4 and the reference potential (ground potential GND) is supplied to the leads LD4 (terminal TE4). Therefore, the lead connection portion LB4 and the plurality of leads LD4 integrally connected thereto can be regarded as a ground terminal portion for supplying ground potential.

Since the volume can be increased by collectively connecting the plurality of leads LD2 to the lead connection portion LB2 as compared with a case where the plurality of leads LD2 are divided from each other, it is possible to reduce a wiring resistance and to reduce a conduction loss of the power MOSFET 1. Also, since the volume can be increased by collectively connecting the plurality of leads LD4 to the lead connection portion LB4 as compared with a case where the plurality of leads LD4 are divided from each other, it is possible to reduce a wiring resistance and to reduce a conduction loss of the power MOSFET 2.

The lead connection portion LB2 and the plurality of leads LD2 that are integrally formed are not connected to any of the die pads DPC, DPH, and DPL via a conductor, and the lead connection portion LB4 and the plurality of leads LD4 that are integrally formed are not connected to any of the die pads DPC, DPH, and DPL via a conductor.

The lead connection portion LB2 and the plurality of leads LD2 connected thereto are disposed on a side closer to the side surface MRc3 of the sealing portion MR so as to be adjacent to the die pad DPH in the Y direction, and the lead connection portion LB4 and the plurality of leads LD4 connected thereto are disposed on a side closer to the side surface MRc1 of the sealing portion MR so as to be adjacent to the die pad DPL in the Y direction.

The plurality of leads LD1 of the plurality of leads LD provided in the semiconductor device PKG are formed integrally with the die pad DPH. Thus, the plurality of leads LD1 are electrically connected to the die pad DPH, and are electrically connected to the back-surface electrode BEH of the semiconductor chip CPH via the die pad DPH and the conductive adhesive layer BD1. Thus, the plurality of leads LD1 are leads for the drain of the high-side power MOSFET 1 and correspond to the terminal TE1. Namely, the plurality of leads LD1 serve as the terminal TE1 and the potential (power supply potential) VIN on the high potential side of the power supply (input power supply) outside the semiconductor device PKG is supplied to the leads LD1 (terminal TE1). Therefore, the plurality of leads LD1 can be regarded as a terminal portion for supplying power supply potential.

In addition, the plurality of leads LD3 of the plurality of leads LD provided in the semiconductor device PKG are formed integrally with the die pad DPL. Thus, the plurality of leads LD3 are electrically connected to the die pad DPL, and are electrically connected to the back-surface electrode BEL of the semiconductor chip CPL via the die pad DPL and the conductive adhesive layer BD2. Thus, the plurality of leads LD3 are the leads for the drain of the low-side power MOSFET 2 and correspond to the terminal TE3. Therefore, although the plurality of leads LD2 and the plurality of leads LD4 of the semiconductor device PKG are not electrically connected when only the semiconductor device PKG is viewed alone, the plurality of leads LD2 and the plurality of leads LD4 of the semiconductor device PKG are electrically connected through the wiring of the wiring board or the like when the semiconductor device PKG is mounted on the wiring board or the like in order to form the inverter circuit INV including the semiconductor device PKG.

The plurality of leads LD1 are disposed on a side closer to the side surface MRc1 of the sealing portion MR so as to be adjacent to the die pad DPH in the Y direction, and the plurality of leads LD3 are disposed on a side closer to the side surface MRc3 of the sealing portion MR so as to be adjacent to the die pad DPL in the Y direction.

The plurality of leads LD1 are adjacent to each other in the X direction, and the inner lead portions of the plurality of leads LD1 are connected to each other by the lead connection portion LB1 extending in the X direction inside the sealing portion MR. Thus, the lead connection portion LB1 can be regarded as a connection portion that connects the inner lead portions of the plurality of leads LD1 to each other. The lead connection portion LB1 is integrally connected to the die pad DPH via a connection portion LB1a extending in the Y direction. The plurality of leads LD1, the lead connection portion LB1, the connection portion LB1a, and the die pad DPH are integrally formed.

In addition, the plurality of leads LD3 are adjacent to each other in the X direction, and the inner lead portions of the plurality of leads LD3 are connected to each other by the lead connection portion LB3 extending in the X direction inside the sealing portion MR. Thus, the lead connection portion LB3 can be regarded as a connection portion that connects the inner lead portions of the plurality of leads LD3 to each other. The lead connection portion LB3 is integrally connected to the die pad DPL via a connection portion LB3a extending in the Y direction. The plurality of leads LD3, the lead connection portion LB3, the connection portion LB3a, and the die pad DPL are integrally formed.

In the semiconductor device PKG of the present embodiment, the plurality of leads LD1 corresponding to the terminal TE1 and the plurality of leads LD4 corresponding to the terminal TE4 are disposed on the side closer to the side surface MRc1 of the sealing portion MR, and the plurality of leads LD2 corresponding to the terminal TE2 and the plurality of leads LD3 corresponding to the terminal TE3 are disposed on the side closer to the side surface MRc3 of the sealing portion MR. The plurality of leads LD1 corresponding to the terminal TE1 and the plurality of leads LD2 corresponding to the terminal TE2 are on the opposite sides (opposite sides in the Y direction) with the die pad DPH (the semiconductor chip CPH) interposed therebetween. In addition, the plurality of leads LD4 corresponding to the terminal TE4 and the plurality of leads LD3 corresponding to the terminal TE3 are on the opposite sides (opposite sides in the Y direction) with the die pad DPL (the semiconductor chip CPL) interposed therebetween.

Thus, a lead group formed of the plurality of leads LD1 and a lead group formed of the plurality of leads LD4 are disposed on the same side closer to the side surface MRc1 of the sealing portion MR, and the lead group formed of the plurality of leads LD1 is at a position closer to the side surface MRc2 of the sealing portion MR than the lead group formed of the plurality of leads LD4 when viewed in the X direction. Also, a lead group formed of the plurality of leads LD2 and a lead group formed of the plurality of leads LD3 are disposed on the same side closer to the side surface MRc3 of the sealing portion MR, and the lead group formed of the plurality of leads LD2 is at a position closer to the side surface MRc2 of the sealing portion MR than the lead group formed of the plurality of leads LD3 when viewed in the X direction.

In addition, a lead group formed of the plurality of leads LD5a is disposed between the lead group formed of the plurality of leads LD1 and the lead group formed of the plurality of leads LD4 on the side closer to the side surface MRc1 of the sealing portion MR. Further, a lead group formed of the plurality of leads LD5b is disposed between the lead group formed of the plurality of leads LD2 and the lead group formed of the plurality of leads LD3 on the side closer to the side surface MRc3 of the sealing portion MR.

Thus, the lead group formed of the plurality of leads LD1, the lead group formed of the plurality of leads LD5a, and the lead group formed of the plurality of leads LD4 are arranged in this order in a direction from the die pad DPH to the die pad DPL on the side closer to the side surface MRc1 of the sealing portion MR. Also, the lead group formed of the plurality of leads LD2, the lead group formed of the plurality of leads LD5b, and the lead group formed of the plurality of leads LD3 are arranged in this order in the direction from the die pad DPH to the die pad DPL on the side closer to the side surface MRc3 of the sealing portion MR.

Also, the plurality of leads LD8 are integrally connected to the die pad DPC. The leads LD8 are used to support the die pad DPC on a frame of a lead frame LF to be described later at the time of manufacturing the semiconductor device PKG. Thus, the lead LD8 is not electrically connected to any of the pads of the semiconductor chips CPC, CPH, and CPL, and is not electrically connected to the back-surface electrodes BEH and BEL of the semiconductor chips CPH and CPL, either. Thus, the lead LD8 does not function as the signal transmission path between the semiconductor chip CPC in the semiconductor device PKG and the control circuit CT outside the semiconductor device PKG, and does not function as a current path between the semiconductor chips CPH and CPL in the semiconductor device PKG and the motor MOT (coil CL) outside the semiconductor device PKG, either. The leads LD8 connected to the die pad DPC are disposed on each of the side closer to the side surface MRc1 and the side closer to the side surface MRc3 of the sealing portion MR.

Also, the lead LD6 disposed on the side closer to the side surface MRc3 of the sealing portion MR is integrally connected to the die pad DPH. The lead LD6 is used to support the die pad DPH on a frame of the lead frame LF to be described later at the time of manufacturing the semiconductor device PKG. In addition, the lead LD7 disposed on the side closer to the side surface MRc1 of the sealing portion MR is integrally connected to the die pad DPL. The lead LD7 is used to support the die pad DPL on a frame of the lead frame LF to be described later at the time of manufacturing the semiconductor device PKG. The number of the leads LD6 is smaller than the number of the leads LD1, and may be one, and the number of the leads LD7 is smaller than the number of the leads LD3, and may be one.

Also, suspension leads TL integrally connected to the die pad DPH are disposed on the side closer to the side surface MRc2 of the sealing portion MR and suspension leads TL integrally connected to the die pad DPL are disposed on the side closer to the side surface MRc4 of the sealing portion MR. The suspension leads TL are used to support the die pads DPH and DPL on a frame of the lead frame LF to be described later at the time of manufacturing the semiconductor device PKG. The suspension leads TL do not protrude from the side surfaces of the sealing portion MR.

The plurality of leads LD1 disposed on the side closer to the side surface MRc1 of the sealing portion MR and the lead LD6 disposed on the side closer to the side surface MRc3 of the sealing portion MR are formed integrally with the die pad DPH, and thus are electrically connected to the back-surface electrode BEH of the semiconductor chip CPH mounted on the die pad DPH. Also, the plurality of leads LD3 disposed on the side closer to the side surface MRc3 of the sealing portion MR and the lead LD7 disposed on the side closer to the side surface MRc1 of the sealing portion MR are formed integrally with the die pad DPL, and thus are electrically connected to the back-surface electrode BEL of the semiconductor chip CPL mounted on the die pad DPL. However, the leads LD6 and LD7 do not function as the current path between the semiconductor chips CPH and CPL in the semiconductor device PKG and the motor MOT (coil CL) outside the semiconductor device PKG, and do not function as the signal transmission path between the semiconductor chip CPC in the semiconductor device PKG and the control circuit CT outside the semiconductor device PKG, either.

Namely, the semiconductor device PKG is configured such that a current flows from the lead LD1 for the drain of the power MOSFET 1 to the lead LD2 for the source of the power MOSFET 1 through the semiconductor chip CPH (power MOSFET 1) when the power MOSFET 1 is in an ON-state. In addition, the semiconductor device PKG is configured such that a current flows from the lead LD3 for the drain of the power MOSFET 2 to the lead LD4 for the source of the power MOSFET 2 through the semiconductor chip CPL (power MOSFET 2) when the power MOSFET 2 is in an ON-state. When the power MOSFET 1 is turned into the ON-state, the lead LD1 rather than the lead LD6 functions as the path of the current flowing via the power MOSFET 1. Also, when the power MOSFET 2 is turned into the ON-state, the lead LD3 rather than the lead LD7 functions as the path of the current flowing via the power MOSFET 2.

Also, in the semiconductor device PKG, the source lead (here, the lead LD2) that is electrically connected to the source of the power MOSFET 1 is disposed only on the side closer to the side surface MRc3 of the sealing portion MR and is not disposed on the sides closer to the side surfaces MRc1, MRc2, and MRc4 of the sealing portion MR. In addition, in the semiconductor device PKG, the source lead (here, the lead LD4) that is electrically connected to the source of the power MOSFET 2 is disposed only on the side closer to the side surface MRc1 of the sealing portion MR and is not disposed on the sides closer to the side surfaces MRc2, MRc3, and MRc4 of the sealing portion MR.

<Manufacturing Process of Semiconductor Device>

Figure 20:
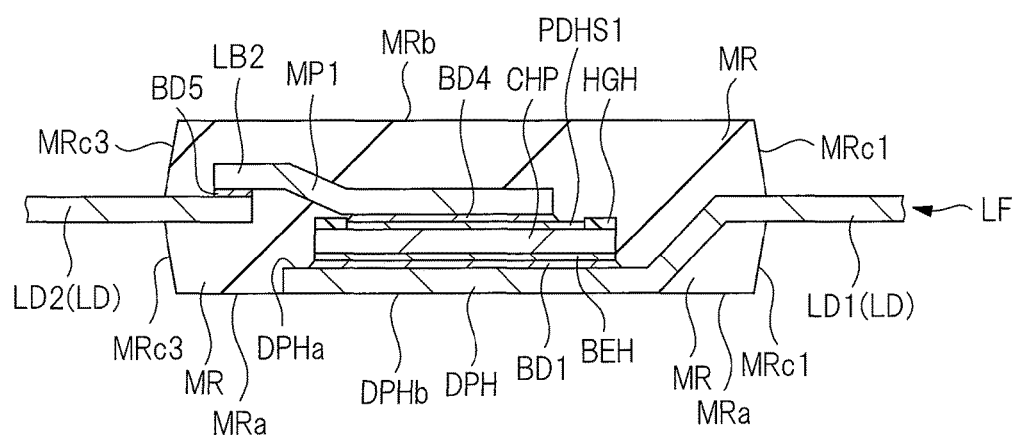
FIG. 20 is a cross-sectional view showing the semiconductor device in the same manufacturing process as FIG. 19.
Figure 21:
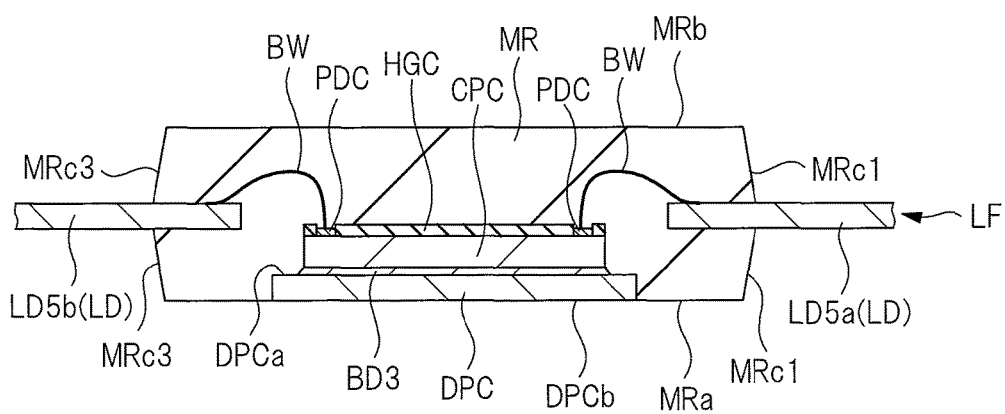
FIG. 21 is a cross-sectional view showing the semiconductor device in the same manufacturing process as FIG. 19.
Figure 22:
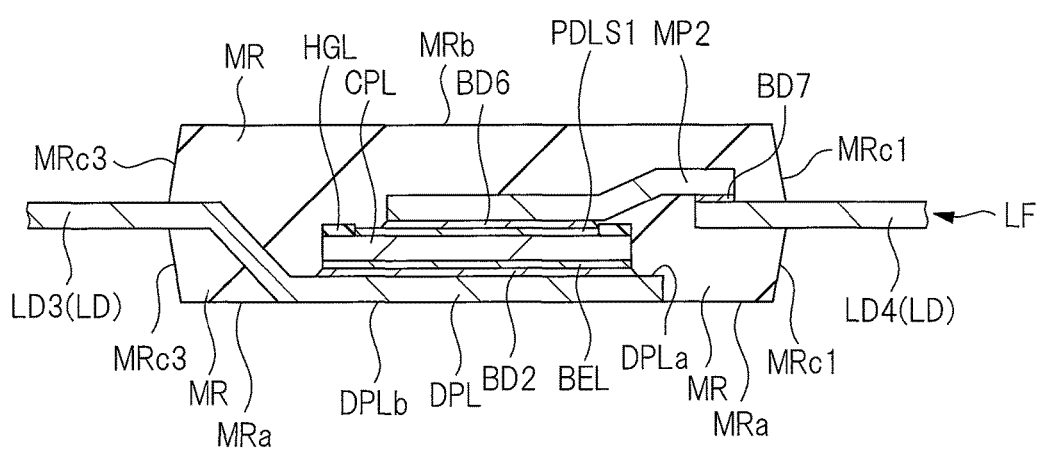
FIG. 22 is a cross-sectional view showing the semiconductor device in the same manufacturing process as FIG. 19.

Next, a manufacturing process (assembly process) of the semiconductor device PKG shown in FIGS. 5 to 13 will be described. FIGS. 14 to 22 are plan views and cross-sectional views showing the semiconductor device PKG in the manufacturing process according to the present embodiment. FIGS. 14 to 19 are the plan views and FIGS. 20 to 22 are the cross-sectional views, and FIGS. 20 to 22 are the cross-sectional views in the same process step as FIG. 19.

First, for the manufacture of the semiconductor device PKG, the lead frame LF is prepared, and the semiconductor chips CPC, CPH, and CPL are prepared. Any of the lead frame LF and the semiconductor chips CPC, CPH, and CPL may be prepared first, or both may be prepared at the same time.

Figure 14:
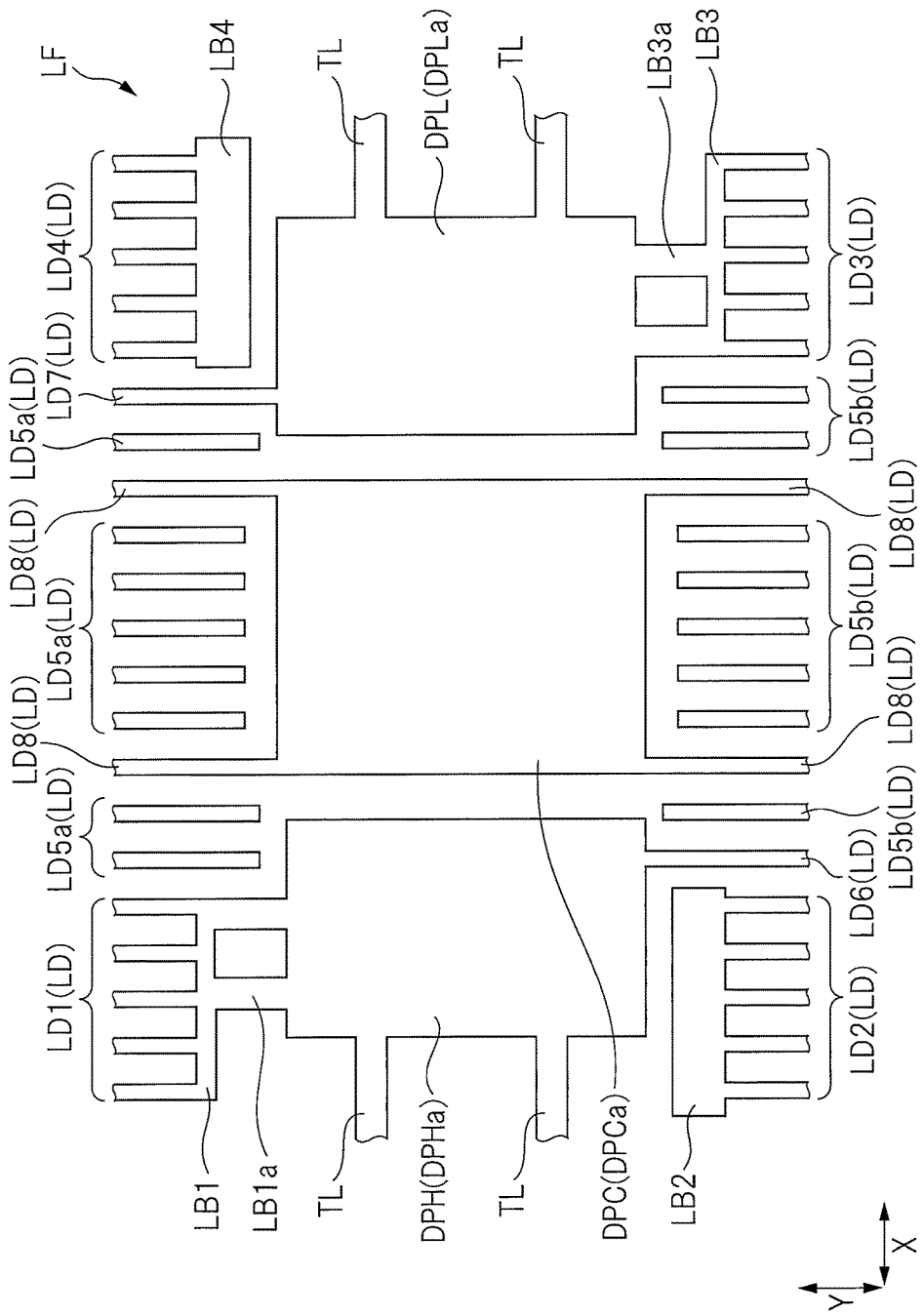
FIG. 14 is a plan view showing the semiconductor device in a manufacturing process according to the embodiment.

As shown in FIG. 14, the lead frame LF includes the frame (not shown), the die pads DPC, DPH, and DPL, the plurality of leads LD, the lead connection portions LB1, LB2, LB3, and LB4, and the suspension leads TL in an integrated manner. One end portion of each of the leads LD is connected to the frame. Each of the die pads DPC, DPH, and DPL is connected to the frame via some of the leads LD. Specifically, the die pad DPC is connected to the frame by the leads LD8, the die pad DPH is connected to the frame by the leads LD1 and LD6 and the suspension leads TL, and the die pad DPL is connected to the frame by the leads LD3 and LD7 and the suspension leads TL. The lead frame LF is made of, for example, a metal material containing copper (Cu) as a main component. Specifically, the lead frame LF is made of copper (Cu) or copper (Cu) alloy. FIG. 14 shows a region in the lead frame LF, in which one semiconductor device PKG is manufactured.

Until a molding process is performed to form the sealing portion MR, the following manufacturing process (assembly process) is performed to the lead frame LF in a state where the main surfaces DPCa, DPHa, and DPLa of the die pads DPC, DPH, and DPL face upward.

Figure 10:
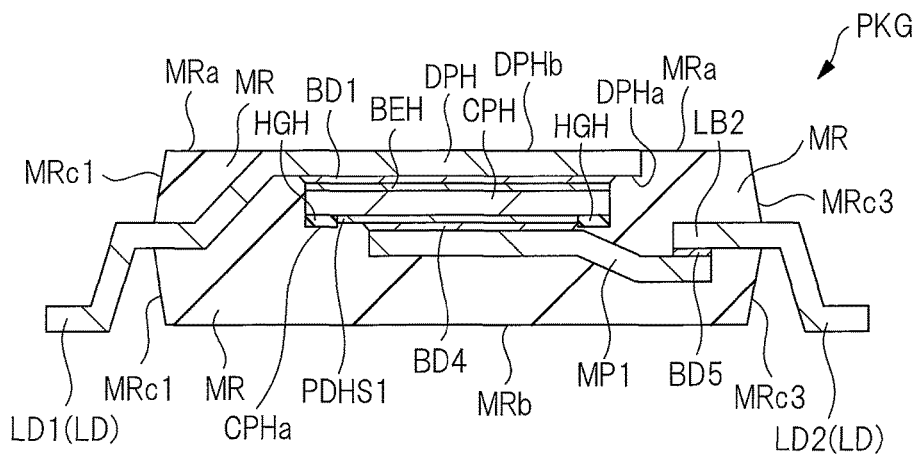
FIG. 10 is a cross-sectional view of the semiconductor device according to the embodiment.
Figure 12:
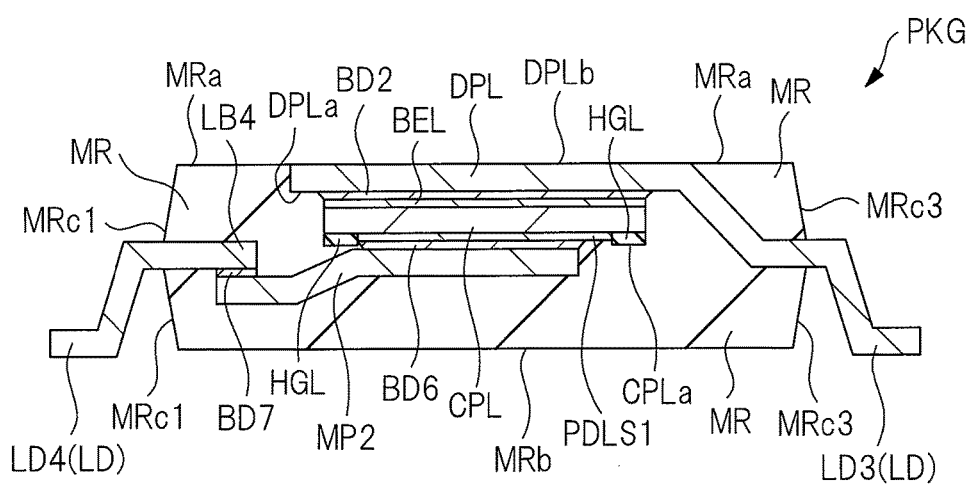
FIG. 12 is a cross-sectional view of the semiconductor device according to the embodiment.
Figure 13:
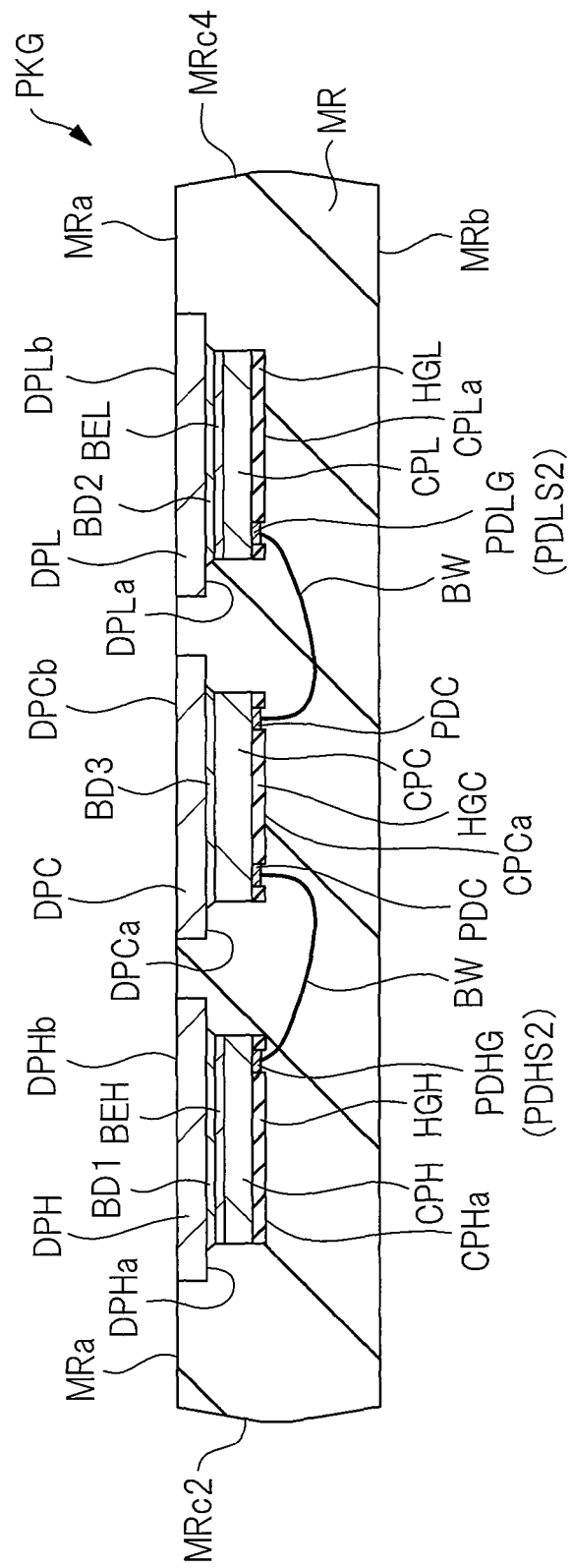
FIG. 13 is a cross-sectional view of the semiconductor device according to the embodiment.
Figure 15:
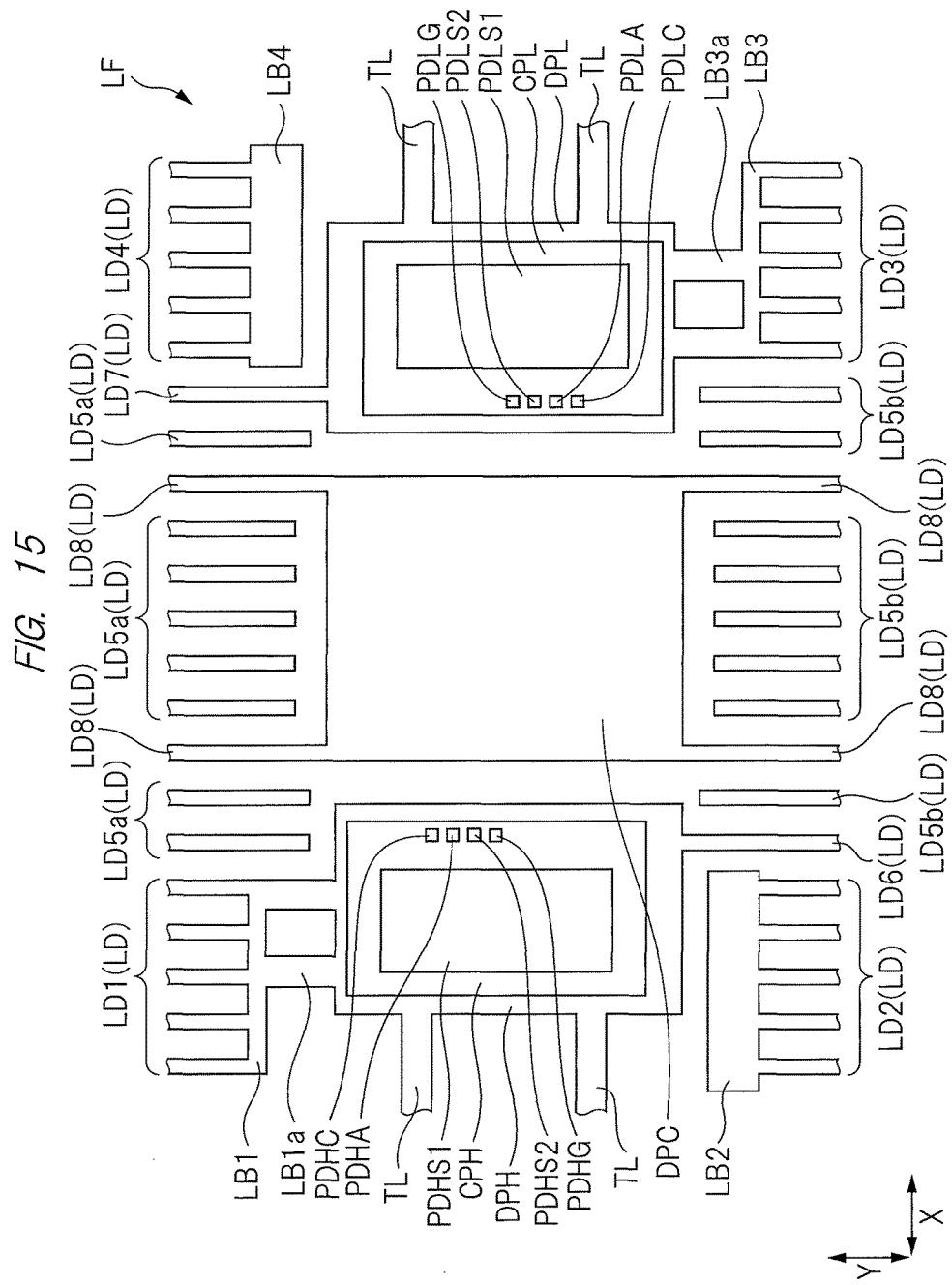
FIG. 15 is a plan view showing the semiconductor device in the manufacturing process continued from FIG. 14.

Next, as shown in FIG. 15, a die bonding process of the semiconductor chips CPH and CPL is performed such that the semiconductor chip CPH is mounted on the main surface DPHa of the die pad DPH of the lead frame LF via a conductive bonding material (die bonding material) and the semiconductor chip CPL is mounted on the main surface DPLa of the die pad DPL via a conductive bonding material (die bonding material). For example, silver paste or the like can be used as the conductive bonding material. At this time, the semiconductor chips CPH and CPL are mounted (disposed) such that the back surfaces of the semiconductor chips CPH and CPL face the main surfaces DPHa and DPLa of the die pads DPH and DPL. Thereafter, a process of curing the conductive bonding material (heat treatment) is performed to form the adhesive layers BD1 and BD2 made of the cured conductive bonding material. Accordingly, the semiconductor chips CPH and CPL are bonded and fixed to the die pads DPH and DPL by the adhesive layers BD1 and BD2. Although the adhesive layers BD1 and BD2 are not shown in FIG. 15, the adhesive layers BD1 and BD2 are shown in FIGS. 10, 12, and 13. Thereafter, a cleaning process using plasma (plasma cleaning process) may be performed. The pads PDHS1 and PDLS1 of the semiconductor chips CPH and CPL are cleaned by the plasma cleaning process, which facilitates the subsequent bonding of the metal plates MP1 and MP2.

Figure 16:
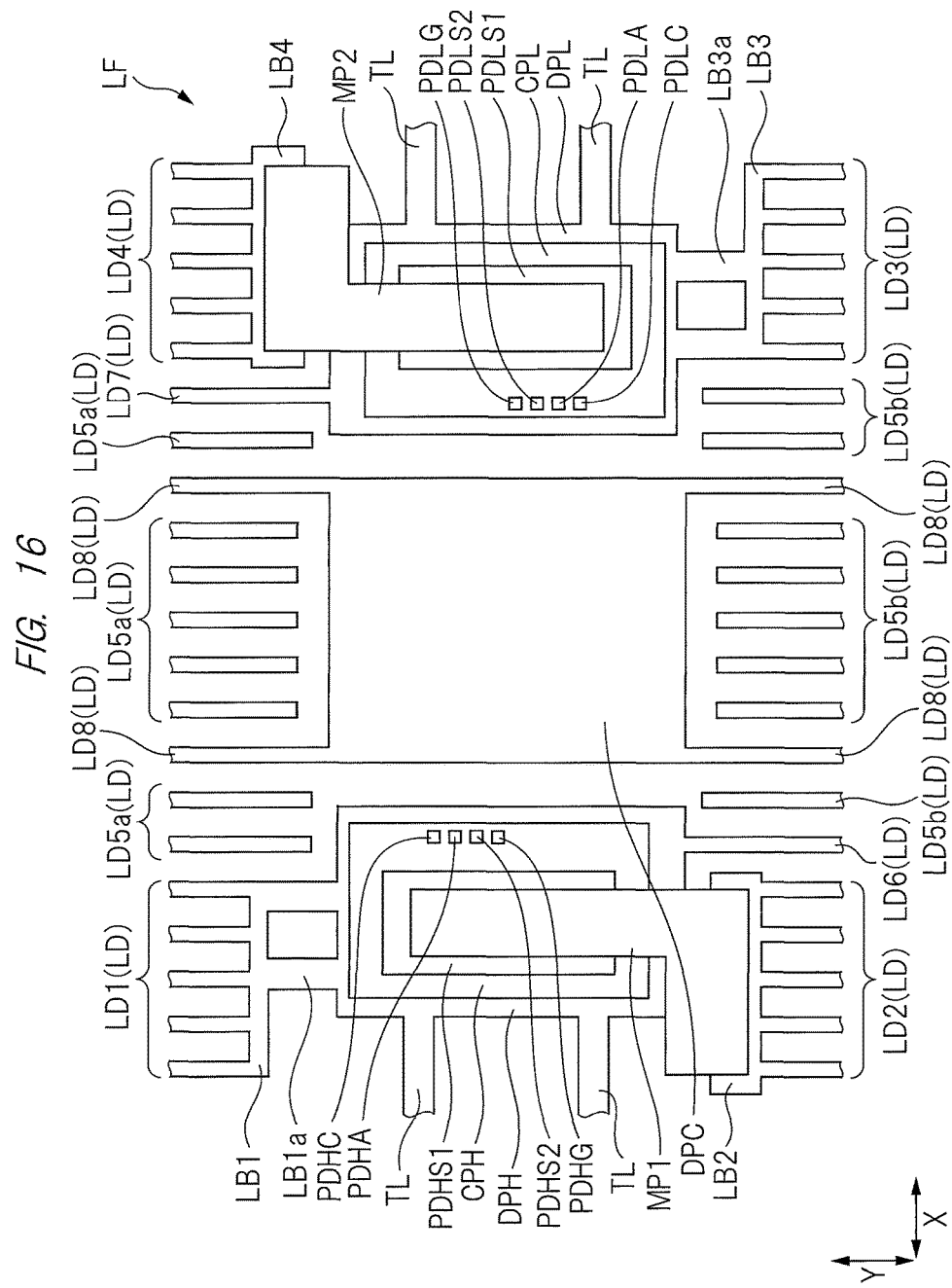
FIG. 16 is a plan view showing the semiconductor device in the manufacturing process continued from FIG. 15.

Next, as shown in FIG. 16, the source pad PDHS1 of the semiconductor chip CPH mounted on the die pad DPH and the lead connection portion LB2 of the lead frame LF are connected via the metal plate MP1, and the source pad PDLS1 of the semiconductor chip CPL mounted on the die pad DPL and the lead connection portion LB4 of the lead frame LF are connected via the metal plate MP2. Namely, the pad PDHS1 of the semiconductor chip CPH and the plurality of leads LD2 integrally connected to the lead connection portion LB2 are electrically connected via the metal plate MP1, and the pad PDLS1 of the semiconductor chip CPL and the plurality of leads LD4 integrally connected to the lead connection portion LB4 are electrically connected via the metal plate MP2.

The metal plate MP1 is bonded to the source pad PDHS1 of the semiconductor chip CPH via the conductive adhesive layer (bonding material) BD4, and is further bonded to the lead connection portion LB2 via the conductive adhesive layer (bonding material) BD5. Also, the metal plate MP2 is bonded to the source pad PDLS1 of the semiconductor chip CPL via the conductive adhesive layer (bonding material) BD6, and is further bonded to the lead connection portion LB4 via the conductive adhesive layer (bonding material) BD7. For example, silver paste, solder, or the like can be used as the adhesive layers BD4, BD5, BD6, and BD7. Although the adhesive layers BD4, BD5, BD6, and BD7 are not shown in FIG. 16, the adhesive layers BD4, BD5, BD6, and BD7 are shown in FIGS. 10 and 12.

Note that the case where the bonding process of the metal plates MP1 and MP2 is performed before mounting the semiconductor chip CPC on the die pad DPC is described here. The reason why the bonding process of the metal plates MP1 and MP2 is performed before mounting the die pad DPC is to prevent the semiconductor chip CPC from being exposed to the heat treatment (the process of curing the bonding materials (BD4, BD5, BD6, BD7) for the metal plates MP1 and MP2 or the like) accompanying the bonding process of the metal plates MP1 and MP2. Accordingly, it is possible to further improve the reliability of the semiconductor chip CPC.

Figure 11:
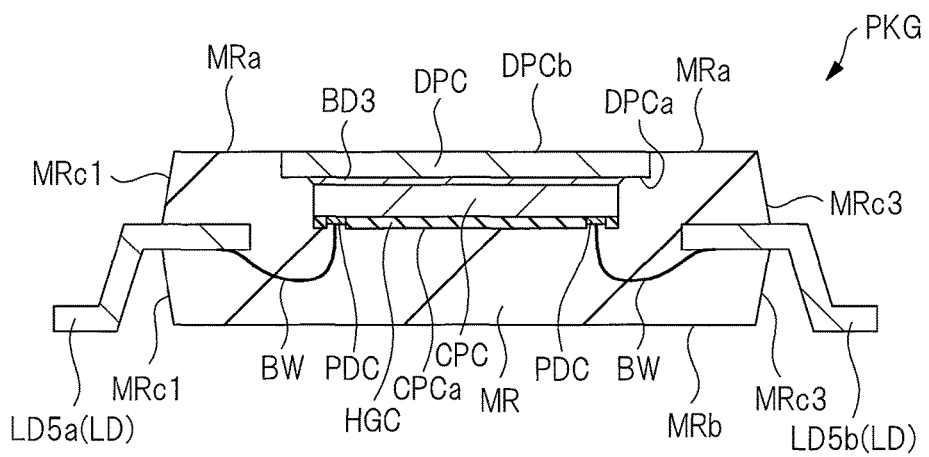
FIG. 11 is a cross-sectional view of the semiconductor device according to the embodiment.
Figure 17:
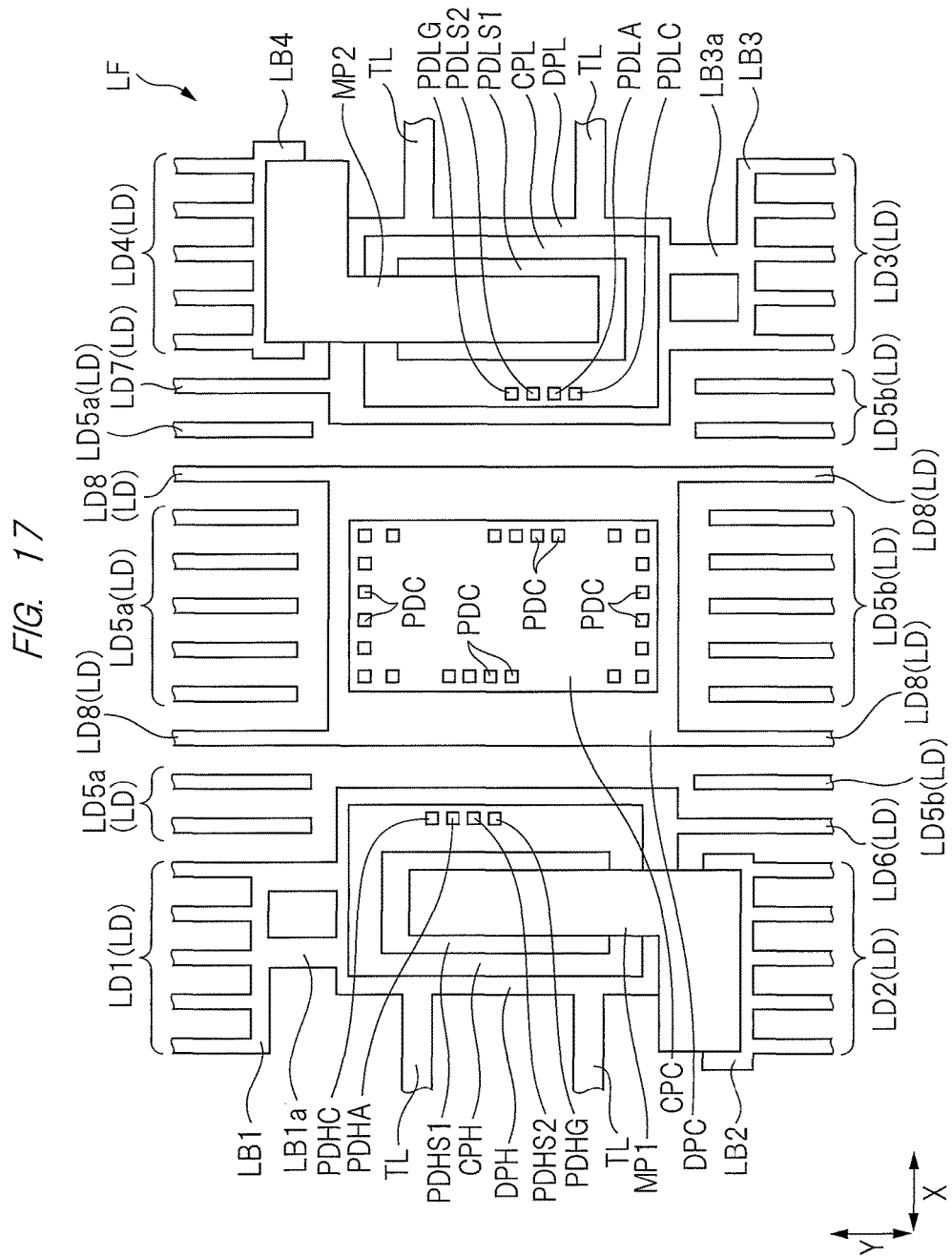
FIG. 17 is a plan view showing the semiconductor device in the manufacturing process continued from FIG. 16.

Next, as shown in FIG. 17, the die bonding process of the semiconductor chip CPC is performed such that the semiconductor chip CPC is mounted on the main surface DPCa of the die pad DPC of the lead frame LF via the bonding material (die bonding material). For example, silver paste, insulating paste, or the like can be used as the bonding material. At this time, the semiconductor chip CPC is mounted (disposed) such that the back surface of the semiconductor chip CPC faces the main surface DPCa of the die pad DPC. Thereafter, a process of curing the bonding material (heat treatment) is performed to form the adhesive layer BD3 made of the cured bonding material. Accordingly, the semiconductor chip CPC is bonded and fixed to the die pad DPC by the adhesive layer BD3. Although the adhesive layer BD3 is not shown in FIG. 17, the adhesive layer BD3 is shown in FIGS. 11 and 13. Thereafter, a plasma cleaning process may be performed. The pads of the semiconductor chips CPC, CPH, and CPL are cleaned by the plasma cleaning process, which facilitates the bonding of the wires BW.

Figure 18:
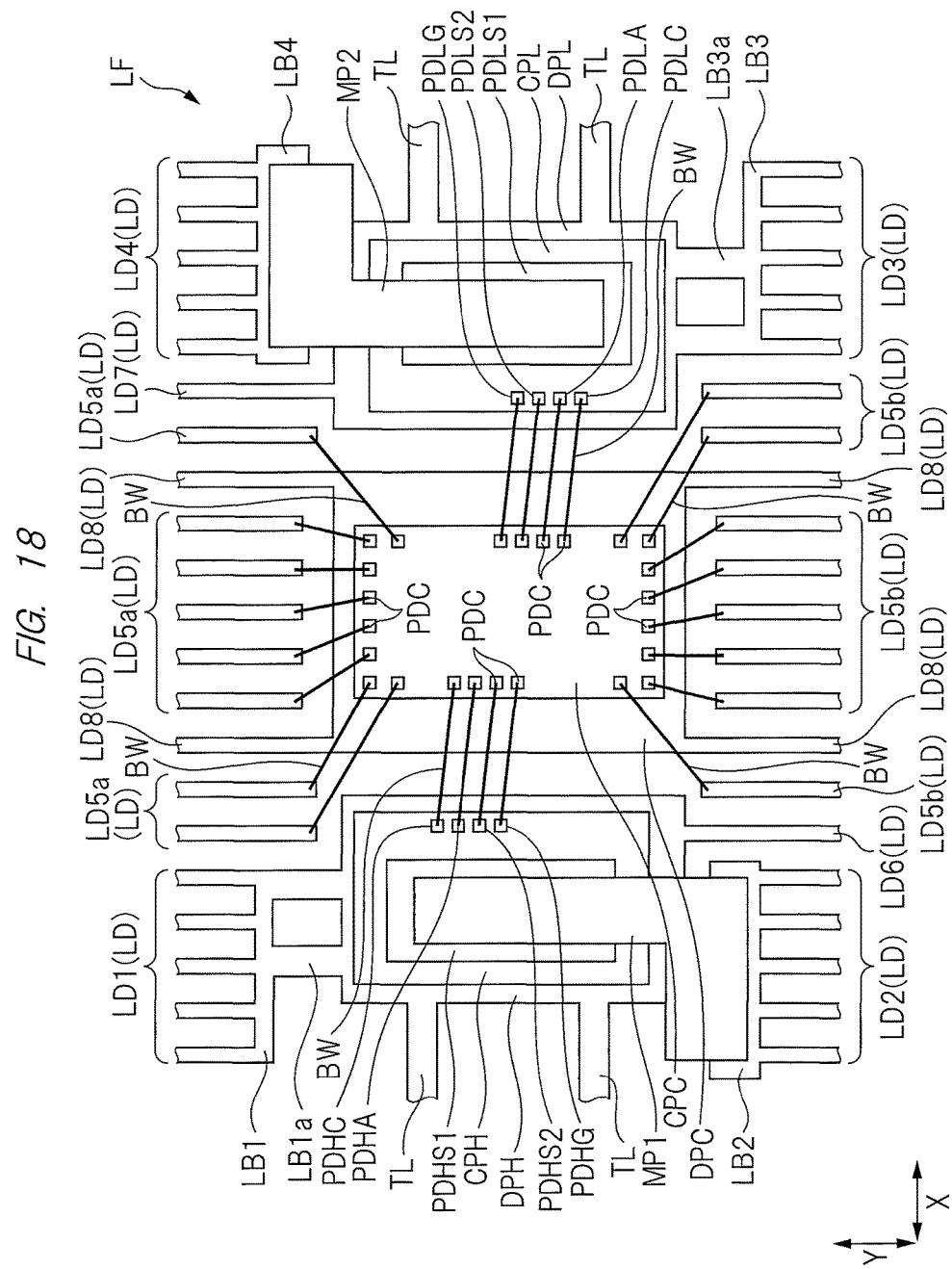
FIG. 18 is a plan view showing the semiconductor device in the manufacturing process continued from FIG. 17.
Figure 19:
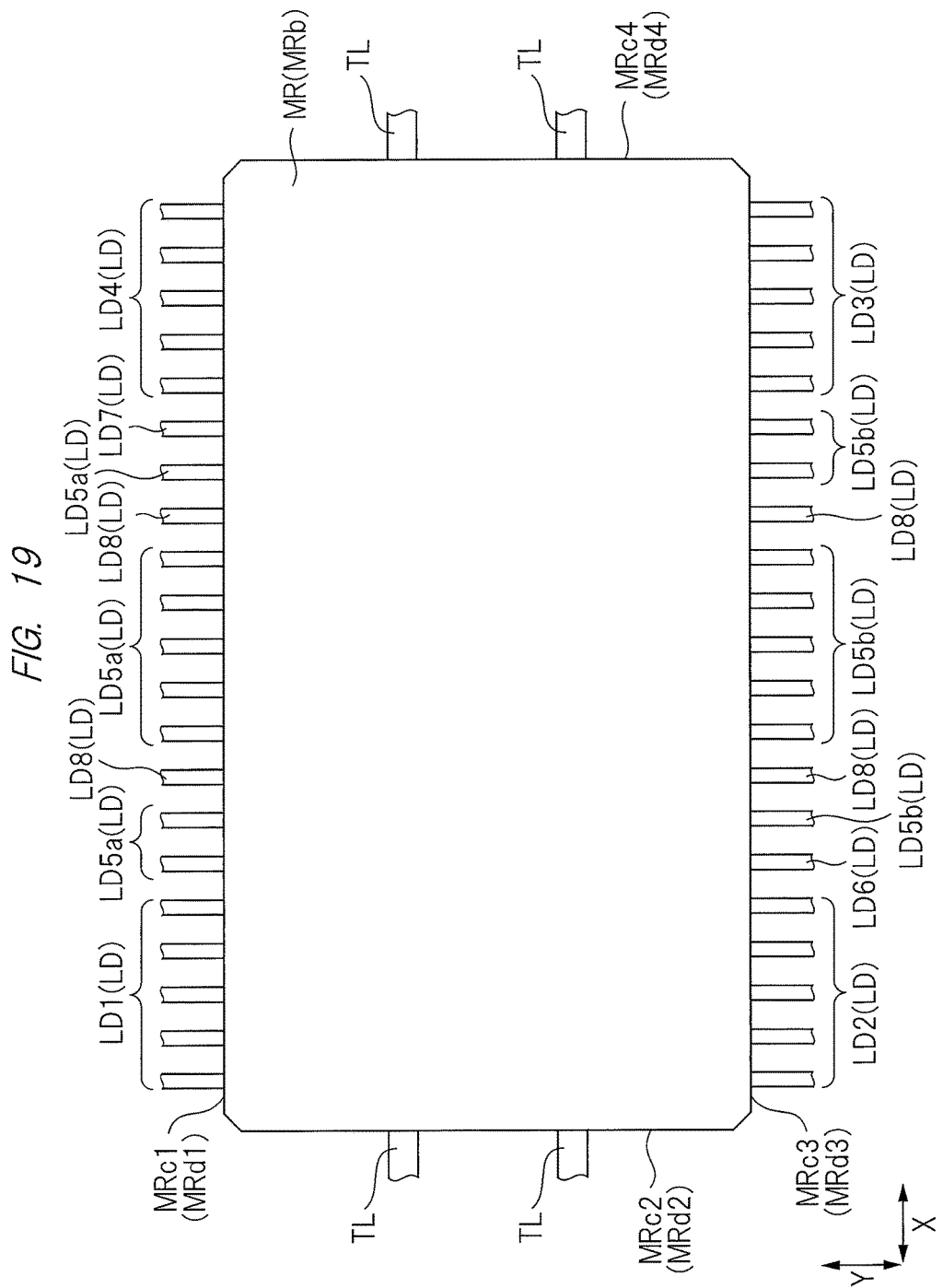
FIG. 19 is a plan view showing the semiconductor device in the manufacturing process continued from FIG. 18.

Next, as shown in FIG. 18, a wire bonding process is performed. Namely, the plurality of pads (PDHG, PDHS2, PDHA, PDHC) of the semiconductor chip CPH and the plurality of pads (PDC) of the semiconductor chip CPC are electrically connected via the wires BW, the plurality of pads (PDLG, PDLS2, PDLA, PDLC) of the semiconductor chip CPL and the plurality of pads (PDC) of the semiconductor chip CPC are electrically connected via the wires BW, and the plurality of pads (PDC) of the semiconductor chip CPC and the plurality of leads (LD5a, LD5b) of the lead frame LF are electrically connected via the wires BW.

It is also possible to use a plurality of types of wires made of different materials as the wires BW. In this case, for example, the plurality of pads (PDC) of the semiconductor chip CPC and the plurality of leads (LD5a, LD5b) of the lead frame LF are electrically connected via the wires BW made of copper (Cu). Further, the plurality of pads (PDHG, PDHS2, PDHA, PDHC) of the semiconductor chip CPH and the plurality of pads (PDC) of the semiconductor chip CPC are electrically connected via the wires BW made of gold (Au), and the plurality of pads (PDLG, PDLS2, PDLA, PDLC) of the semiconductor chip CPL and the plurality of pads (PDC) of the semiconductor chip CPC are electrically connected via the wires BW made of gold (Au).

Next, resin sealing is performed by a molding process (resin molding process) such that the semiconductor chips CPC, CPH, and CPL, the plurality of wires BW connected thereto, and the metal plates MP1 and MP2 are sealed by the sealing portion MR as shown in FIGS. 19 to 22. The sealing portion MR that seals the semiconductor chips CPC, CPH, and CPL, the die pads DPC, DPH, and DPL, the plurality of wires BW, the metal plates MP1 and MP2, the lead connection portions LB1, LB2, LB3, and LB4, and the inner lead portions of the plurality of leads LD is formed by the molding process. As also shown in FIGS. 20 to 22, the sealing portion MR is formed such that the respective back surfaces DPCb, DPHb, and DPLb of the die pads DPC, DPH, and DPL are exposed from the main surface MRa of the sealing portion MR in the molding process.

Note that the respective processes up to this molding process are performed in the state where the main surfaces DPCa, DPHa, and DPLa of the die pads DPC, DPH, and DPL face upward. Thus, the back surface MRb of the sealing portion MR faces upward at a stage when the sealing portion MR is formed by performing the molding process. However, when the manufactured semiconductor device PKG is mounted on a wiring board or the like, the semiconductor device PKG is mounted on the wiring board such that the back surface MRb of the sealing portion MR faces the wiring board.

Next, a plating layer (not shown) is formed on the outer lead portions of the leads LD exposed from the sealing portion MR as needed. Then, after the lead frame LF is flipped over (turned upside down) together with the sealing portion MR, the leads LD are cut at predetermined positions outside the sealing portion MR to be separated from the frame of the lead frame LF.

Next, the outer lead portions of the leads LD protruding from the sealing portion MR are subjected to bending process (lead processing, lead forming).

In this manner, the semiconductor device PKG shown in FIGS. 5 to 12 is manufactured.

<Mounting Example of Semiconductor Device PKG>

FIGS. 23 to 28 are plan views (FIGS. 23 and 24) and cross-sectional views (FIGS. 25 to 28) showing mounting examples of the semiconductor device PKG.

The semiconductor device PKG of the present embodiment is a semiconductor device constituting the inverter circuit INV, and one semiconductor device PKG can form one inverter circuit INV. In the case of controlling the above-described motor MOT which is the 12-phase BLDC motor, the twelve inverter circuits INV are necessary, and the twelve semiconductor devices PKG are thus necessary, so that the twelve semiconductor devices PKG are mounted on the common wiring board (mounting board, PCB (Printed Circuit Board)) PB1.

The above-described control board PB is constituted of the wiring board PB1 and the twelve semiconductor devices PKG mounted (arranged) on the wiring board PB1. Namely, the above-described control board PB corresponds to the wiring board PB1 on which the twelve semiconductor devices PKG are mounted (arranged). Thus, a planar shape of the wiring board PB1 becomes the planar shape of the control board PB. Since the planar shape of the control board PB is a circular shape, the planar shape of the wiring board PB1 is also a circular shape.

Figure 23:
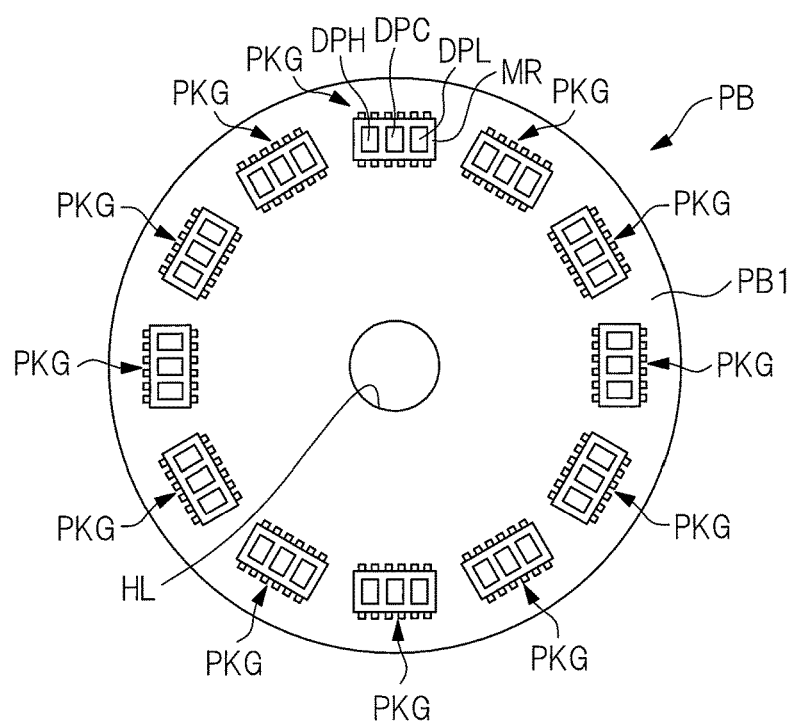
FIG. 23 is a plan view showing a mounting example of the semiconductor device according to the embodiment.
Figure 24:
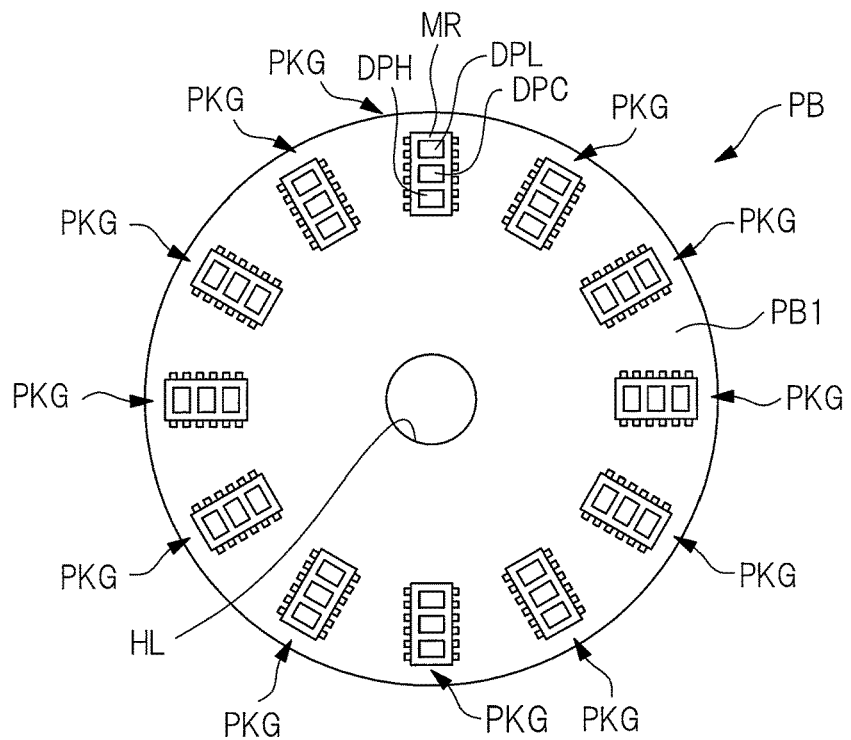
FIG. 24 is a plan view showing a mounting example of the semiconductor device according to the embodiment.

In both the case of FIG. 23 and the case of FIG. 24, the plurality of (twelve in this case) semiconductor devices PKG are arranged in an annular shape on a main surface (upper surface) PB1a of the circular wiring board PB1 along a peripheral edge portion (edge, outer circumference) of the wiring board PB1. Also, in both the case of FIG. 23 and the case of FIG. 24, a distance between each of the plurality of (twelve) semiconductor devices PKG arranged on the circular wiring board PB1 and a center of the circular wiring board PB1 is the same in a plan view.

In the case of FIG. 23, a lateral direction (Y direction, that is, the direction parallel to the side surfaces MRc2 and MRc4) of each of the twelve semiconductor devices PKG arranged on the wiring board PB1 is substantially parallel to a radius direction of the circle forming the planar shape of the wiring board PB1. Meanwhile, in the case of FIG. 24, a longitudinal direction (X direction, that is, the direction parallel to the side surfaces MRc1 and MRc3) of each of the twelve semiconductor devices PKG arranged on the wiring board PB1 is substantially parallel to the radius direction of the circle forming the planar shape of the wiring board PB1.

In addition, a hole (through hole, opening portion) HL configured to allow the above-described steering shaft SF (see FIG. 2) to penetrate is provided in the wiring board PB1. The hole HL is formed substantially at the center of the circular wiring board PB1 in a plan view and penetrates through the wiring board PB1. A planar shape of the hole HL substantially coincides with a cross-sectional shape of the steering shaft SF (cross-sectional shape substantially perpendicular to the axial direction of the steering shaft SF), and is, for example, a substantially circular shape. Since the hole HL is provided in the wiring board PB1, the wiring board PB1 (that is, the control board PB) on which the twelve semiconductor devices PKG are mounted can be disposed such that the above-described steering shaft SF penetrates through the hole HL of the wiring board PB1 (see FIG. 2).

Although the case where the plurality of (more specifically, twelve) semiconductor devices PKG are mounted on the wiring board PB1 whose planar shape is the circular shape and which is provided with the hole HL has been described here, there may be a case where the plurality of (more specifically, twelve) semiconductor devices PKG are mounted on the wiring board PB1 whose planar shape is the circular shape but which is not provided with the hole HL as another embodiment.

Figure 25:
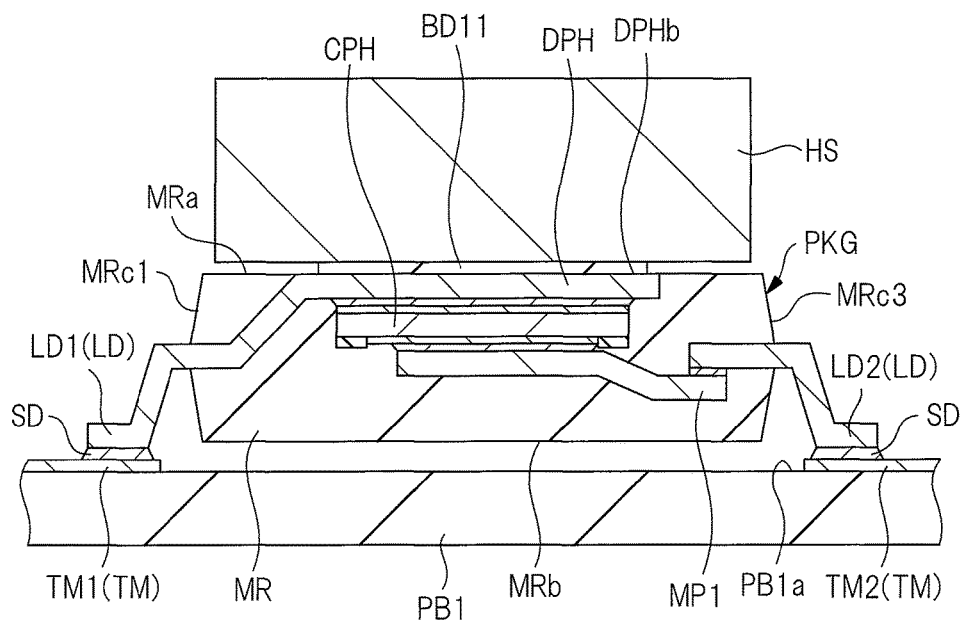
FIG. 25 is a cross-sectional view showing a mounting example of the semiconductor device according to the embodiment.
Figure 26:
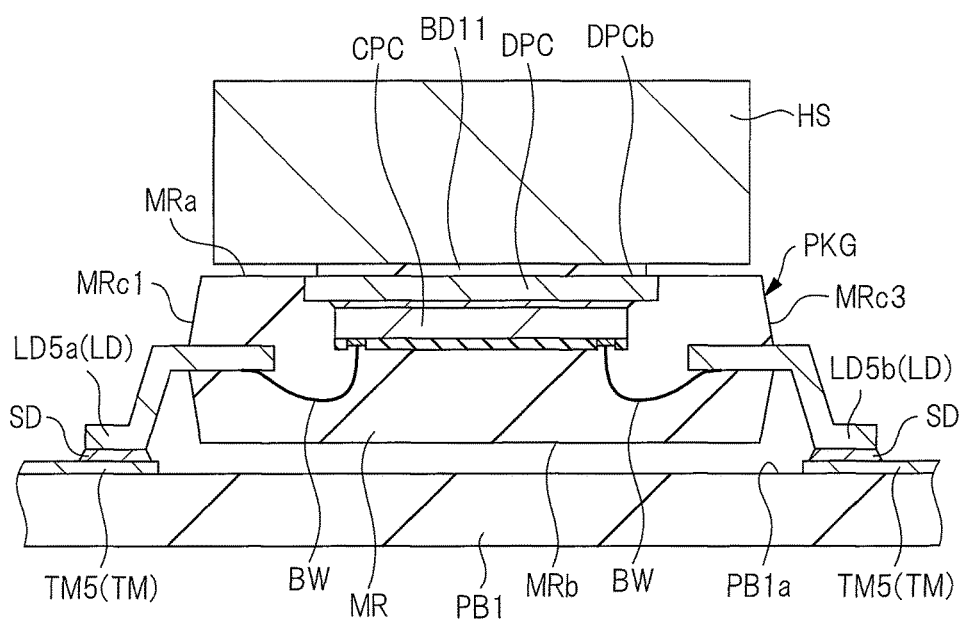
FIG. 26 is a cross-sectional view showing a mounting example of the semiconductor device according to the embodiment.
Figure 27:
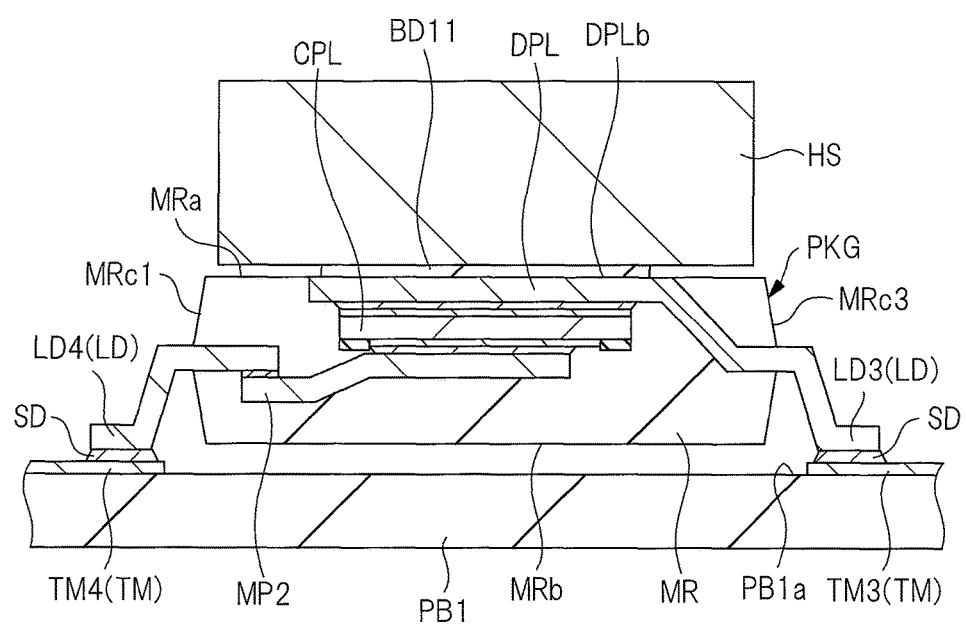
FIG. 27 is a cross-sectional view showing a mounting example of the semiconductor device according to the embodiment.
Figure 28:
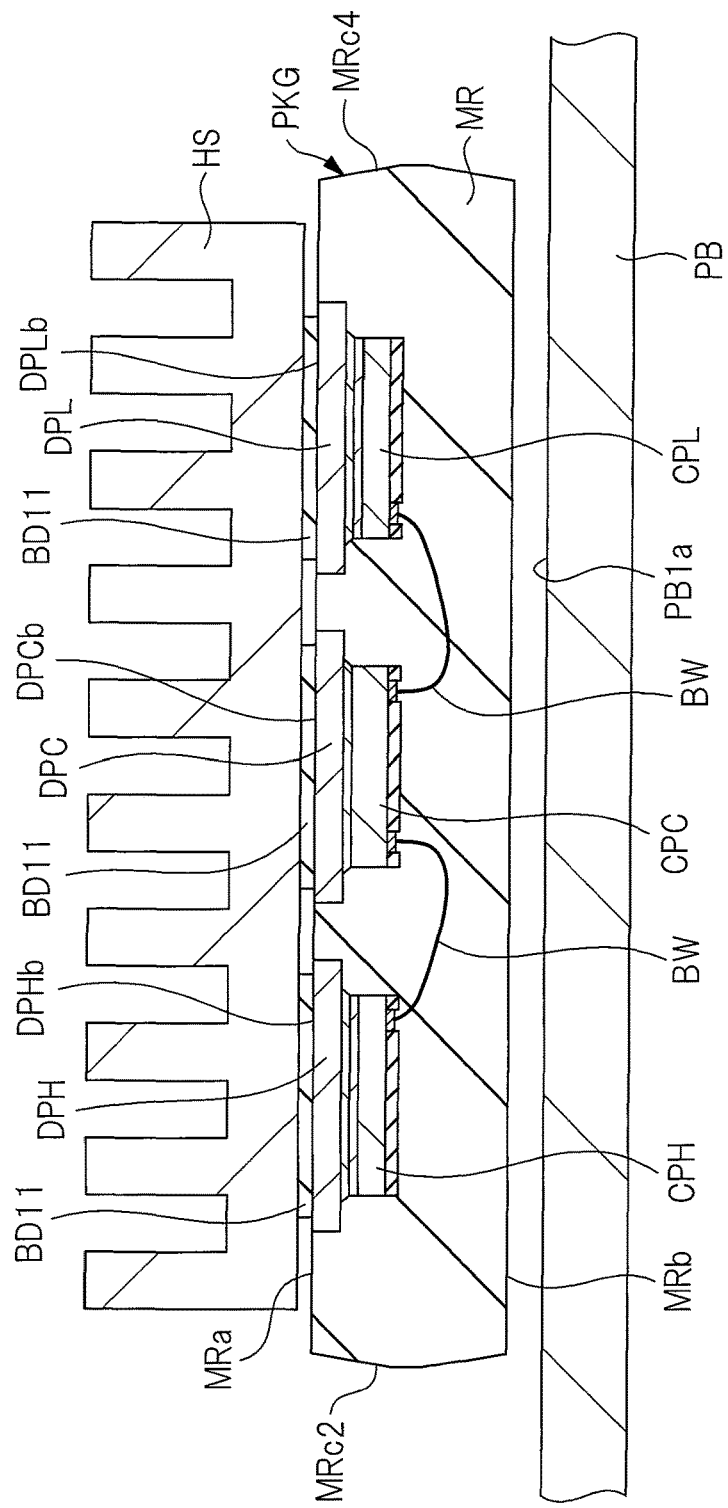
FIG. 28 is a cross-sectional view showing a mounting example of the semiconductor device according to the embodiment.

FIGS. 25 to 28 correspond to the cross-sectional views showing the principal part of FIG. 23 and the cross-sectional views showing the principal part of FIG. 24. The cross-sectional view of FIG. 25 is a cross-sectional view at a position corresponding to FIG. 10 (that is, the position corresponding to the line A1-A1 in FIGS. 5 to 7), and the cross-sectional view of FIG. 26 is a cross-sectional view at a position corresponding to FIG. 11 (that is, the position corresponding to the line A2-A2 in FIGS. 5 to 7). In addition, the cross-sectional view of FIG. 27 is a cross-sectional view at a position corresponding to FIG. 12 (that is, the position corresponding to the line A3-A3 in FIGS. 5 to 7), and the cross-sectional view of FIG. 28 is a cross-sectional view at a position corresponding to FIG. 13 (that is, the position corresponding to the line A4-A4 in FIGS. 5 to 7).

As shown in FIGS. 25 to 28, each of the semiconductor devices PKG is mounted on the main surface PB1a of the wiring board PB1 such that the back surface MRb of the sealing portion MR faces the main surface (upper surface) PB1a of the wiring board PB1. Further, the plurality of leads LD of each of the semiconductor devices PKG are bonded and fixed to a plurality of terminals (electrodes) TM formed on the main surface PB1a of the wiring board PB1 via the conductive bonding material SD, for example, solder. Namely, the plurality of leads LD of each of the semiconductor devices PKG are electrically connected to the plurality of terminals TM formed on the main surface PB1a of the wiring board PB1 via the conductive bonding materials SD.

The plurality of terminals TM provided in the wiring board PB1 include a terminal TM1 to which the potential (power supply potential) VIN is supplied via a wiring or the like of the wiring board PB1 and a terminal TM4 to which the ground potential GND is supplied via a wiring or the like of the wiring board PB1. In addition, the plurality of terminals TE provided in the wiring board PB1 include a terminal TM5 electrically connected to the control circuit CT via a wiring or the like of the wiring board PB1 and terminals TM2 and TM3 connected to the motor MOT (coil CL) via a wiring or the like of the wiring board PB1. Each of the terminals TM of the wiring board PB1 is electrically connected to the wiring of the wiring board PB1. In addition, the terminals TM2 and TM3 of the wiring board PB1 are electrically connected to each other via the wiring or the like of the wiring board PB1. A wiring board having a wiring layer (wiring) formed only on one main surface of the wiring board, a wiring board having wiring layers (wiring) formed on both main surfaces positioned to be opposite to each other of the wiring board, a wiring board having wiring layers (wiring) formed on both main surfaces of the wiring board and inside the wiring board (so-called multilayer wiring board), or the like can be used as the wiring board PB1.

In each of the semiconductor devices PKG, the lead LD1 is bonded and electrically connected to the terminal TM1 via the conductive bonding material (solder) SD, the lead LD2 is bonded and electrically connected to the terminal TM2 via the conductive bonding material (solder) SD, and the lead LD3 is bonded and electrically connected to the terminal TM3 via the conductive bonding material (solder) SD. In addition, in each of the semiconductor devices PKG, the lead LD4 is bonded and electrically connected to the terminal TM4 via the conductive bonding material (solder) SD, and the leads LD5a and LD5b are bonded and electrically connected to the terminal TM5 via the conductive bonding material (solder) SD.

Accordingly, the potential (power supply potential) VIN is supplied from the terminal TM1 of the wiring board PB1 to the lead LD1 of the semiconductor device PKG via the wiring or the like of the wiring board PB1, and further, the potential VIN is supplied from the lead LD1 to the back-surface electrode BEH of the semiconductor chip CPH in the semiconductor device PKG via the die pad DPH in the semiconductor device PKG. Also, the ground potential GND is supplied from the terminal TM4 of the wiring board PB1 to the lead LD4 of the semiconductor device PKG via the wiring or the like of the wiring board PB1, and further, the ground potential GND is supplied from the lead LD4 to the source pad PDLS1 of the semiconductor chip CPL in the semiconductor device PKG via the metal plate MP2 in the semiconductor device PKG. In addition, the control circuit CLC formed in the semiconductor chip CPC in the semiconductor device PKG is configured to exchange signals with the control circuit CT through the pads PDC of the semiconductor chip CPC in the semiconductor device PKG, the wires BW in the semiconductor device PKG, the leads LD5a and LD5b of the semiconductor device PKG, the terminal TM5 of the wiring board PB1, and the wiring or the like of the wiring board PB1.

In addition, the lead LD2 and the lead LD3 of the semiconductor device PKG are electrically connected to the terminals TM2 and TM3 via the conductive bonding material (solder) SD, respectively, and the terminal TM2 and the terminal TM3 of the wiring board PB1 are electrically connected to each other via the wiring or the like of the wiring board PB1. Namely, the terminal TM2 and the terminal TM3 of the wiring board PB1 are electrically connected to each other via the conductor (specifically, the wiring or the like of the wiring board PB1) outside the semiconductor device PKG. Thus, in the state where the semiconductor device PKG is mounted on the wiring board PB1, the lead LD2 and the lead LD3 of the semiconductor device PKG are electrically connected to each other via the terminals TM2 and TM3 and the wiring of the wiring board PB1, and further are electrically connected to the motor (coil CL) through the wiring or the like of the wiring board PB1.

In addition, in the case of FIGS. 25 to 28, a heat sink (housing) HS is disposed (mounted) on the main surface MRa of the sealing portion MR of each of the semiconductor devices PKG mounted on the wiring board PB1 via an insulating adhesive BD11. For example, thermally conductive grease having an insulating property or the like can be used as the insulating adhesive BD11. For example, a fin-type heat sink or the like can be used as the heat sink HS.

The back surfaces DPCb, DPHb, and DPLb of the die pads DPC, DPH, and DPL are exposed from the main surface MRa of the sealing portion MR in the semiconductor device PKG, and the back surfaces DPCb, DPHb, and DPLb of the die pads DPC, DPH, and DPL are bonded to the heat sink HS via the insulating adhesive BD11. Namely, the insulating adhesive BD11 is interposed between the back surfaces DPCb, DPHb, and DPLb of the die pads DPC, DPH, and DPL of the semiconductor device PKG and the heat sink HS. Accordingly, the heat generated in the semiconductor chips CPC, CPH, and CPL in the semiconductor device PKG can be dissipated to the heat sink HS through the die pads DPC, DPH, and DPL and the adhesive BD11 (thermally conductive grease).

In addition, since the insulating adhesive BD11 is used to attach the heat sink HS to the semiconductor device PKG, the heat sink HS having a large heat capacity (large volume) can be attached to the semiconductor device PKG while preventing the die pads DPC, DPH, and DPL of the semiconductor device PKG from being electrically connected to each other via the adhesive BD11 and the heat sink HS.

<Major Characteristics and Effects>

The semiconductor device PKG of the present embodiment includes the semiconductor chip CPH (first semiconductor chip) including the power MOSFET 1 (first field effect transistor) for a high-side switch and the semiconductor chip CPL (second semiconductor chip) including the power MOSFET 2 (second field effect transistor) for a low-side switch. The semiconductor device PKG further includes the semiconductor chip CPC (third semiconductor chip) including the control circuit CLC that controls each of the semiconductor chips CPH and CPL. The semiconductor device PKG further includes the die pad DPH (first chip mounting portion) on which the semiconductor chip CPH is mounted, the die pad DPL (second chip mounting portion) on which the semiconductor chip CPL is mounted, and the die pad DPC (third chip mounting portion) on which the semiconductor chip CPC is mounted.

The semiconductor chip CPH has the front surface (first main surface) and the back surface (first back surface) opposite thereto, the semiconductor chip CPL has the front surface (second main surface) and the back surface (second back surface) opposite thereto, and the semiconductor chip CPC has the front surface (third main surface) and the back surface (third back surface) opposite thereto. The semiconductor chip CPH includes the uppermost protective film HGH (first protective film), the pad PDHS1 (first source electrode) exposed from the uppermost protective film HGH and electrically connected to the source (first source) of the power MOSFET 1, and the back-surface electrode BEH (first drain electrode) formed on the back surface of the semiconductor chip CPH and electrically connected to the drain (first drain) of the power MOSFET 1. The semiconductor chip CPL includes the uppermost protective film HGL (second protective film), the pad PDLS1 (second source electrode) exposed from the uppermost protective film HGL and electrically connected to the source (second source) of the power MOSFET 2, and the back-surface electrode BEL (second drain electrode) formed on the back surface of the semiconductor chip CPL and electrically connected to the drain (second drain) of the power MOSFET 2.

The semiconductor device PKG further includes the lead LD1 (first lead) electrically connected to the back-surface electrode BEH of the semiconductor chip CPH and the lead LD2 (second lead) electrically connected to the pad PDHS1 of the semiconductor chip CPH via the metal plate MP1 (first conductive connection member). The semiconductor device PKG further includes the lead LD3 (third lead) electrically connected to the back-surface electrode BEL of the semiconductor chip CPL and the lead LD4 (fourth lead) electrically connected to the pad PDLS1 of the semiconductor chip CPL via the metal plate MP2 (second conductive connection member). The semiconductor device PKG further includes the sealing portion MR (sealing body), and the sealing portion MR seals the semiconductor chips CPH, CPL, and CPC, the metal plates MP1 and MP2, at least a part of the die pad DPH, at least a part of the die pad DPL, at least a part of the die pad DPC, a part of the leads LD1, a part of the leads LD2, a part of the leads LD3 and a part of the leads LD4. In a plan view, the sealing portion MR has the side MRd1 (first side) extending along the X direction (first direction), and the side MRd3 (second side) extending along the X direction and positioned to be opposite to the side MRd1.

One of the major characteristics of the present embodiment is that the semiconductor chip CPC is disposed between the sides MRd1 and MRd3 of the sealing portion MR and between the semiconductor chip CPH and the semiconductor chip CPL in a plan view.

Another one of the major characteristics of the present embodiment is that the lead LD1 and the lead LD4 intersect with the side MRd1 of the sealing portion MR, and the lead LD2 and the lead LD3 intersect with the side MRd3 of the sealing portion MR. Namely, the lead LD1 and the lead LD4 are disposed on the side closer to the side surface MRc1 of the sealing portion MR, and the lead LD2 and the lead LD3 are disposed on the side closer to the side surface MRc3 of the sealing portion MR. In the semiconductor device PKG, a current flows from the lead LD1 to the lead LD2 via the power MOSFET 1 of the semiconductor chip CPH, and a current flows from the lead LD3 to the lead LD4 via the power MOSFET 2 of the semiconductor chip CPL.

Hereinafter, a reason why such characteristics are adopted will be described.

Since both the semiconductor chips CPH and CPL are the semiconductor chips in which the field effect transistor for switching (power transistor) is formed, the amount of heat generation of the semiconductor chips CPH and CPL is large. Thus, the semiconductor chips CPH and CPL can serve as heat sources. A case where the semiconductor chip CPH and the semiconductor chip CPL are disposed to be adjacent to each other without disposing the semiconductor chip CPC between the semiconductor chip CPH and the semiconductor chip CPL unlike the present embodiment is also conceivable. This case corresponds to, for example, a case where the semiconductor chip CPH, the semiconductor chip CPL, and the semiconductor chip CPC are disposed in order in the X direction, a case where the semiconductor chip CPC, the semiconductor chip CPH, and the semiconductor chip CPL are disposed in order in the X direction, or the like. However, if the semiconductor chip CPH and the semiconductor chip CPL having the large heat generation amount are disposed to be adjacent to each other, thermal interference between the semiconductor chip CPH and the semiconductor chip CPL occurs, and there is a fear that the reliability of the semiconductor device may be deteriorated. This is because, if the semiconductor chip CPH and the semiconductor chip CPL having the large heat generation amount are disposed to be adjacent to each other, the semiconductor chip CPL is likely to be affected by the heat generation of the semiconductor chip CPH, and the semiconductor chip CPH is likely to be affected by the heat generation of the semiconductor chip CPL.

Thus, in the semiconductor device PKG of the present embodiment, the semiconductor chip CPC is disposed between the semiconductor chip CPH and the semiconductor chip CPL in a plan view. Since it is possible to increase the distance (interval) between the semiconductor chip CPH and the semiconductor chip CPL by disposing the semiconductor chip CPC between the semiconductor chip CPH and the semiconductor chip CPL, it is possible to suppress or prevent the thermal interference between the semiconductor chip CPH and the semiconductor chip CPL. Namely, since the semiconductor chip CPC is disposed between the semiconductor chip CPH and the semiconductor chip CPL, the semiconductor chip CPL is less likely to be affected by the heat generation of the semiconductor chip CPH, and the semiconductor chip CPH is less likely to be affected by the heat generation of the semiconductor chip CPL. Accordingly, it is possible to improve the reliability of the semiconductor device PKG. Therefore, it is possible to improve the performance of the semiconductor device PKG.

In addition, since the semiconductor chip CPC is disposed between the semiconductor chip CPH and the semiconductor chip CPL in a plan view, the distance between the semiconductor chip CPH and the semiconductor chip CPL can be increased while suppressing the size of the semiconductor device PKG, and thus, it is possible to achieve both the suppression of the thermal interference between the semiconductor chip CPH and the semiconductor chip CPL and the reduction in size of the semiconductor device PKG.

Incidentally, since the power MOSFET 1 for a high-side switch and the power MOSFET 2 for a low-side switch need to be connected in series, it is necessary to electrically connect the pad PDHS1 (pad electrode for the source of the power MOSFET 1) of the semiconductor chip CPH and the back-surface electrode BEL (back-surface electrode for the drain of the power MOSFET 2) of the semiconductor chip CPL.

When the semiconductor chip CPH and the semiconductor chip CPL are adjacent to each other unlike the present embodiment, the die pad DPL on which the semiconductor chip CPL is mounted and the pad PDHS1 of the semiconductor chip CPH can be connected to each other by a metal plate, and it is possible to electrically connect the pad PDHS1 of the semiconductor chip CPH and the back-surface electrode BEL of the semiconductor chip CPL via the metal plate. Thus, when the semiconductor chip CPH and the semiconductor chip CPL are adjacent to each other unlike the present embodiment, it is easy to connect the pad PDHS1 of the semiconductor chip CPH and the back-surface electrode BEL of the semiconductor chip CPL via a conductor in the semiconductor device PKG (that is, in the sealing portion MR).

In the present embodiment, however, the semiconductor chip CPC is disposed between the semiconductor chip CPH and the semiconductor chip CPL in order to prevent the thermal interference between the semiconductor chip CPH and the semiconductor chip CPL as described above. In this case, it is difficult to connect the die pad DPL on which the semiconductor chip CPL is mounted and the pad PDHS1 of the semiconductor chip CPH by the metal plate because the semiconductor chip CPC present between the semiconductor chips CPH and CPL becomes an obstacle. Thus, when the semiconductor chip CPC is disposed between the semiconductor chip CPH and the semiconductor chip CPL like the present embodiment, it is difficult to connect the pad PDHS1 of the semiconductor chip CPH and the back-surface electrode BEL of the semiconductor chip CPL via a conductor in the semiconductor device PKG (that is, in the sealing portion MR).

Thus, in the present embodiment, the lead LD2 (second lead) electrically connected to the pad PDHS1 of the semiconductor chip CPH (via the metal plate MP1) and the lead LD3 (third lead) electrically connected to the back-surface electrode BEL of the semiconductor chip CPL are provided in the semiconductor device PKG. Accordingly, the lead LD2 and the lead LD3 of the semiconductor device PKG can be electrically connected to each other outside the semiconductor device PKG, and it is thus possible to electrically connect the pad PDHS1 (pad electrode for the source of the power MOSFET 1) of the semiconductor chip CPH and the back-surface electrode BEL (back-surface electrode for the drain of the power MOSFET 2) of the semiconductor chip CPL. For example, when the semiconductor device PKG is mounted on the wiring board PB1, the lead LD2 and the lead LD3 of the semiconductor device PKG can be electrically connected via the wiring or the like of the wiring board PB1.

Thus, in the present embodiment, the lead LD1 electrically connected to the back-surface electrode BEH of the semiconductor chip CPH, the lead LD2 electrically connected to the pad PDHS1 of the semiconductor chip CPH, the lead LD3 electrically connected to the back-surface electrode BEL of the semiconductor chip CPL, and the lead LD4 electrically connected to the pad PDLS1 of the semiconductor chip CPL are provided in the semiconductor device PKG. Accordingly, in the state where the semiconductor device PKG is mounted on the wiring board PB1, it is possible to supply the potential (power supply potential) VIN to the lead LD1 and to supply the reference potential (ground potential GND) lower than the potential (power supply potential) VIN to the lead LD4, and it is further possible to connect the power MOSFET 1 included in the semiconductor chip CPH and the power MOSFET 2 included in the semiconductor chip CPL in series between the potential VIN and the reference potential (GND). As a result, it is possible to make the power MOSFET 1 included in the semiconductor chip CPH function as a high-side switch and the power MOSFET 2 included in the semiconductor chip CPL function as a low-side switch.

In the present embodiment, however, these leads LD1, LD2, LD3, and LD4 are not simply provided in the semiconductor device PKG, but positions to dispose these leads LD1, LD2, LD3, and LD4 are devised.

Namely, in the present embodiment, the lead LD1 and the lead LD4 are disposed on the side closer to the side surface MRc1 of the sealing portion MR, and the lead LD2 and the lead LD3 are disposed on the side closer to the side surface MRc3 of the sealing portion MR in a plan view. In other words, the lead LD2 and the lead LD3 are disposed on the same side (here, on the side closer to the side surface MRc3) of the sealing portion MR, and the lead LD1 and the lead LD4 are disposed on the side opposite thereto (here, on the side closer to the side surface MRc1). In short, the lead LD1 and the lead LD4 intersect with the side MRd1 of the sealing portion MR, and the lead LD2 and the lead LD3 intersect with the side MRd3 of the sealing portion MR in a plan view.

In the present embodiment, the lead LD2 and the lead LD3 are disposed on the same side (here, on the side closer to the side surface MRc3) of the sealing portion MR, and thus the lead LD2 and the lead LD3 of the semiconductor device PKG can be easily electrically connected to each other outside the semiconductor device PKG. Namely, when the semiconductor device PKG is mounted on the wiring board PB1, the lead LD2 and the lead LD3 of the semiconductor device PKG can be easily electrically connected to each other via the wiring or the like of the wiring board PB1.

A case where the lead LD1 and the lead LD3 are disposed on the side closer to the side surface MRc1 of the sealing portion MR and the lead LD2 and the lead LD4 are disposed on the side closer to the side surface MRc3 of the sealing portion MR unlike the present embodiment is assumed. In this case, it is necessary to electrically connect the lead LD2 disposed on the side closer to the side surface MRc3 of the sealing portion MR and the lead LD3 disposed on the side closer to the side surface MRc1 of the sealing portion MR by the use of the wiring of the wiring board PB1 on which the semiconductor device is mounted. However, when attempting to electrically connect the leads disposed on the opposite side surfaces of the sealing portion MR to each other by the use of the wiring of the wiring board PB1, it is difficult to efficiently dispose the wiring on the wiring board PB1, and the restriction on the wiring design becomes severe. As a result, it is difficult to efficiently arrange not only the wiring to connect the lead LD2 and the lead LD3 but also the other wirings in the wiring board PB1. This may cause the decrease in the degree of freedom in the wiring design of the wiring board PB1, and may lead to the increase in the planar size of the wiring board PB1.

Namely, when comparing the case where both the lead LD2 and the lead LD3 are disposed on the same side surface (MRc3) of the sealing portion MR and the case where the lead LD2 is disposed on one of the two opposite side surfaces (MRc1, MRc3) of the sealing portion MR and the lead LD3 is disposed on the other side surface, the lead LD2 and the lead LD3 can be more easily electrically connected to each other by the use of the wiring of the wiring board PB1 on which the semiconductor device PKG is mounted in the former case.

Thus, by disposing the lead LD2 and the lead LD3 on the same side (here, on the side closer to the side surface MRc3) of the sealing portion MR like the present embodiment, the lead LD2 and the lead LD3 of the semiconductor device PKG can be easily electrically connected to each other via the wiring of the wiring board (PB1) when the semiconductor device PKG is mounted on the wiring board (PB1). Accordingly, it is possible to efficiently dispose the wiring on the wiring board (PB1) on which the semiconductor device PKG is mounted, and the restriction on the wiring design of the wiring board (PB1) is reduced. As a result, not only the wiring to connect the lead LD2 and the lead LD3 but also the other wirings can be efficiently disposed on the wiring board (PB1) on which the semiconductor device PKG is mounted, and it is possible to freely lay out the wiring. Therefore, the degree of freedom in wiring design of the wiring board (PB1) on which the semiconductor device PKG is mounted is increased. In addition, it is possible to suppress the planar size (plane area) of the wiring board (PB1) on which the semiconductor device PKG is mounted. Further, the usability of the semiconductor device PKG is improved. Note that the increase of the degree of freedom in wiring design of the wiring board (PB1) on which the semiconductor device PKG is mounted, which is achieved by devising the semiconductor device PKG, leads to improvement of the performance of the electronic device (control board PB) in which the semiconductor device PKG is mounted on the wiring board (PB1), and thus can be regarded as the improvement of the performance of the semiconductor device PKG.

For the reasons described above, in the semiconductor device PKG of the present embodiment, the semiconductor chip CPC is disposed between the semiconductor chip CPH and the semiconductor chip CPL, the lead LD2 and the lead LD3 are disposed on the same side (here, on the side closer to the side surface MRc3) of the sealing portion MR, and the lead LD1 and the lead LD4 are disposed on the side opposite thereto (here, on the side closer to the side surface MRc1) of the sealing portion MR in a plan view.

In the present embodiment, the lead LD2 and the lead LD3 are not connected through the conductor in the semiconductor device PKG, and the lead LD2 and the lead LD3 are electrically connected outside the semiconductor device PKG. Specifically, the lead LD2 and the lead LD3 of the semiconductor device PKG are electrically connected via the wiring or the like of the wiring board PB1 on which the semiconductor device PKG is mounted.

Next, other characteristics of the present embodiment will be described below.

In the semiconductor device PKG of the present embodiment, the semiconductor chip CPH, the semiconductor chip CPC, and the semiconductor chip CPL are arranged in the X direction in a plan view. Namely, the semiconductor chip CPH, the semiconductor chip CPC, and the semiconductor chip CPL are disposed on a virtual straight line extending in the X direction in a plan view. Accordingly, it is possible to efficiently suppress the dimension of the semiconductor device PKG (sealing portion MR) in the Y direction, and it is thus possible to achieve the reduction in size of the semiconductor device PKG.

Also, in the semiconductor device PKG of the present embodiment, the lead LD1 and the lead LD2 are positioned to be opposite to each other with the semiconductor chip CPH interposed therebetween, and the lead LD3 and the lead LD4 are positioned to be opposite to each other with the semiconductor chip CPL interposed therebetween, in a plan view. Accordingly, it is possible to efficiently dispose the leads LD1, LD2, LD3, and LD4, and it is thus possible to achieve the reduction in size of the semiconductor device PKG.

Further, in the semiconductor device PKG of the present embodiment, the lead LD1 is integrally connected to the die pad DPH, and the lead LD3 is integrally connected to the die pad DPL. Accordingly, it is possible to electrically connect the lead LD1 and the back-surface electrode BEH of the semiconductor chip CPH mounted on the die pad DPH through the die pad DPH, and it is possible to electrically connect the lead LD3 and the back-surface electrode BEL of the semiconductor chip CPL mounted on the die pad DPL through the die pad DPL. Therefore, it is possible to connect the lead LD1 and the back-surface electrode BEH of the semiconductor chip CPH with low resistance and possible to connect the lead LD3 and the back-surface electrode BEL of the semiconductor chip CPL with low resistance, so that it is possible to reduce the conduction loss. As a result, it is possible to improve the performance of the semiconductor device.

In addition, the semiconductor device PKG of the present embodiment further includes the lead LD6 (fifth lead) integrally connected to the die pad DPH and disposed on the side closer to the side surface MRc3 of the sealing portion MR and the lead LD7 (sixth lead) integrally connected to the die pad DPH and disposed on the side closer to the side surface MRc1 of the sealing portion MR. The lead LD6 intersects with the side MRd3 of the sealing portion MR in a plan view and the lead LD7 intersects with the side MRd1 of the sealing portion MR in a plan view.

In this case, the leads LD1 and LD6 are integrally connected to the die pad DPH, the lead LD1 is disposed on the side closer to the side surface MRc1 of the sealing portion MR, and the lead LD6 is disposed on the side closer to the side surface MRc3 of the sealing portion MR. Accordingly, it is possible to stably support the die pad DPH on the frame of the lead frame via the leads LD1 and LD6 at the time of manufacturing the semiconductor device PKG. In addition, the leads LD3 and LD7 are integrally connected to the die pad DPL, the lead LD3 is disposed on the side closer to the side surface MRc3 of the sealing portion MR, and the lead LD7 is disposed on the side closer to the side surface MRc1 of the sealing portion MR. Accordingly, it is possible to stably support the die pad DPL on the frame of the lead frame via the leads LD3 and LD7 at the time of manufacturing the semiconductor device PKG. Thus, the manufacturing process of the semiconductor device PKG using the lead frame is facilitated.

Of the leads LD1 and LD6 integrally connected to the die pad DPH, the lead LD1 functions as a path of a current flowing via the semiconductor chip CPH (power MOSFET 1), but the lead LD6 does not function as a path of a current flowing via the semiconductor chip CPH (power MOSFET 1). In addition, of the leads LD3 and LD7 integrally connected to the die pad DPL, the lead LD3 functions as a path of a current flowing via the semiconductor chip CPL (power MOSFET 2), but the lead LD7 does not function as a path of a current flowing via the semiconductor chip CPL (power MOSFET 2). This is because the semiconductor device PKG of the present embodiment is configured such that the current flows from the lead LD1 to the lead LD2 via the power MOSFET 1 of the semiconductor chip CPH and the current flows from the lead LD3 to the lead LD4 via the power MOSFET 2 of the semiconductor chip CPL. Thus, the lead LD3 integrally connected to the die pad DPL needs to be electrically connected to the lead LD2 via the wiring of the wiring board PB1, but the lead LD7 integrally connected to the die pad DPL does not need to be electrically connected to the lead LD2 via the wiring of the wiring board PB1. Therefore, the pad PDHS1 of the semiconductor chip CPH and the back-surface electrode BEL of the semiconductor chip CPL can be electrically connected to each other by electrically connecting the lead LD2 and the lead LD3 through the wiring of the wiring board PB1 in the state where the semiconductor device PKG is mounted on the wiring board PB1, and it is not necessary to devise the wirings for the leads LD6 and LD7 of the semiconductor device PKG. Accordingly, even if the leads LD6 and LD7 are provided in the semiconductor device PKG, there is no adverse effect on the wiring design of the wiring board PB1.

In addition, in the semiconductor device PKG of the present embodiment, the metal plate MP1 is used as the conductive connection member that electrically connects the pad PDHS1 of the semiconductor chip CPH and the lead LD2, and the metal plate MP2 is used as the conductive connection member that electrically connects the pad PDLS1 of the semiconductor chip CPL and the lead LD4. Accordingly, it is possible to reduce the conduction loss and to improve the performance of the semiconductor device.

Also, the semiconductor device PKG of the present embodiment includes a plurality of the leads LD1 electrically connected to the back-surface electrode BEH of the semiconductor chip CPH, a plurality of the leads LD2 electrically connected to the pad PDHS1 of the semiconductor chip CPH, a plurality of the leads LD3 electrically connected to the back-surface electrode BEL of the semiconductor chip CPL, and a plurality of the leads LD4 electrically connected to the pad PDLS1 of the semiconductor chip CPL. Then, in the semiconductor device PKG, the plurality of leads LD1 are connected to each other and intersect with the side MRd1 of the sealing portion MR in a plan view, and the plurality of leads LD2 are connected to each other and intersect with the side MRd3 of the sealing portion MR in a plan view. In addition, in the semiconductor device PKG, the plurality of leads LD3 are connected to each other and intersect with the side MRd3 of the sealing portion MR in a plan view, and the plurality of leads LD4 are connected to each other and intersect with the side MRd1 of the sealing portion MR in a plan view. Since the plurality of leads LD1 are connected to each other, the plurality of leads LD2 are connected to each other, the plurality of leads LD3 are connected to each other, and the plurality of leads LD4 are connected to each other, it is possible to reduce the conduction loss. Accordingly, it is possible to improve the performance of the semiconductor device.

In addition, the semiconductor device PKG of the present embodiment includes the plurality of leads LD5$a$ and LD5$b$ electrically connected to the plurality of pads PDC of the semiconductor chip CPC via the plurality of wires BW, respectively. In a plan view, each of the plurality of leads LD5$a$ (seventh lead) intersects with the side MRd1 of the sealing portion MR, and each of the plurality of leads LD5$b$ (eighth lead) intersects with the side MRd3 of the sealing portion MR. Namely, the plurality of leads LD5$a$ are disposed on the side closer to the side surface MRc1 of the sealing portion MR, and the plurality of leads LD5$b$ are disposed on the side closer to the side surface MRc3 of the sealing portion MR. The plurality of leads LD5$a$ are disposed between the leads LD1 and LD4 on the side surface MRc1 (side MRd1), and the plurality of leads LD5$b$ are disposed between the lead LD2 and the lead LD3 on the side surface MRc3 (side MRd3). Accordingly, it is possible to efficiently dispose the leads LD5$a$ and LD5$b$ electrically connected to the pads PDC of the semiconductor chip CPC while suppressing the dimension (in particular, the dimension in the X direction) of the sealing portion MR. Thus, it is possible to achieve both the increase of the total number of the leads LD5$a$ and LD5$b$ and the reduction in size of the semiconductor device PKG.

In addition, in the semiconductor device PKG of the present embodiment, the back surface DPHb of the die pad DPH, the back surface DPLb of the die pad DPL, and the back surface DPCb of the die pad DPC are exposed from the main surface MRa of the sealing portion MR. Accordingly, it is possible to dissipate heat from the die pads DPH, DPC, and DPL exposed on the main surface MRa of the sealing portion MR to the outside of the semiconductor device PKG, and it is not necessary to connect the die pads DPH, DPC, and DPL of the semiconductor device PKG to the terminals of the wiring board PB1. Thus, it is not necessary to provide the terminals for connection with the die pads DPH, DPC, and DPL of the semiconductor device PKG in the wiring board PB1 configured to mount the semiconductor device PKG, and it is possible to freely arrange (lay out) the wiring of the wiring board PB1 as needed in a region overlapping with the sealing portion MR in a plan view at the time of mounting the semiconductor device PKG. Therefore, it is possible to further increase the degree of freedom in wiring design of the wiring board PB1 on which the semiconductor device PKG is mounted.

In addition, by adopting the SOP type package structure having a rectangular planar shape as the semiconductor device PKG of the present embodiment, the plurality of (here, twelve) semiconductor devices PKG can be more efficiently arranged on the wiring board PB1 whose planar shape is the circular shape, compared with a case of adopting a QFP (Quad Flat Package) or a QFN (Quad Flat Non-leaded package) whose planar shape is a substantially square shape. Accordingly, it is possible to achieve reduction in size of the wiring board PB1 (control board PB) on which the semiconductor device PKG is mounted.

Next, the connection among the semiconductor chips CPH, CPC, and CPL via the wires BW and the positions to dispose the temperature sensing diodes in the semiconductor chips CPH and CPL will be described with reference to FIGS. 29 and 30.

Figure 29:
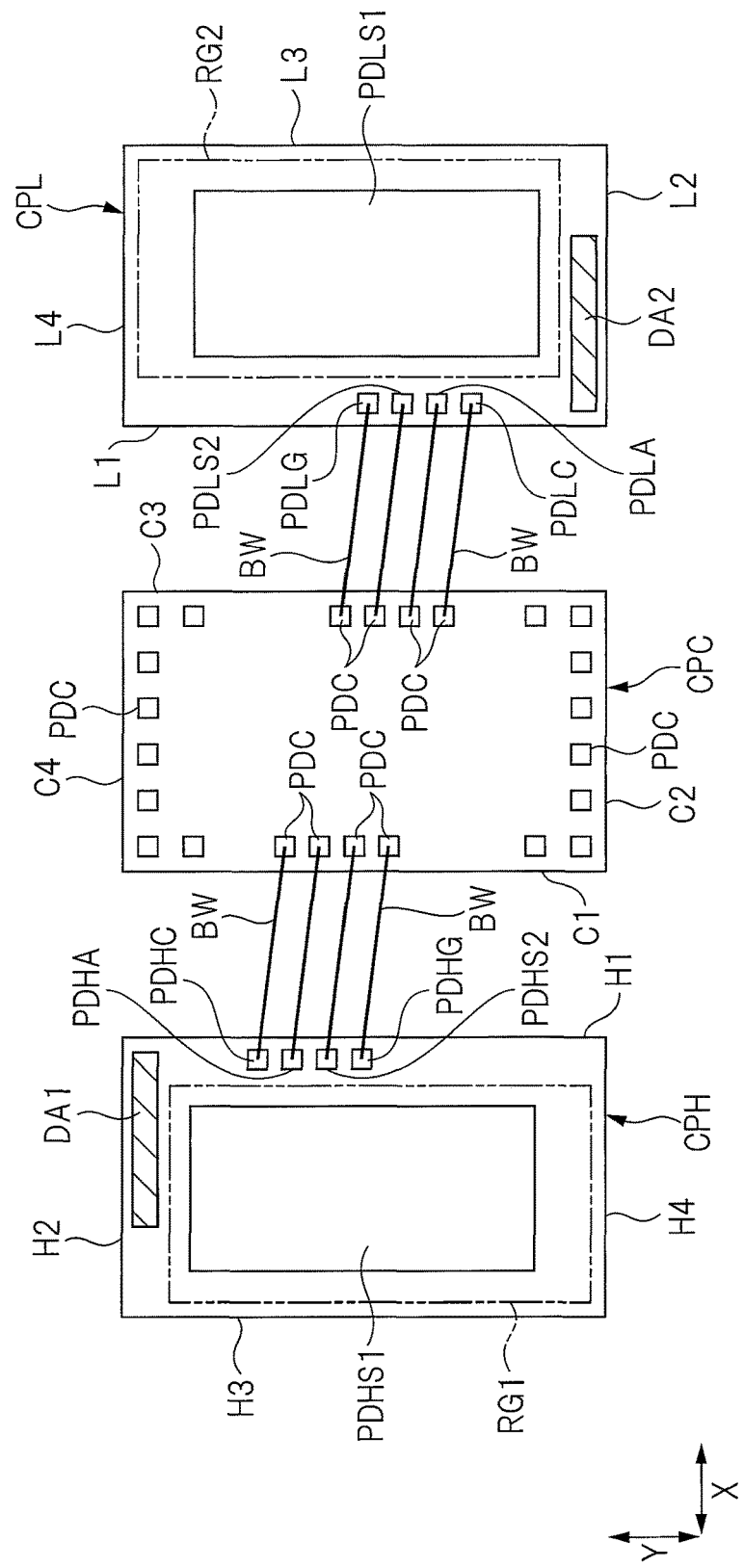
FIG. 29 is a perspective plan view of the semiconductor device according to the embodiment.
Figure 30:
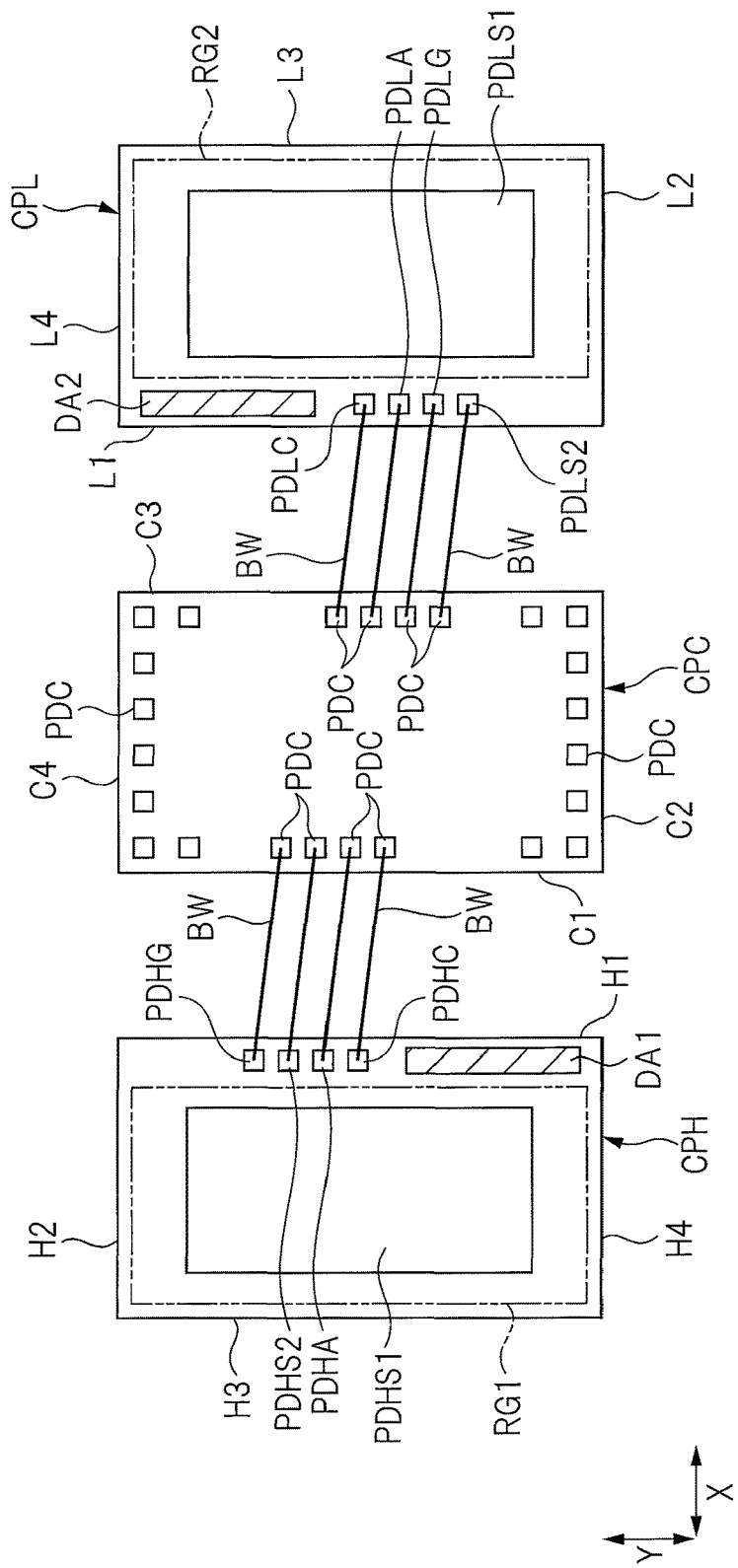
FIG. 30 is a perspective plan view of the semiconductor device according to the embodiment.

FIGS. 29 and 30 are perspective plan views of the semiconductor device PKG, and are perspective illustrations of the semiconductor chips CPH, CPC, and CPL in the semiconductor device PKG. Note that FIGS. 29 and 30 show the semiconductor chips CPH, CPC, and CPL and the wires BW for connection among the semiconductor chips CPH, CPC and CPL and do not show the other parts for simplification of the drawings. Namely, in FIGS. 29 and 30, illustrations of the die pad DPH, DPC, and DPL and the leads LD are omitted, and illustrations of the wires BW for connection between the pads PDC of the semiconductor chip CPC and the leads LD5a and LD5b of the plurality of wires shown in FIG. 7 are omitted.

First, the connection among the semiconductor chips CPH, CPC and CPL via the wires BW in the semiconductor device PKG will be described with reference to FIG. 7 and FIGS. 29 and 30.

The semiconductor chip CPH has the side H1, a side H3 positioned to be opposite to the side H1, a side H2 intersecting with the sides H1 and H3, and a side H4 intersecting with the sides H1 and H3 and positioned to be opposite to the side H2 in a plan view. The planar shape of the semiconductor chip CPH is the rectangular shape having these four sides H1, H2, H3, and H4. Of the sides H1, H2, H3, and H4 of the semiconductor chip CPH, the side H1 faces the semiconductor chip CPC.

Also, the semiconductor chip CPL has the side L1, a side L3 positioned to be opposite to the side L1, a side L2 intersecting with the sides L1 and L3, and a side L4 intersecting with the sides L1 and L3 and positioned to be opposite to the side L2 in a plan view. The planar shape of the semiconductor chip CPL is the rectangular shape having these four sides L1, L2, L3, and L4. Of the sides L1, L2, L3, and L4 of the semiconductor chip CPL, the side L1 faces the semiconductor chip CPC.

In addition, the semiconductor chip CPC has a side C1, a side C3 positioned to be opposite to the side C1, a side C2 intersecting with the sides C1 and C3, and a side C4 intersecting with the sides C1 and C3 and positioned to be opposite to the side C2 in a plan view. The planar shape of the semiconductor chip CPC is the rectangular shape having these four sides C1, C2, C3, and C4. Of the sides C1, C2, C3, and C4 of the semiconductor chip CPC, the side C1 faces the semiconductor chip CPH and the side C3 faces the semiconductor chip CPL.

In the semiconductor device PKG, the sides H1 and H3 of the semiconductor chip CPH, the sides C1 and C3 of the semiconductor chip CPC, and the sides L1 and L3 of the semiconductor chip CPL are substantially parallel to the Y direction, and the sides H2 and H4 of the semiconductor chip CPH, the sides C2 and C4 of the semiconductor chip CPC, and the sides L2 and L4 of the semiconductor chip CPL are substantially parallel to the X direction. Note that the side H2 of the semiconductor chip CPH, the side C4 of the semiconductor chip CPC, and the side L4 of the semiconductor chip CPL are positioned on the side closer to the side surface MRc1 of the sealing portion MR, and the side H4 of the semiconductor chip CPH, the side C2 of the semiconductor chip CPC, and the side L2 of the semiconductor chip CPL are positioned on the side closer to the side surface MRc3 of the sealing portion MR.

As also shown in FIG. 7, the plurality of pads PDC provided in the semiconductor chip CPC include the pads PDC electrically connected to the leads LD5a and the leads LD5b via the wires BW, the pads PDC electrically connected to the pads of the semiconductor chip CPH via the wires BW, and the pads PDC electrically connected to the pads of the semiconductor chip CPL via the wires BW.

As also shown in FIGS. 7, 29 and 30, of the plurality of pads provided in the semiconductor chip CPH, the plurality of pads (here, the pads PDHG, PDHS2, PDHA, and PDHC) electrically connected to the pads PDC of the semiconductor chip CPC via the wires BW are disposed on the main surface of the semiconductor chip CPH along the side H1 facing the semiconductor chip CPC. In addition, of the plurality of pads provided in the semiconductor chip CPL, the plurality of pads (here, the pads PDLG, PDLS2, PDLA, and PDLC) electrically connected to the pads PDC of the semiconductor chip CPC via the wires BW are disposed on the main surface of the semiconductor chip CPL along the side L1 facing the semiconductor chip CPC. In addition, of the plurality of pads PDC provided in the semiconductor chip CPC, the plurality of pads PDC electrically connected to the pads (here, the pads PDHG, PDHS2, PDHA, and PDHC) of the semiconductor chip CPH via the wires BW are disposed on the main surface of the semiconductor chip CPC along the side C1 facing the semiconductor chip CPH. In addition, of the plurality of pads PDC provided in the semiconductor chip CPC, the plurality of pads PDC electrically connected to the pads (here, the pads PDLG, PDLS2, PDLA, and PDLC) of the semiconductor chip CPL via the wires BW are disposed on the main surface of the semiconductor chip CPC along the side C3 facing the semiconductor chip CPL.

Accordingly, the plurality of pads of the semiconductor chip CPH and the plurality of pads PDC of the semiconductor chip CPC are easily connected via the respective wires BW, and the plurality of pads of the semiconductor chip CPL and the plurality of pads PDC of the semiconductor chip CPC are easily connected via the respective wires BW. Further, it is possible to shorten the length of the wires BW. Thus, the wire bonding process in the manufacturing process of the semiconductor device PKG is facilitated. In addition, since it is possible to shorten the wires BW, the parasitic inductance can be reduced. Accordingly, it is possible to improve the performance of the semiconductor device.

Next, the positions to dispose the temperature sensing diodes DA1 and DA2 in the semiconductor chips CPH and CPL will be described with reference to FIGS. 29 and 30.

As shown in FIGS. 29 and 30, the semiconductor chip CPH includes the temperature sensing diode DA1, and the semiconductor chip CPL includes the temperature sensing diode DA2. Each of the diodes DA1 and DA2 is formed of a PN junction diode. However, the positions to dispose the diodes DA1 and DA2 in the semiconductor chips CPH and CPL are different between the case of FIG. 29 and the case of FIG. 30.

Namely, in the case of FIG. 29, the diode DA1 is disposed along the side H2 in a plan view in the semiconductor chip CPH, and the diode DA2 is disposed along the side L2 in a plan view in the semiconductor chip CPL. Note that the side H2 of the semiconductor chip CPH is a side that intersects with the side H1 facing the semiconductor chip CPC in the semiconductor chip CPH, and the side L2 of the semiconductor chip CPL is a side that intersects with the side L1 facing the semiconductor chip CPC in the semiconductor chip CPL.

On the other hand, in the case of FIG. 30, the diode DA1 is disposed along the side H1 facing the semiconductor chip CPC in a plan view in the semiconductor chip CPH, and the diode DA2 is disposed along the side L1 facing the semiconductor chip CPC in a plan view in the semiconductor chip CPL.

An advantage of the case of FIG. 29 regarding the positions to dispose the diodes DA1 and DA2 is that it is possible to improve accuracy of temperature sensing of the diodes DA1 and DA2. This will be described below.

The diode DA1 of the semiconductor chip CPH is provided to sense the temperature of the semiconductor chip CPH. In order to improve the accuracy of temperature sensing of the diode DA1, it is effective to prevent the diode DA1 of the semiconductor chip CPH from being affected by the heat generation of the semiconductor chip CPL. For this purpose, it is effective to dispose the diode DA1 in the semiconductor chip CPH so as to be separated from the semiconductor chip CPL. In addition, the diode DA2 of the semiconductor chip CPL is provided to sense the temperature of the semiconductor chip CPL. In order to improve the accuracy of temperature sensing of the diode DA2, it is effective to prevent the diode DA2 of the semiconductor chip CPL from being affected by the heat generation of the semiconductor chip CPH. For this purpose, it is effective to dispose the diode DA2 in the semiconductor chip CPL so as to be separated from the semiconductor chip CPH.

In the case of FIG. 29, it is possible to increase the distance (interval) between the diode DA1 of the semiconductor chip CPH and the diode DA2 of the semiconductor chip CPL in the semiconductor device PKG. From a different point of view, in the case of FIG. 29, it is possible to increase the distance (interval) from the diode DA1 of the semiconductor chip CPH to the semiconductor chip CPL in the semiconductor device PKG, and it is possible to increase the distance (interval) from the diode DA2 of the semiconductor chip CPL to the semiconductor chip CPH. Thus, since the diode DA1 of the semiconductor chip CPH is less likely to be affected by the heat generation of the semiconductor chip CPL, and the diode DA2 of the semiconductor chip CPL is less likely to be affected by the heat generation of the semiconductor chip CPH, it is possible to improve the accuracy of temperature sensing of the diodes DA1 and DA2. Accordingly, it is possible to improve the performance of the semiconductor device.

An advantage of the case of FIG. 30 regarding the positions to dispose the diodes DA1 and DA2 is that it is possible to increase the area of a region where the transistor element for the power MOSFET is formed in each of the semiconductor chips CPH and CPL, so that it is possible to reduce the ON-resistance of the power MOSFET formed in each of the semiconductor chips CPH and CPL. This will be described below.

In FIGS. 29 and 30, a region surrounded by the two-dot chain line in the semiconductor chip CPH is the transistor formation region RG1, and a region surrounded by the two-dot chain line in the semiconductor chip CPL is the transistor formation region RG2. Here, the transistor formation region RG1 corresponds to a region (planar region) where a plurality of unit transistor cells (here, trench gate MISFETs) for the power MOSFET 1 are formed in the semiconductor chip CPH. In addition, the transistor formation region RG2 corresponds to a region (planar region) where a plurality of unit transistor cells (here, trench gate MISFETs) for the power MOSFET 2 are formed in the semiconductor chip CPL.

When comparing the case of FIG. 29 and the case of FIG. 30, the dimension of the transistor formation region RG1 in the Y direction can be made larger in the semiconductor chip CPH in the case of FIG. 30 in which the diode DA1 is disposed along the side H1 than in the case of FIG. 29 in which the diode DA1 is disposed along the side H2. This is because the transistor element (trench gate MISFET) for the power MOSFET 1 cannot be formed in the region where the diode DA1 is formed in the semiconductor chip CPH. Thus, if the diode DA1 is disposed along the side H2 in the semiconductor chip CPH, the dimension of the transistor formation region RG1 in the Y direction is reduced. The same is true for the semiconductor chip CPL, and the dimension of the transistor formation region RG2 in the Y direction can be made larger in the semiconductor chip CPL in the case of FIG. 30 in which the diode DA2 is disposed along the side L1 than in the case of FIG. 29 in which the diode DA2 is disposed along the side L2 when comparing the case of FIG. 29 and the case of FIG. 30.

In addition, when comparing the case of FIG. 29 and the case of FIG. 30, the dimension of the transistor formation region RG1 in the semiconductor chip CPH in the X direction is rarely different. This is because the pads for wire bonding (here, the pads PDHG, PDHS2, PDHA, and PDHC) are disposed along the side H1 in the semiconductor chip CPH and the transistor element (trench gate MISFET) for the power MOSFET 1 cannot be formed immediately below these pads (PDHG, PDHS2, PDHA, PDHC). Thus, even if the diode DA1 is disposed on the side H1 on which the pads for wire bonding (PDHG, PDHS2, PDHA, PDHC) are disposed in the semiconductor chip CPH, the dimension of the transistor formation region RG1 in the X direction is not so much reduced. The same is true for the semiconductor chip CPL, and the dimension of the transistor formation region RG2 in the semiconductor chip CPL in the X direction is rarely different when comparing the case of FIG. 29 and the case of FIG. 30.

Therefore, when comparing the case of FIG. 29 and the case of FIG. 30, the area of the transistor formation region RG1 in the semiconductor chip CPH can be increased and the area of the transistor formation region RG2 in the semiconductor chip CPL can be increased in the case of FIG. 30. Thus, the area of the transistor formation regions RG1 and RG2 in the semiconductor chips CPH and CPL can be made larger in the case of FIG. 30 than in the case of FIG. 29, and therefore, it is possible to reduce the ON-resistances of the power MOSFETs 1 and 2 formed in the semiconductor chips CPH and CPL. Accordingly, it is possible to improve the performance of the semiconductor device.

In addition, the semiconductor device PKG of the present embodiment includes the semiconductor chip CPH in which the power MOSFET 1 for a high-side switch is formed and the semiconductor chip CPL in which the power MOSFET 2 for a low-side switch is formed, and it is more preferable that a structure of the semiconductor chip CPH and a structure of the semiconductor chip CPL are identical to each other. Namely, it is more preferable that semiconductor chips of the same type (with same structure) are used for the semiconductor chips CPH and CPL. As a result, it is possible to manufacture the semiconductor chip CPH and the semiconductor chip CPL in the same manufacturing process and to suppress manufacturing cost of the semiconductor device PKG.

When the structure of the semiconductor chip CPH and the structure of the semiconductor chip CPL are identical to each other, an orientation of the semiconductor chip CPL corresponds to an orientation obtained by rotating the semiconductor chip CPH by 180° in a plan view (see FIGS. 29 and 30). As a result, the connection between the pad of the semiconductor chip CPH and the pad PDC of the semiconductor chip CPC by the wire BW is facilitated, and the connection between the pad of the semiconductor chip CPL and the pad PDC of the semiconductor chip CPC by the wire BW is facilitated.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A semiconductor device comprising:
a first semiconductor chip that includes a first field effect transistor for a high-side switch and has a first main surface and a first back surface opposite to the first main surface,
the first semiconductor chip further including a first protective film having the first main surface, a first source electrode exposed from the first protective film and electrically connected to a first source of the first field effect transistor, and a first drain electrode formed on the first back surface and electrically connected to a first drain of the first field effect transistor;
a second semiconductor chip that includes a second field effect transistor for a low-side switch and has a second main surface and a second back surface opposite to the second main surface,
the second semiconductor chip further including a second protective film having the second main surface, a second source electrode exposed from the second protective film and electrically connected to a second source of the second field effect transistor, and a second drain electrode formed on the second back surface and electrically connected to a second drain of the second field effect transistor;
a third semiconductor chip that includes a circuit which controls each of the first semiconductor chip and the second semiconductor chip and has a third main surface and a third back surface opposite to the third main surface;
a first chip mounting portion that has a fourth main surface on which the first semiconductor chip is mounted and which faces the first back surface of the first semiconductor chip and a fourth back surface opposite to the fourth main surface;
a second chip mounting portion that has a fifth main surface on which the second semiconductor chip is mounted and which faces the second back surface of the second semiconductor chip and a fifth back surface opposite to the fifth main surface;
a third chip mounting portion that has a sixth main surface on which the third semiconductor chip is mounted and which faces the third back surface of the third semiconductor chip and a sixth back surface opposite to the sixth main surface;
at least one first lead electrically connected to the first drain electrode of the first semiconductor chip;
at least one second lead electrically connected to the first source electrode of the first semiconductor chip via a first conductive connection member;
at least one third lead electrically connected to the second drain electrode of the second semiconductor chip;
at least one fourth lead electrically connected to the second source electrode of the second semiconductor chip via a second conductive connection member; and
a sealing body that seals the first semiconductor chip, the second semiconductor chip, the third semiconductor chip, the first conductive connection member, the second conductive connection member, at least a part of the first chip mounting portion, at least a part of the second chip mounting portion, at least a part of the third chip mounting portion, a part of the first lead, a part of the second lead, a part of the third lead, and a part of the fourth lead,
wherein the sealing body has a first side extending along a first direction and a second side extending along the first direction and positioned to be opposite to the first side in a plan view,
the first lead and the fourth lead intersect with the first side of the sealing body,
the second lead and the third lead intersect with the second side of the sealing body,
a current flows from the first lead to the second lead via the first field effect transistor of the first semiconductor chip,
a current flows from the third lead to the fourth lead via the second field effect transistor of the second semiconductor chip, and
the third semiconductor chip is disposed between the first side and the second side and between the first semiconductor chip and the second semiconductor chip in a plan view.

2. The semiconductor device according to claim 1, wherein the first semiconductor chip, the third semiconductor chip, and the second semiconductor chip are arranged along the first direction in a plan view.

3. The semiconductor device according to claim 2, wherein the first lead and the second lead are positioned to be opposite to each other with the first semiconductor chip interposed therebetween in a plan view, and
the third lead and the fourth lead are positioned to be opposite to each other with the second semiconductor chip interposed therebetween in a plan view.

4. The semiconductor device according to claim 1, wherein the first lead is integrally connected to the first chip mounting portion, and
the third lead is integrally connected to the second chip mounting portion.

5. The semiconductor device according to claim 4, further comprising:
a fifth lead that is integrally connected to the first chip mounting portion and intersects with the second side of the sealing body; and
a sixth lead that is integrally connected to the second chip mounting portion and intersects with the first side of the sealing body.

6. The semiconductor device according to claim 1, wherein the sealing body has a seventh main surface and a seventh back surface opposite to the seventh main surface, and
the first back surface of the first chip mounting portion, the second back surface of the second chip mounting portion, and the third back surface of the third chip mounting portion are exposed from the seventh main surface.

7. The semiconductor device according to claim 1, wherein each of the first conductive connection member and the second conductive connection member is made of a metal plate.

8. The semiconductor device according to claim 7, wherein the first drain electrode of the first semiconductor chip is electrically connected to the first chip mounting portion via a first conductive adhesive layer, and
the second drain electrode of the second semiconductor chip is electrically connected to the second chip mounting portion via a second conductive adhesive layer.

9. The semiconductor device according to claim 1, further comprising:

a plurality of seventh leads electrically connected to a plurality of first pad electrodes of the third semiconductor chip via a plurality of first wires, respectively; and
a plurality of eighth leads electrically connected to a plurality of second pad electrodes of the third semiconductor chip via a plurality of second wires, respectively,
wherein the third semiconductor chip includes a third protective film having the third main surface and the plurality of first pad electrodes and the plurality of second pad electrodes exposed from the third protective film,
each of the plurality of seventh leads intersects with the first side of the sealing body and each of the plurality of eighth leads intersects with the second side of the sealing body in a plan view,
the plurality of seventh leads are disposed between the first lead and the fourth lead on the first side, and
the plurality of eighth leads are disposed between the second lead and the third lead on the second side.

10. The semiconductor device according to claim 9,
wherein the first semiconductor chip further includes a plurality of third pad electrodes exposed from the first protective film,
the second semiconductor chip further includes a plurality of fourth pad electrodes exposed from the second protective film,
the third semiconductor chip further includes a plurality of fifth pad electrodes and a plurality of sixth pad electrodes exposed from the third protective film,
the plurality of third pad electrodes of the first semiconductor chip and the plurality of fifth pad electrodes of the third semiconductor chip are electrically connected via a plurality of third wires, and
the plurality of fourth pad electrodes of the second semiconductor chip and the plurality of sixth pad electrodes of the third semiconductor chip are electrically connected via a plurality of fourth wires.

11. The semiconductor device according to claim 10,
wherein the first semiconductor chip has a third side facing the third semiconductor chip in a plan view,
the second semiconductor chip has a fourth side facing the third semiconductor chip in a plan view,
the third semiconductor chip has a fifth side facing the first semiconductor chip and a sixth side facing the second semiconductor chip in a plan view,
the plurality of third pad electrodes are disposed along the third side on the first main surface of the first semiconductor chip,
the plurality of fourth pad electrodes are disposed along the fourth side on the second main surface of the second semiconductor chip, and
the plurality of fifth pad electrodes are disposed along the fifth side and the plurality of sixth pad electrodes are disposed along the sixth side on the third main surface of the third semiconductor chip.

12. The semiconductor device according to claim 11,
wherein the first semiconductor chip further includes a first diode for temperature sensing,
the second semiconductor chip further includes a second diode for temperature sensing,
the first diode is disposed along the third side in the first semiconductor chip, and
the second diode is disposed along the fourth side in the second semiconductor chip.

13. The semiconductor device according to claim 12,
wherein a structure of the first semiconductor chip and a structure of the second semiconductor chip are identical to each other.

14. The semiconductor device according to claim 11,
wherein the first semiconductor chip further includes a first diode for temperature sensing,
the second semiconductor chip further includes a second diode for temperature sensing,
the first diode is disposed along a seventh side intersecting with the third side in the first semiconductor chip, and
the second diode is disposed along an eighth side intersecting with the fourth side in the second semiconductor chip.

15. The semiconductor device according to claim 14,
wherein a structure of the first semiconductor chip and a structure of the second semiconductor chip are identical to each other.

16. The semiconductor device according to claim 1,
wherein the at least one first lead comprises a plurality of first leads, the at least one second lead comprises a plurality of second leads, the at least one third lead comprises a plurality of third leads, and the at least one fourth lead comprises a plurality of fourth leads,
the plurality of first leads are connected to each other and intersect with the first side of the sealing body in a plan view,
the plurality of second leads are connected to each other and intersect with the second side of the sealing body in a plan view,
the plurality of third leads are connected to each other and intersect with the second side of the sealing body in a plan view, and
the plurality of fourth leads are connected to each other and intersect with the first side of the sealing body in a plan view.

17. The semiconductor device according to claim 1,
wherein the first lead is a lead to which a power supply potential is supplied, and
the fourth lead is a lead to which a reference potential lower than the power supply potential is supplied.

18. The semiconductor device according to claim 17,
wherein the second lead and the third lead are not connected through a conductor inside the semiconductor device, and
the second lead and the third lead are electrically connected outside the semiconductor device.

19. The semiconductor device according to claim 1,
wherein the first semiconductor chip, the second semiconductor chip, and the third semiconductor chip are used to form an inverter circuit.

\* \* \* \* \*